US012713829B2

(12) United States Patent
Shin et al.

(10) Patent No.: US 12,713,829 B2
(45) Date of Patent: Aug. 18, 2026

(54) ORGANIC LIGHT EMITTING ELEMENT AND DISPLAY DEVICE

(71) Applicant: LG Display Co., Ltd., Seoul (KR)

(72) Inventors: Ji Cheol Shin, Gyeongsangnam-do (KR); Su Bin Ahn, Gyeonggi-do (KR); KyungHoon Lee, Gyeonggi-do (KR); Youngjun Yu, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 345 days.

(21) Appl. No.: 18/529,754

(22) Filed: Dec. 5, 2023

(65) Prior Publication Data

US 2024/0260456 A1 Aug. 1, 2024

(30) Foreign Application Priority Data

Dec. 31, 2022 (KR) ........................ 10-2022-0191392

(51) Int. Cl.
*H10K 85/60* (2023.01)
*H10K 50/15* (2023.01)

(52) U.S. Cl.
CPC ........... *H10K 85/654* (2023.02); *H10K 50/15* (2023.02); *H10K 85/615* (2023.02); *H10K 85/633* (2023.02)

(58) Field of Classification Search
CPC .... H10K 85/654; H10K 50/15; H10K 85/615; H10K 85/633; H10K 50/155; H10K 85/652; H10K 50/19; H10K 50/17; H10K 50/10; H10K 50/11; H10K 50/16; H10K 50/171; H10K 85/624; H10K 85/626; H10K 85/636; H10K 85/6572
See application file for complete search history.

(56) References Cited

U.S. PATENT DOCUMENTS

| | | | | |
|---|---|---|---|---|
| 2015/0214492 A1* | 7/2015 | Yen | ...................... | H10K 85/654 548/440 |
| 2021/0144522 A1 | 5/2021 | Lee et al. | | |
| 2021/0202846 A1* | 7/2021 | Yoo | ...................... | H10K 85/633 |
| 2022/0173328 A1 | 6/2022 | Yoo et al. | | |
| 2022/0199909 A1 | 6/2022 | Shin et al. | | |
| 2023/0142329 A1* | 5/2023 | Yoo | ...................... | C07D 413/12 257/40 |

* cited by examiner

*Primary Examiner* — Douglas W Owens
(74) *Attorney, Agent, or Firm* — Morgan, Lewis & Bockius LLP

(57) ABSTRACT

An organic light emitting element and a display device include a first compound represented by chemical formula 1 and a second compound represented by chemical formula 2.

[Chemical formula 1]

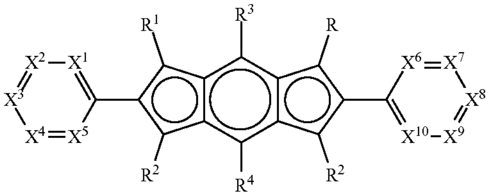

[Chemical formula 2]

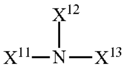

23 Claims, 9 Drawing Sheets

800

200

ORGANIC LIGHT EMITTING ELEMENT AND DISPLAY DEVICE

CROSS-REFERENCE TO RELATED APPLICATION

This application claims priority to and the benefit of Republic of Korean Patent Application No. 10-2022-0191392, filed on Dec. 31, 2022, the entire contents of which are hereby expressly incorporated by reference in its entirety.

BACKGROUND

Technical Field

The present disclosure relates to an organic light emitting element and a display device.

Description of the Related Art

In general, organic light emission refers to a phenomenon in which electric energy is converted into light energy by an organic material. The organic light emitting element refers to a light emitting element using the organic light emission phenomenon. The organic light emitting element has a structure including an anode, a cathode, and an organic material layer disposed therebetween.

The organic material layer may have a multilayer structure composed of different materials to increase the efficiency and stability of the organic light emitting element and may include a light emitting layer (also referred to as an emission material layer (EML)).

The lifespan and efficiency are the most important issues with organic light emitting elements. The efficiency, lifespan, and driving voltage are related to each other. If the efficiency is increased, the driving voltage is relatively decreased, so that the crystallization of the organic material by the Joule heating during driving is reduced, leading to an increase in lifespan.

The organic light emitting element using the organic light emitting phenomenon may be applied to a display device. Since the portable display device is driven by a battery, which is a limited power source, the organic light emitting element used in the portable display device desirably has excellent light emission efficiency.

In addition, since the image should be displayed normally during use of the electronic device, a long life of the organic light emitting element is also desired. In order to improve efficiency, lifespan and driving voltage in the organic light emitting element, research has been conducted on the organic material included in the organic light emitting element.

SUMMARY

An organic light emitting element may include an organic material layer including a hole injection layer and a charge generation layer between an anode and a cathode. The hole injection layer and the charge generation layer are layers closely related to hole injection and movement characteristics that determine the characteristics of the device, and organic electron acceptor compounds may be used for efficient hole generation, injection and movement. Since the organic electron acceptor compound includes a strong electron withdrawing group (EWG), when the hole injection layer is doped with the organic electron acceptor compound, it may withdraw electrons from a high occupied molecular orbital (HOMO) energy level of the adjacent hole transport layer to a low occupied molecular orbital (LUMO) energy level of the organic electron acceptor compound to generate holes and inject the holes into the hole transport layer. Therefore, organic electron acceptor compounds may be designed to include a number of strong electron withdrawing groups for efficient hole generation, injection and transfer.

Most organic electron acceptor compounds may contain many strong electron withdrawing groups to have low LUMO energy levels. However, since the organic electron acceptor compound has low miscibility with the hole transporting compound, a high driving voltage and low luminous efficiency may occur due to inefficient charge injection and transfer characteristics. Accordingly, an organic light emitting element and a display device are disclosed that may have high efficiency, long lifespan or low driving voltage.

Embodiments of the present disclosure may provide an organic light emitting element and a display device that may have high efficiency, long lifespan, or low driving voltage.

The present disclosure may provide an organic light emitting element including a first electrode, a second electrode, and an organic material layer positioned between the first electrode and the second electrode.

The organic material layer may include a first compound represented by chemical formula 1 described below.

[Chemical formula 1]

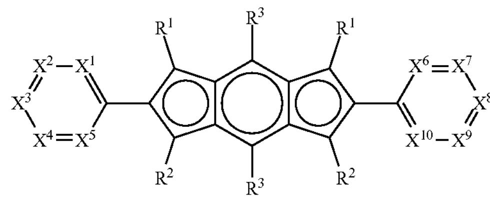

The organic material layer may include a second compound represented by chemical formula 2 described below.

[Chemical formula 2]

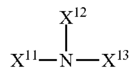

The present disclosure may provide a display device including the organic light emitting element described above.

According to embodiments of the present disclosure, there may be provided an organic light emitting element having high emission efficiency, long lifespan, or low driving voltage.

According to embodiments of the present disclosure, there may be provided an organic light emitting element having high emission efficiency, long lifespan or low driving voltage by including a layer having excellent hole injection characteristics or electron injection characteristics.

DESCRIPTION OF DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
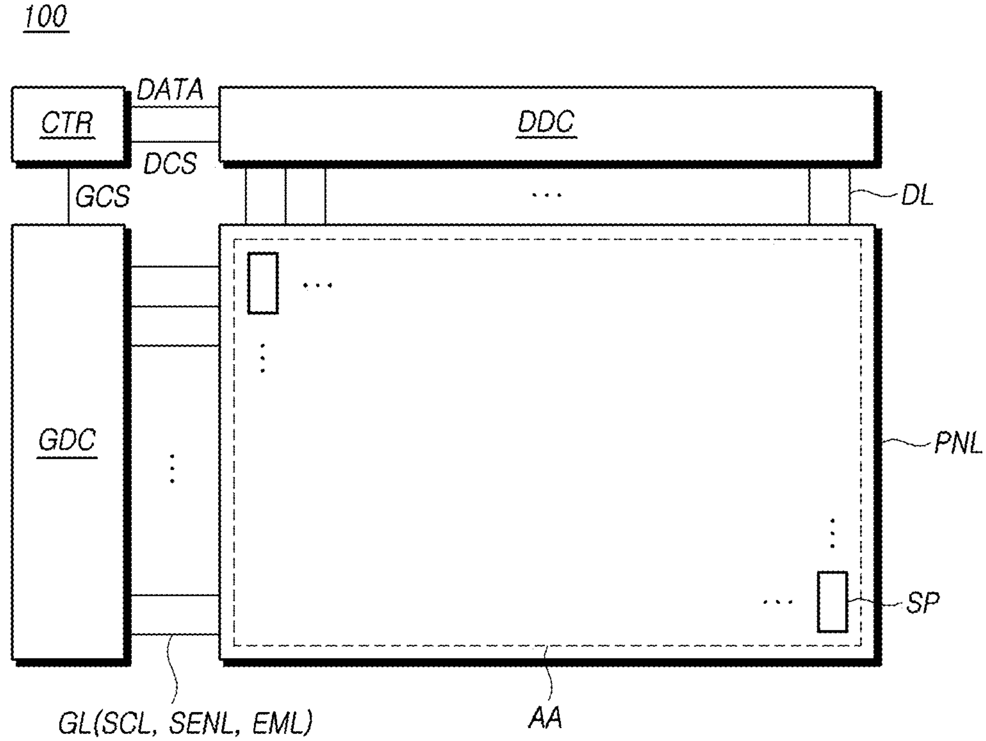
FIG. 1 is a view illustrating a system configuration of a display device according to example embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only". As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to," "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap", etc. each other via a fourth element. Here, the second element may be included in at least one of two or more elements that "are connected or coupled to," "contact or overlap," etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors e.g., process factors, internal or external impact, noise, etc.) even when a relevant description is not specified. Further, the term "may" fully encompasses all the meanings of the term "can."

Hereinafter, example embodiments of the present disclosure are described in detail with reference to the accompanying drawings.

As used herein, the term "halo" or "halogen" includes fluorine (F), chlorine (Cl), bromine (Br), and iodine (I), and the like, unless otherwise specified.

As used herein, the term "alkyl" or "alkyl group" may mean a radical of a saturated aliphatic functional group having 1 to 60 carbon atoms linked by a single bond and including a straight chain alkyl group, branched chain alkyl group, cycloalkyl (alicyclic) group, alkyl-substituted cycloalkyl group, or cycloalkyl-substituted alkyl group, unless otherwise specified.

As used herein, the term "haloalkyl group" or "halogenalkyl group" may mean a halogen-substituted alkyl group unless otherwise specified.

As used herein, the term "alkenyl" or "alkynyl" may have a double bond or a triple bond, respectively, and may include a straight or branched chain group and may have 2 to 60 carbon atoms unless otherwise specified.

As used herein, the term "cycloalkyl" may refer to an alkyl forming a ring having 3 to 60 carbon atoms, unless otherwise specified.

As used herein, the term "alkoxy group" or "alkyloxy group" refers to an alkyl group to which an oxygen radical is bonded, and may have 1 to 60 carbon atoms unless otherwise specified.

As used herein, the term "alkenoxyl group," "alkenoxy group," "alkenyloxyl group," or "alkenyloxy group" refers to an alkenyl group to which an oxygen radical is attached, and may have 2 to 60 carbon atoms unless otherwise specified.

As used herein, the terms "aryl group" and "arylene group" each may have 6 to 60 carbon atoms unless otherwise specified, but are not limited thereto. In the present disclosure, the aryl group or the arylene group may include a monocyclic type, a ring assembly, a fused polycyclic system, a spiro compound, and the like. For example, the aryl group includes, but is not limited to, phenyl, biphenyl, naphthyl, anthryl, indenyl, phenanthryl, triphenylenyl, pyrenyl, peryleneyl, chrysenyl, naphthacenyl, or fluoranthenyl. The naphthyl may include 1-naphthyl and 2-naphthyl, and the anthryl may include 1-anthryl, 2-anthryl and 9-anthryl.

In the present disclosure, the term "fluorenyl group" or "fluorenylene group" may refer to a monovalent or divalent functional group, respectively, of fluorene, unless otherwise specified. The "fluorenyl group" or "fluorenylene group" may mean a substituted fluorenyl group or a substituted fluorenylene group. "Substituted fluorenyl group" or "substituted fluorenylene group" may refer to a monovalent or divalent functional group of substituted fluorene. "Substituted fluorene" may mean that at least one of the following substituents R, R', R" and R'" is a functional group other than hydrogen. It may include a case where R and R' are bonded to each other to form a spiro compound together with the carbon to which they are bonded.

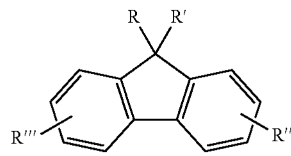

As used herein, the term "spiro compound" has a "spiro union," and the spiro union means a linkage in which two rings share only one atom. In this case, the atom shared by the two rings may be referred to as a "spiro atom," and they are each called "monospiro-," "dispiro-," and "trispiro-" compounds depending on the number of spiro atoms included in a compound.

As used herein, the term "heterocyclic group" may include not only an aromatic ring, such as a "heteroaryl group" or "heteroarylene group" but also a non-aromatic ring and, unless otherwise specified, means a ring with 2 to 60 carbon atoms and one or more heteroatoms, but is not limited thereto. As used herein, the term "heteroatom" refers to N, O, S, P or Si unless otherwise specified, and the heterocyclic group may mean a monocyclic group containing a heteroatom, a ring assembly, a fused polycyclic system, or a spiro compound.

The "heterocyclic group" may include a ring containing $SO_2$ instead of carbon forming the ring. For example, the "heterocyclic group" may include the following compounds.

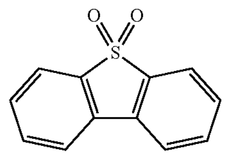 [SMILES: O=S1(=O)c2ccccc2-c2ccccc21]

As used herein, the term "ring" may include monocycles and polycycles, may include hydrocarbon rings as well as heterocycles containing at least one heteroatom, or may include aromatic and non-aromatic rings.

As used herein, the term "polycycle" may include ring assemblies, fused polycyclic systems, and spiro compounds, may include aromatic as well as non-aromatic compounds, or may include heterocycles containing at least one heteroatom as well as hydrocarbon rings.

As used herein, the term "aliphatic ring group" refers to a cyclic hydrocarbon other than the aromatic hydrocarbon, may include a monocyclic type, a ring assembly, a fused polycyclic system, and a spiro compound and, unless otherwise specified, may mean a ring having 3 to 60 carbon atoms. For example, a fusion of benzene, which is an aromatic ring, and cyclohexane, which is a non-aromatic ring, also corresponds to an aliphatic ring.

As used herein, the term "ring assembly" means that two or more ring systems (single or fused ring systems) are directly connected to each other through single or double bonds. For example, in the case of an aryl group, a biphenyl group or a terphenyl group may be a ring assembly but is not limited thereto.

As used herein, the term "fused polycyclic system" refers to a type of fused rings sharing at least two atoms. For example, in the case of an aryl group, a naphthalenyl group, a phenanthrenyl group, or a fluorenyl group may be a fused polycyclic system, but is not limited thereto.

As used herein, the term "alkylsilyl group" may refer to a monovalent substituent in which three alkyl groups are bonded to a Si atom.

As used herein, the term "arylsilyl group" may refer to a monovalent substituent in which three aryl groups are bonded to a Si atom.

As used herein, the term "alkylarylsilyl group" may refer to a monovalent substituent in which one alkyl group and two aryl groups are bonded to a Si atom or two alkyl groups and one aryl group are bonded to the Si atom.

When prefixes are named successively, it may mean that the substituents are listed in the order specified first. For example, an arylalkoxy group may mean an alkoxy group substituted with an aryl group, an alkoxycarbonyl group may mean a carbonyl group substituted with an alkoxy group, and an arylcarbonylalkenyl group may mean an alkenyl group substituted with an arylcarbonyl group. The arylcarbonyl group may be a carbonyl group substituted with an aryl group.

Unless otherwise explicitly stated, in the term "substituted" or "unsubstituted" as used herein, "substituted" may mean being substituted with one or more substituents selected from the group consisting of a deuterium, a halogen, an amino group, a nitrile group, a nitro group, a $C_1$-$C_{20}$ alkyl group, a $C_1$-$C_{20}$ alkoxy group, a $C_1$-$C_{20}$ alkylamine group, a $C_1$-$C_{20}$ alkylthiophene group, a $C_6$-$C_{20}$ arylthiophene group, a $C_2$-$C_{20}$ alkenyl group, a $C_2$-$C_{20}$ alkynyl group, a $C_3$-$C_{20}$ cycloalkyl group, a $C_6$-$C_{20}$ aryl group, a $C_6$-$C_{20}$ aryl group substituted with deuterium, a $C_8$-$C_{20}$ arylalkenyl group, a silane group, a boron group, a germanium group, and a $C_2$-$C_{20}$ heterocyclic group including at least one heteroatom selected from the group consisting of O, N, S, Si and P, but is not limited to the substituents.

In the present disclosure, the "functional group names" corresponding to the aryl group, arylene group, and heterocyclic group provided as examples of the symbols and their substituents may be described with the names of the functional groups reflecting the valence, but may also be described with the names of the parent compounds. For example, in the case of "phenanthrene," which is a type of aryl group, its name may be specified with its group identified, such as "phenanthryl (group)" for the monovalent group, and "phenanthrylene (group)" as the divalent group, but may also be specified as "phenanthrene," which is the name of the parent compound, regardless of the valence. Similarly, pyrimidine may be specified as 'pyrimidine' regardless of the valence or may also be specified as pyrimidinyl (group) for the monovalence and as pyrimidylene (group) for the divalence. Therefore, in the present disclosure, when the type of the substituent is specified with the name of the parent compound, it may mean an n-valent "group" formed by detachment of the hydrogen atom bonded to a carbon atom and/or a heteroatom of the parent compound.

Further, unless explicitly stated, the formulas used in the present disclosure may be applied in the same manner as the definition of the substituent by the exponent definition of the following formulas.

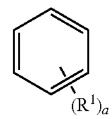

When 'a' is 0, it means that the substituent $R^1$ does not exist, meaning that hydrogen is bonded to each of the carbon atoms forming the benzene ring. In this case, the chemical formula or chemical compound may be specified without expressing the hydrogen bonded to the carbon. Further, when 'a' is 1, one substituent $R^1$ is bonded to any one of the carbon atoms forming the benzene ring, and when 'a' is 2 or 3, it may be bonded as follows. When 'a' is an integer of 4 to 6, it is bonded to the carbon of the benzene ring in a similar manner, and when 'a' is an integer of 2 or more, $R^1$ may be identical or different.

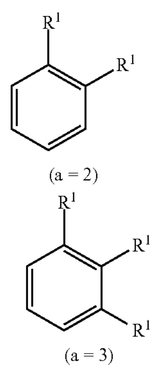

(a = 2)

(a = 3)

In the present disclosure, when substituents are bonded to each other to form a ring, it may mean that adjacent groups are bonded to each other to form a monocycle or fused polycycle, and the monocycle or fused polycycle may include heterocycles containing at least one heteroatom as well as hydrocarbon rings and may include aromatic and non-aromatic rings.

In the present disclosure, an organic light emitting element may mean a component(s) between the anode and the cathode or an organic light emitting diode including an anode, a cathode, and component(s) positioned therebetween.

In some cases, in the present disclosure, organic light emitting element may mean an organic light emitting diode and a panel including the same, or an electronic device including the panel and circuitry. The electronic device may include, e.g., a display device, a lighting device, a solar cell, a portable or mobile terminal (e.g., a smart phone, a tablet, a PDA, an electronic dictionary, or PMP), a navigation terminal, a game device, various TVs, and various computer monitors but, without limited thereto, may include any type of device including the component(s).

FIG. 1 is a view illustrating a system configuration of a display device 100 according to example embodiments of the present disclosure.

As shown in FIG. 1, a display device 100 according to embodiments of the present disclosure includes a display panel PNL in which a plurality of data lines DL and a plurality of gate lines GL are disposed, and a plurality of subpixels SP defined by the plurality of data lines DL and the plurality of gate lines GL are arranged, a data driving circuit DDC for driving the plurality of data lines DL, a gate driving circuit GDC for driving the plurality of gate lines GL, and a controller CTR for controlling the data driving circuit DDC and the gate driving circuit GDC.

The controller CTR supplies various control signals DCS and GCS to the data driving circuit DDC and the gate driving circuit GDC to control the data driving circuit DDC and the gate driving circuit GDC.

The data driving circuit DDC receives the image data from the controller CTR and supply data voltage to the plurality of data lines DL, thereby driving the plurality of data lines DL. Here, data driving circuit DDC is also referred to as a 'source driving circuit.'

The gate driving circuit GDC sequentially drives the plurality of gate lines GL by sequentially supplying scan signals to the plurality of gate lines GL. Here, gate driving circuit GDC is also referred to as a 'scan driving circuit.'

The gate driving circuit GDC sequentially supplies scan signals of On voltage or Off voltage to the plurality of gate lines GL under the control of the controller CTR.

When a specific gate line is opened by the gate driving circuit GDC, the data driving circuit DDC converts the image data received from the controller CTR into an analog data voltage and supplies the analog data voltage to the plurality of data lines DL.

The data driving circuit DDC may be positioned on only one side (e.g., the top or bottom side) of the display panel PNL and, in some cases, the driving circuit may be positioned on each of two opposite sides (e.g., both the top and bottom sides) of the display panel PNL depending on, e.g., driving schemes or panel designs.

The gate driving circuit GDC may be positioned on only one side (e.g., the left or right side) of the display panel PNL and, in some cases, the gate driving circuit GDR may be positioned on each of two opposite sides (e.g., both the left and right sides) of the display panel PNL depending on, e.g., driving schemes or panel designs.

The display device 100 according to embodiments of the present disclosure may be an organic light emitting display device, a liquid crystal display device, a plasma display device, and the like.

When the display device 100 according to embodiments of the present disclosure is an organic light emitting display device, each subpixel SP arranged on the display panel PNL may be composed of a circuit element such as an organic light emitting diode (OLED) that is a self-luminous element, and a driving transistor for driving the OLED.

The type and number of circuit elements constituting each subpixel SP may be varied depending on functions to be provided and design schemes.

Figure 2:
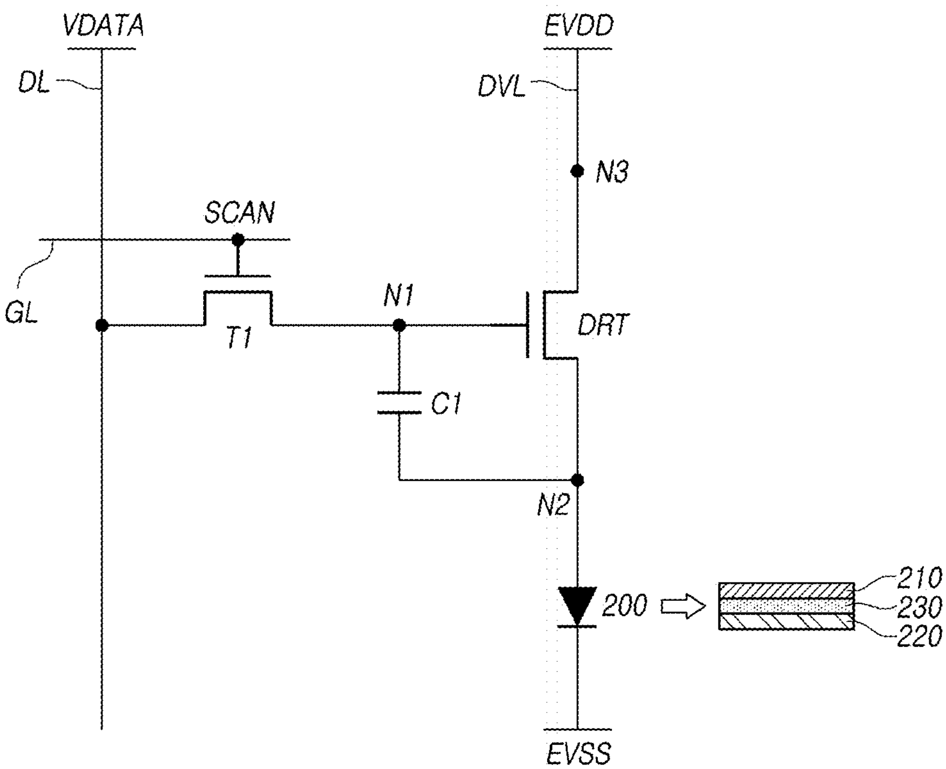
FIG. 2 is a view illustrating a subpixel circuit of a display device according to example embodiments of the present disclosure.

FIG. 2 is a view illustrating a subpixel circuit of a display device according to example embodiments of the present disclosure.

As shown in FIG. 2, each subpixel SP may basically include an organic light emitting element 200 and a driving transistor DRT for driving the organic light emitting element 200.

Each subpixel SP may further include a first transistor T1 to transfer data voltage VDATA to a first node N1, which corresponds to a gate node of the driving transistor DRT, and a storage capacitor C1 to maintain the data voltage VDATA corresponding to an image signal voltage or a voltage corresponding to the data voltage VDATA for the time of one frame.

The organic light emitting element 200 may include a first electrode 210 (anode electrode or cathode electrode), an organic material layer 230, and a second electrode 220 (cathode electrode or anode electrode).

As an example, a base voltage EVSS may be applied to the second electrode 220 of the organic light emitting element 200.

The driving transistor DRT supplies a driving current to the organic light emitting element 200, thereby driving the organic light emitting element 200.

The driving transistor DRT includes the first node N1, second node N2, and third node N3.

The first node N1 of the driving transistor DRT is a node corresponding to the gate node and may be electrically connected with the source node or drain node of the first transistor T1.

The second node N2 of the driving transistor DRT may be electrically connected with the first electrode 210 of the organic light emitting element 200, and may be a source node or a drain node.

The third node N3 of the driving transistor DRT may be a node to which driving voltage EVDD is applied, be electrically connected with a driving voltage line DVL for supplying the driving voltage EVDD, and be the drain node or source node.

The first transistor T1 may be electrically connected between the data line DL and the first node N1 of the driving transistor DRT, and may be controlled by receiving the scan signal SCAN through the gate line and the gate node.

The storage capacitor C1 may be electrically connected between the first node N1 and second node N2 of the driving transistor DRT.

The storage capacitor C1 is an external capacitor intentionally designed to be outside the driving transistor DRT, but not a parasite capacitor (e.g., Cgs or Cgd) which is an internal capacitor present between the first node N1 and the second node N2 of the driving transistor DRT.

Figure 3:
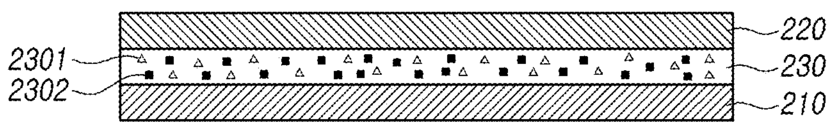
FIGS. 3, 4, 5, 6, 7, 8, and 9 are cross-sectional views schematically illustrating an organic light emitting element according to example embodiments of the present disclosure.

FIG. 3 is a cross-sectional view schematically illustrating an organic light emitting element 200 according to example embodiments of the present disclosure.

As shown in FIG. 3, the organic light emitting element 200 according to embodiments of the present disclosure includes a first electrode 210, a second electrode 220, and an organic material layer 230 positioned between the first electrode 210 and the second electrode 220.

For example, the first electrode 210 may be an anode electrode, and the second electrode 220 may be a cathode electrode.

For example, the first electrode 210 may be a transparent electrode, and the second electrode 220 may be a reflective electrode. In another example, the first electrode 210 may be a reflective electrode, and the second electrode 220 may be a transparent electrode.

The organic material layer 230 is a layer positioned between the first electrode 210 and the second electrode 220 and including an organic material and may be composed of a plurality of layers.

The organic material layer 230 includes a first compound 2301 represented by chemical formula 1 and a second compound 2302 represented by chemical formula 2. The first compound 2301 and the second compound 2302 are described below in detail. As the organic material layer 230 includes the first compound 2301 represented by chemical formula 1 and the second compound 2302 represented by chemical formula 2, the organic light emitting element may have high efficiency, long lifespan, or low driving voltage.

The organic material layer 230 may include a light emitting layer. The organic layer 230 may further include at least one of a hole injection layer, a hole transport layer, an electron transport layer, and an electron injection layer.

For example, the organic material layer 230 may include a hole injection layer positioned on the first electrode 210, a hole transport layer positioned on the hole injection layer, a light emitting layer positioned on the hole transport layer, an electron transport layer positioned on the light emitting layer, and an electron injection layer positioned on the electron transport layer. In such an example, the first electrode 210 may be the anode electrode, and the second electrode 220 may be the cathode electrode.

The light emitting layer is a layer in which as holes and electrons transferred from the first electrode 210 and the second electrode 220 meet to emit light and may include, e.g., a host material and a dopant.

The organic material layer 230 may include, e.g., a hole injection layer, a hole transport layer, a light emitting layer, an electron transport layer, and an electron injection layer. The hole injection layer may be positioned on the first electrode 210 as the anode electrode. The hole transport layer may be positioned on the hole injection layer. The light emitting layer may be positioned on the hole transport layer. The electron transport layer may be positioned on the light emitting layer. The electron injection layer may be positioned on the electron transport layer.

Figure 4:
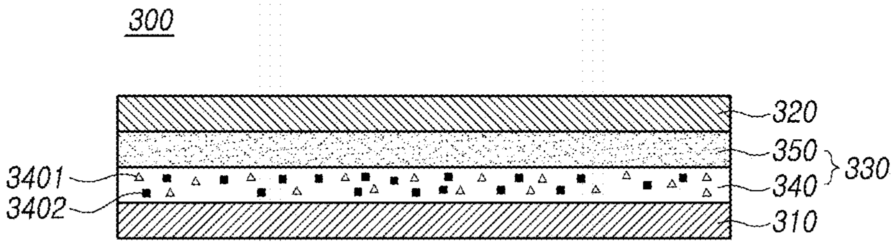

FIG. 4 is a cross-sectional view schematically illustrating an organic light emitting element 300 according to example embodiments of the present disclosure.

As shown in FIG. 4, the organic light emitting element 300 according to embodiments of the present disclosure includes a first electrode 310, a second electrode 320, and an organic material layer 330 positioned between the first electrode 310 and the second electrode 320.

The organic material layer 330 may include a light emitting layer 350 and a first layer 340. For example, the first electrode 310 may be an anode electrode, and the first layer 340 may be positioned between the first electrode 310 and the light emitting layer 350.

The first layer 340 includes a first compound 3401 represented by chemical formula 1 and a second compound 3402 represented by chemical formula 2. The first compound 3401 and the second compound 3402 are described below in detail. As the first layer 340 includes the first compound 3401 represented by chemical formula 1 and the second compound 3402 represented by chemical formula 2, the organic light emitting element may have high efficiency, long lifespan, or low driving voltage.

The first layer 340 may be, e.g., a hole layer. For example, the organic light emitting element 300 may include a hole layer positioned between the first electrode 310 and the light emitting layer 350. The hole layer may be a hole injection layer and/or a hole transport layer. As the hole layer includes the first compound 3401 represented by chemical formula 1 and the second compound 3402 represented by chemical formula 2, the organic light emitting element may have high efficiency, long lifespan, or low driving voltage.

The first layer 340 may include the first compound 3401 represented by chemical formula 1 as a dopant. The first compound 3401 may be included in the first layer 340 as a p-type dopant. For example, the first layer 340 may be formed by doping with 1 wt % to 40 wt % of the first compound 3401 represented by chemical formula 1.

The organic material layer 330 may include, e.g., a first layer 340 that is a hole injection layer and/or a hole transport layer, a light emitting layer 350, an electron transport layer, and an electron injection layer. The hole injection layer may be positioned on the first electrode 310 as the anode electrode. The hole transport layer may be positioned on the hole injection layer. The light emitting layer may be positioned on the hole transport layer. The electron transport layer may be positioned on the light emitting layer. The electron injection layer may be positioned on the electron transport layer.

The hole injection layer may include an amine-based compound. For example, the hole injection layer may include one or more of HATCN (1,4,5,8,9,11-hexaazatriphenylenehexacarbonitile) and NPD (N,N'-Di(1-naphthyl)-N,N'-diphenyl-(1,1'-biphenyl)-4,4'-diamine). However, the material for the hole injection layer is not limited to those described above, and may include other compounds that may be used as hole injection materials in the field of organic light emitting elements.

The hole transport layer may include an amine-based compound. For example, the hole transport layer may include one or more of HATCN (1,4,5,8,9,11-hexaazatriphenylenehexacarbonitile) and NPD (N,N'-Di(1-naphthyl)-N,N'-diphenyl-(1,1'-biphenyl)-4,4'-diamine). However, the material for the hole transport layer is not limited to those described above, and may include other compounds that may be used as hole transport materials in the field of organic light emitting elements.

The light emitting layer 350 may be a fluorescent light emitting layer or a phosphorescent light emitting layer. The fluorescent light emitting layer may include one or more of a boron-based compound, an anthracene-based compound, and a pyrene-based compound. The phosphorescent light emitting layer may include at least one of a carbazole-based compound and an iridium-based compound. The carbazole-based compound may be CBP (4,4'-bis(N-carbazolyl)-1,1'-biphenyl). The iridium-based compound may be $Ir(ppy)_3$ (tris(2-phenylpyridine)Iridium(III)). However, the material for the light emitting layer is not limited to those described above, and may include other compounds that may be used as light emitting layer materials in the field of organic light emitting elements.

The electron transport layer may include at least one of an azine-based compound and an imidazole-based compound. For example, the azine-based compound may be TmPyPB (1,3,5-tri(m-pyridin-3-ylphenyl)benzene). The imidazole-based compound may be TPBi (2,2',2"-(1,3,5-benzinetriyl)-tris(1-phenyl-1-H benzimidazole)). However, the material for the electron transport layer is not limited to those described above, and may include other compounds that may be used as electron transport materials in the field of organic light emitting elements.

The electron injection layer may include at least one of an azine-based compound and an imidazole-based compound. For example, the electron injection layer may include one or more of LiF and LiQ. However, the material for the electron injection layer is not limited to those described above, and may include other compounds that may be used as electron injection materials in the field of organic light emitting elements.

Figure 5:
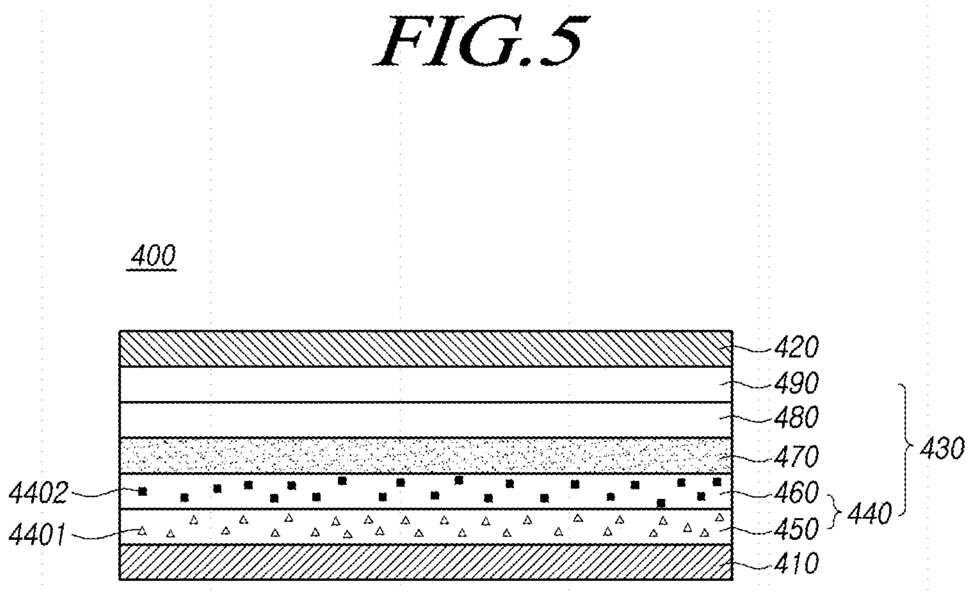

FIG. 5 is a cross-sectional view schematically illustrating an organic light emitting element 400 according to example embodiments of the present disclosure.

As shown in FIG. 5, the organic light emitting element 400 according to embodiments of the present disclosure includes a first electrode 410, a second electrode 420, and an organic material layer 430 positioned between the first electrode 410 and the second electrode 420.

The organic material layer 430 may include a light emitting layer 470 and a first layer 440. For example, the first electrode 410 may be an anode electrode, and the first layer 440 may be positioned between the first electrode 410 and the light emitting layer 470.

The first layer 440 includes a first compound 4401 represented by chemical formula 1 and a second compound 4402 represented by chemical formula 2. The first compound 4401 and the second compound 4402 are described below in detail. As the first layer 440 includes the first compound 4401 represented by chemical formula 1 and the second compound 4402 represented by chemical formula 2, organic light emitting element may have high efficiency, long lifespan, or low driving voltage.

The first layer 440 may include a hole injection layer 450 and a hole transport layer 460.

The hole injection layer 450 may include the first compound 4401 represented by chemical formula 1 as a dopant. The first compound 4401 may be included in the hole injection layer 450 as a p-type dopant. For example, the hole injection layer 450 may be formed by doping with 1 wt % to 40 wt % of the first compound 4401 represented by chemical formula 1. Alternatively, the hole injection layer 450 may include only the first compound 4401 represented by chemical formula 1 but do not include other compounds. As the hole injection layer 450 includes the first compound 4401 represented by chemical formula 1, the organic light emitting element may have high efficiency, long lifespan, or low driving voltage.

The hole transport layer 460 may include the second compound 4402 represented by chemical formula 2. However, the material for the hole transport layer is not limited to those described above, and may include other compounds that may be used as hole transport materials in the field of organic light emitting elements. As the hole transport layer 460 includes the second compound 4402 represented by chemical formula 2, the organic light emitting element may have high efficiency, long lifespan, or low driving voltage.

As the hole injection layer 450 includes the first compound 4401 represented by chemical formula 1 and the hole transport layer 460 includes the second compound 4402 represented by chemical formula 2, the organic light emitting element may have high efficiency, long lifespan, or low driving voltage.

The organic material layer 430 may include, e.g., a first layer 440 that is a hole injection layer 450 and a hole transport layer 460, a light emitting layer 470, an electron transport layer 480, and an electron injection layer 490. The hole injection layer 450 may be positioned on the first electrode 410 as the anode electrode. The hole transport layer 460 may be positioned on the hole injection layer 450. The light emitting layer 470 may be positioned on the hole transport layer 460. The electron transport layer 480 may be positioned on the light emitting layer 470. The electron injection layer 490 may be positioned on the electron transport layer 480.

Matters regarding the light emitting layer 470, the electron transport layer 480, and the electron injection layer 490 may be the same as those regarding the light emitting layer, the electron transport layer, and the electron injection layer described above with reference to FIG. 4, unless otherwise described.

Figure 6:
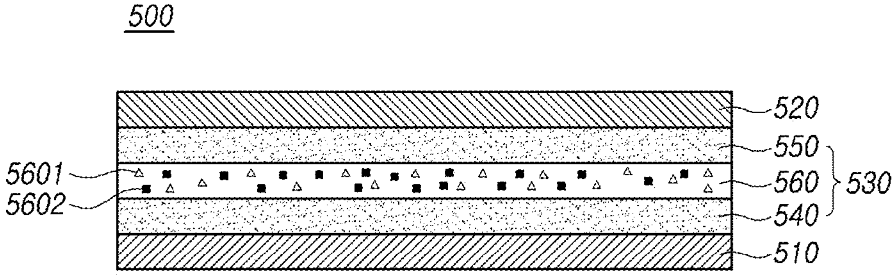

FIG. 6 is a cross-sectional view schematically illustrating an organic light emitting element 500 according to example embodiments of the present disclosure.

As shown in FIG. 6, the organic light emitting element 500 according to embodiments of the present disclosure includes a first electrode 510, a second electrode 520, and an organic material layer 530 positioned between the first electrode 510 and the second electrode 520.

The organic material layer 530 may include a first light emitting layer 540, a second light emitting layer 550, and a first layer 560 positioned between the first light emitting layer 540 and the second light emitting layer 560. In other words, the organic light emitting element 500 may be a tandem type organic light emitting element including two or more light emitting layers. The tandem type organic light emitting element may include a plurality of stacks each including a light emitting layer. For example, the tandem type organic light emitting element may include a first stack including a first light emitting layer 540 and a second stack including a second light emitting layer 550. In this example, the first stack may include additional functional layers in addition to the first light emitting layer 540. Further, the second stack may include additional functional layers in addition to the second light emitting layer 550.

The first light emitting layer 540 and the second light emitting layer 550 may be formed of the same material or different materials. The first light emitting layer 540 may emit light having a first color, and the second light emitting layer 550 may emit light having a second color. The first color and the second color may be the same or different from each other.

The first layer 560 includes a first compound 5601 represented by chemical formula 1 and a second compound 5602 represented by chemical formula 2. The first compound 5601 and the second compound 5602 are described below in detail. As the first layer 560 includes the first compound 5601 represented by chemical formula 1 and the second compound 5602 represented by chemical formula 2, the organic light emitting element may have high efficiency, long lifespan, or low driving voltage.

The first layer 560 may include a charge generation layer and/or a hole transport layer. For example, the organic light emitting element 500 may include a charge generation layer and/or a hole transport layer positioned between the first light emitting layer 540 and the second light emitting layer 550. The charge generation layer may include a p-type charge generation layer and an n-type charge generation layer. The hole transport layer may be a second hole transport layer included in the second stack. In this example, the first layer 560 may be a p-type charge generation layer and/or a second hole transport layer.

The first layer 560 may include the first compound 5601 represented by chemical formula 1 as a dopant. The first compound 5601 may be included in the first layer 560 as a p-type dopant. For example, the first layer 560 may be formed by doping with 1 wt % to 40 wt % of the first compound 5601 represented by chemical formula 1.

The first stack may further include a functional layer in addition to the first light emitting layer 540. For example, the first stack may include a hole injection layer, a first hole transport layer, a first light emitting layer 540 and a first electron transport layer.

The second stack may further include a functional layer in addition to the second light emitting layer 550. For example, the second stack may include a second hole transport layer, a second light emitting layer 550, a second electron transport layer and an electron injection layer.

The hole injection layer may be positioned on the first electrode 510 as the anode electrode. The first hole transport layer may be positioned on the hole injection layer. The first light emitting layer 540 may be positioned on the first hole transport layer. The first electron transport layer may be positioned on the first light emitting layer 540. The n-type charge generation layer may be positioned on the first electron transport layer. The p-type charge generation layer may be positioned on the n-type charge generation layer. The second hole transport layer may be positioned on the p-type charge generation layer. The second light emitting layer 550 may be positioned on the second hole transport layer. The second electron transport layer may be positioned on the second light emitting layer 550. The electron injection layer may be positioned on the second electron transport layer. In this example, the first layer 560 may be a p-type charge generation layer and a second hole transport layer.

The hole injection layer may include an amine-based compound. For example, the hole injection layer may include one or more of HATCN (1,4,5,8,9,11-hexaazatriphenylenehexacarbonitile) and NPD (N,N'-Di(1-naphthyl)-N,N'-diphenyl-(1,1'-biphenyl)-4,4'-diamine). However, the material for the hole injection layer is not limited to those described above, and may include other compounds that may be used as hole injection materials in the field of organic light emitting elements.

The first hole transport layer may include an amine-based compound. For example, the hole transport layer may include one or more of HATCN (1,4,5,8,9,11-hexaazatriphenylenehexacarbonitile) and NPD (N,N'-Di(1-naphthyl)-N,N'-diphenyl-(1,1'-biphenyl)-4,4'-diamine). However, the material for the first hole transport layer is not limited to those described above, and may include other compounds that may be used as hole transport materials in the field of organic light emitting elements.

The first light emitting layer 540 may be a fluorescent light emitting layer or a phosphorescent light emitting layer. The fluorescent light emitting layer may include one or more of a boron-based compound, an anthracene-based compound, and a pyrene-based compound. The phosphorescent light emitting layer may include at least one of a carbazole-based compound and an iridium-based compound.

Matters regarding the first electron transport layer may be the same as those regarding the electron transport layer described above with reference to FIG. 4, unless otherwise described.

The n-type charge generation layer may include a phenanthroline-based compound. The phenanthroline-based compound may be Bphen (bathophenanthroline). However, the material for the n-type charge generation layer is not limited to those described above, and may include other compounds that may be used as n-type charge generation layer materials in the field of organic light emitting elements.

The p-type charge generation layer may include the first compound 5601 represented by chemical formula 1. Further, the p-type charge generation layer may further include an amine-based compound. The amine-based compound may be NPD (N,N'-di(1-naphthyl)-N,N'-diphenyl-(1,1'-biphenyl)-4,4'-diamine). However, the amine-based compound that may be used as a material for the p-type charge generation layer is not limited to those described above. As the p-type charge generation layer includes the first compound 5601 represented by chemical formula 1, the organic light emitting element may have high efficiency, long lifespan, or low driving voltage.

The second hole transport layer may include the second compound 5602 represented by chemical formula 2. Further, the second hole transport layer may further include an amine-based compound. For example, the second hole transport layer may include one or more of HATCN (1,4,5,8,9,11-hexaazatriphenylenehexacarbonitile) and NPD (N,N'-Di(1-naphthyl)-N,N'-diphenyl-(1,1'-biphenyl)-4,4'-diamine). However, the material for the second hole transport layer is not limited to those described above, and may include other compounds that may be used as hole transport materials in the field of organic light emitting elements.

Matters regarding the second light emitting layer 550, the second electron transport layer, and the electron injection layer may be the same as those regarding the light emitting layer, the electron transport layer, and the electron injection layer described above with reference to FIG. 4, unless otherwise described.

Figure 7:
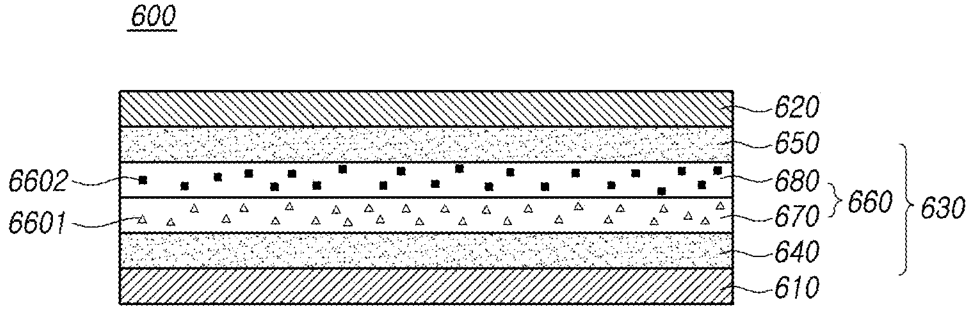

FIG. 7 is a cross-sectional view schematically illustrating an organic light emitting element 600 according to example embodiments of the present disclosure.

As shown in FIG. 7, the organic light emitting element 600 according to embodiments of the present disclosure includes a first electrode 610, a second electrode 620, and an organic material layer 630 positioned between the first electrode 610 and the second electrode 620.

The organic material layer 630 may include a first light emitting layer 640, a second light emitting layer 650, and a first layer 660 positioned between the first light emitting layer 640 and the second light emitting layer 660. In other words, the organic light emitting element 600 may be a tandem type organic light emitting element including two or more light emitting layers. The tandem type organic light emitting element may include a plurality of stacks each including a light emitting layer. For example, the tandem type organic light emitting element may include a first stack including a first light emitting layer 640 and a second stack including a second light emitting layer 650. In this example, the first stack may include additional functional layers in addition to the first light emitting layer 640. Further, the second stack may include additional functional layers in addition to the second light emitting layer 650.

The first light emitting layer 640 and the second light emitting layer 650 may be formed of the same material or different materials. The first light emitting layer 640 may emit light having a first color, and the second light emitting layer 650 may emit light having a second color. The first color and the second color may be the same or different from each other.

The first layer 660 includes a first compound 6601 represented by chemical formula 1 and a second compound 6602 represented by chemical formula 2. The first compound 6601 and the second compound 6602 are described below in detail. As the first layer 660 includes the first compound 6601 represented by chemical formula 1 and the second compound 6602 represented by chemical formula 2, the organic light emitting element may have high efficiency, long lifespan, or low driving voltage.

The first layer 660 may include a charge generation layer and a hole transport layer. For example, the organic light emitting element 600 may include a charge generation layer and a hole transport layer positioned between the first light emitting layer 640 and the second light emitting layer 650. The charge generation layer may include a p-type charge generation layer 670 and an n-type charge generation layer. The hole transport layer may be a second hole transport layer 680 included in the second stack. In this example, the first layer 660 may be a p-type charge generation layer 670 and a second hole transport layer 680.

The p-type charge generation layer 670 may include the first compound 6601 represented by chemical formula 1 as a dopant. The first compound 6601 may be included in the p-type charge generation layer 670 as a p-type dopant. For example, the p-type charge generation layer 670 may be formed by doping with 1 wt % to 40 wt % of the first compound 6601 represented by chemical formula 1. Alternatively, the p-type charge generation layer 670 may include only the first compound 6601 represented by chemical formula 1 but do not include other compounds. As the p-type charge generation layer 670 includes the first compound 6601 represented by chemical formula 1, the organic light emitting element may have high efficiency, long lifespan, or low driving voltage.

The second hole transport layer 680 may include the second compound 6602 represented by chemical formula 2. However, the material for the hole transport layer is not limited to those described above, and may include other compounds that may be used as hole transport materials in the field of organic light emitting elements. As the second hole transport layer 680 includes the second compound 6602 represented by chemical formula 2, the organic light emitting element may have high efficiency, long lifespan, or low driving voltage.

As the p-type charge generation layer 670 includes the first compound 6601 represented by chemical formula 1 and the second hole transport layer 680 includes the second compound 6602 represented by chemical formula 2, the organic light emitting element may have high efficiency, long lifespan, or low driving voltage.

The first stack may further include a functional layer in addition to the first light emitting layer 640. For example, the first stack may include a hole injection layer, a first hole transport layer, a first light emitting layer 640 and a first electron transport layer.

The second stack may further include a functional layer in addition to the second light emitting layer 650. For example, the second stack may include a second hole transport layer 680, a second light emitting layer 650, a second electron transport layer and an electron injection layer.

The hole injection layer may be positioned on the first electrode 610 as the anode electrode. The first hole transport layer may be positioned on the hole injection layer. The first light emitting layer 640 may be positioned on the first hole transport layer. The first electron transport layer may be positioned on the first light emitting layer 640. The n-type charge generation layer may be positioned on the first electron transport layer. The p-type charge generation layer 670 may be positioned on the n-type charge generation layer. The second hole transport layer 680 may be positioned on the p-type charge generation layer 670. The second light emitting layer 650 may be positioned on the second hole transport layer 680. The second electron transport layer may be positioned on the second light emitting layer 650. The electron injection layer may be positioned on the second electron transport layer. In this example, the first layer 660 may be a p-type charge generation layer 670 and a second hole transport layer 680.

Matters regarding the hole injection layer, the first hole transport layer, and the first light emitting layer 640 may be the same as those regarding the hole injection layer, the first hole transport layer and the first light emitting layer described above with reference to FIG. 6, unless otherwise described.

Matters regarding the first electron transport layer may be the same as those regarding the electron transport layer described above with reference to FIG. 4, unless otherwise described.

Matters regarding the n-type charge generation layer may be the same as those regarding the n-type charge generation layer described above with reference to FIG. 6, unless otherwise described.

Matters regarding the second light emitting layer 650, the second electron transport layer, and the electron injection layer may be the same as those regarding the light emitting layer, the electron transport layer, and the electron injection layer described above with reference to FIG. 4, unless otherwise described.

Figure 8:
Figure 8:
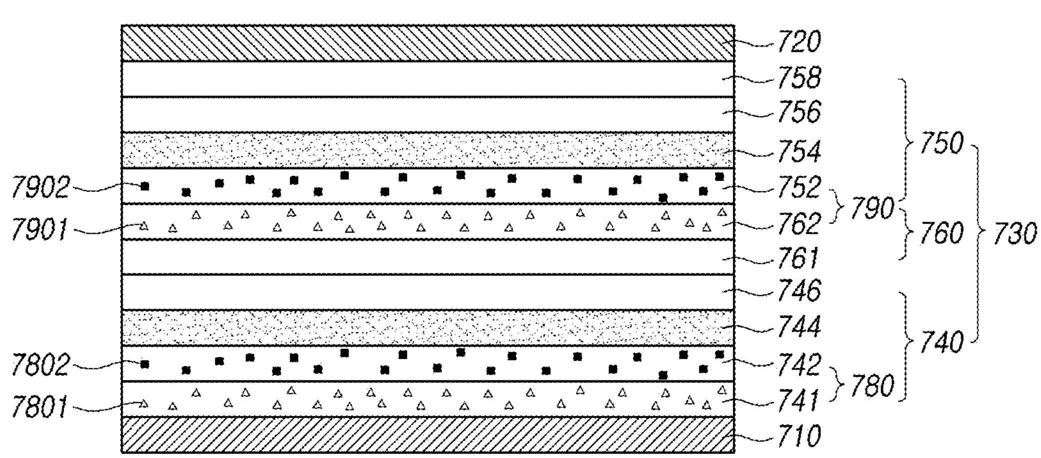

FIG. 8 is a cross-sectional view schematically illustrating an organic light emitting element 700 according to example embodiments of the present disclosure.

As shown in FIG. 8, the organic light emitting element 700 according to embodiments of the present disclosure includes a first electrode 710, a second electrode 720, and an organic material layer 730 positioned between the first electrode 710 and the second electrode 720.

The organic material layer 730 may include a first light emitting layer 744, a second light emitting layer 754, and a charge generation layer 760 positioned between the first light emitting layer 744 and the second light emitting layer 754. In other words, the organic light emitting element 700 may be a tandem type organic light emitting element including two or more light emitting layers. The tandem type organic light emitting element may include a plurality of stacks each including a light emitting layer. For example, the tandem type organic light emitting element may include a first stack 740 including a first light emitting layer 744 and a second stack 750 including a second light emitting layer 754. In this example, the first stack 740 may include additional functional layers in addition to the first light emitting layer 744. Further, the second stack 750 may include additional functional layers in addition to the second light emitting layer 754.

The first light emitting layer 744 and the second light emitting layer 754 may be formed of the same material or different materials. The first light emitting layer 744 may emit light having a first color, and the second light emitting layer 754 may emit light having a second color. The first color and the second color may be the same or different from each other.

The organic material layer 730 may include a first layer 790 positioned between the first light emitting layer 744 and the second light emitting layer 754 and a second layer 780 positioned between the first electrode 710 and the first light emitting layer 744.

The first layer 790 includes a first compound 7901 represented by chemical formula 1 and a second compound 7902 represented by chemical formula 2. The first compound 7901 and the second compound 7902 are described below in detail. As the first layer 790 includes the first compound 7901 represented by chemical formula 1 and the second compound 7902 represented by chemical formula 2, the organic light emitting element may have high efficiency, long lifespan, or low driving voltage.

The first layer 790 may include a charge generation layer and a hole transport layer. For example, the organic light emitting element 700 may include a charge generation layer 760 and a hole transport layer positioned between the first light emitting layer 744 and the second light emitting layer 754. The charge generation layer 760 may include a p-type charge generation layer 762 and an n-type charge generation layer 761. The hole transport layer may be a second hole transport layer 752 included in the second stack 750. In this example, the first layer 790 may be a p-type charge generation layer 762 and a second hole transport layer 752.

The p-type charge generation layer 762 may include the first compound 7901 represented by chemical formula 1 as a dopant. The first compound 7901 may be included in the p-type charge generation layer 762 as a p-type dopant. For example, the p-type charge generation layer 762 may be formed by doping with 1 wt % to 40 wt % of the first compound 7901 represented by chemical formula 1. Alternatively, the p-type charge generation layer 762 may include only the first compound 7901 represented by chemical formula 1 but do not include other compounds. As the p-type charge generation layer 762 includes the first compound 7901 represented by chemical formula 1, the organic light emitting element may have high efficiency, long lifespan, or low driving voltage.

The second hole transport layer 752 may include the second compound 7902 represented by chemical formula 2. However, the material for the hole transport layer is not limited to those described above, and may include other compounds that may be used as hole transport materials in the field of organic light emitting elements. As the second hole transport layer 752 includes the second compound 7902 represented by chemical formula 2, the organic light emitting element may have high efficiency, long lifespan, or low driving voltage.

As the p-type charge generation layer 762 includes the first compound 7901 represented by chemical formula 1 and the second hole transport layer 752 includes the second compound 7902 represented by chemical formula 2, the organic light emitting element may have high efficiency, long lifespan, or low driving voltage.

The second layer 780 includes a first compound 7801 represented by chemical formula 1 and a second compound 7802 represented by chemical formula 2. The first compound 7801 and the second compound 7802 are described below in detail. As the second layer 780 includes the first compound 7801 represented by chemical formula 1 and the second compound 7802 represented by chemical formula 2, the organic light emitting element may have high efficiency, long lifespan, or low driving voltage.

The second layer 780 may include a hole injection layer and a hole transport layer. For example, the organic light emitting element 700 may include a hole injection layer 741 and a first hole transport layer 742 positioned between the first electrode 710 and the first light emitting layer 744.

The hole injection layer 741 may include the first compound 7801 represented by chemical formula 1 as a dopant. The first compound 7801 may be included in the hole injection layer 741 as a p-type dopant. For example, the hole injection layer 741 may be formed by doping with 1 wt % to 40 wt % of the first compound 7801 represented by chemical formula 1. Alternatively, the hole injection layer 741 may include only the first compound 7801 represented by chemical formula 1 but do not include other compounds. As the hole injection layer 741 includes the first compound 7801 represented by chemical formula 1, the organic light emitting element may have high efficiency, long lifespan, or low driving voltage.

The first hole transport layer 742 may include the second compound 7802 represented by chemical formula 2. However, the material for the hole transport layer is not limited to those described above, and may include other compounds that may be used as hole transport materials in the field of organic light emitting elements. As the first hole transport layer 742 includes the second compound 7802 represented by chemical formula 2, the organic light emitting element may have high efficiency, long lifespan, or low driving voltage.

As the hole injection layer 741 includes the first compound 7801 represented by chemical formula 1 and the first hole transport layer 742 includes the second compound 7802 represented by chemical formula 2, the organic light emitting element may have high efficiency, long lifespan, or low driving voltage.

The first stack 740 may further include a functional layer in addition to the first light emitting layer 744. For example, the first stack 740 may include a hole injection layer 741, a first hole transport layer 742, a first light emitting layer 744 and a first electron transport layer 746.

The second stack 750 may further include a functional layer in addition to the second light emitting layer 754. For example, the second stack 750 may include a second hole transport layer 752, a second light emitting layer 754, a second electron transport layer 756 and an electron injection layer 758.

The hole injection layer 741 may be positioned on the first electrode 710 as the anode electrode. The first hole transport layer 742 may be positioned on the hole injection layer 741. The first light emitting layer 744 may be positioned on the first hole transport layer 742. The first electron transport layer 746 may be positioned on the first light emitting layer 744. The n-type charge generation layer 761 may be positioned on the first electron transport layer 746. The p-type charge generation layer 762 may be positioned on the n-type charge generation layer 761. The second hole transport layer 752 may be positioned on the p-type charge generation layer 762. The second light emitting layer 754 may be positioned on the second hole transport layer 752. The second electron transport 756 layer may be positioned on the second light emitting layer 754. The electron injection layer 758 may be positioned on the second electron transport layer 756. In this example, the first layer 790 may be a p-type charge generation layer 762 and a second hole transport layer 752. The second layer 780 may be a hole injection layer 741 and a first hole transport layer 742.

Matters regarding the first light emitting layer 744 and the n-type charge generation layer 761 may be the same as those regarding the first light emitting layer and the n-type charge generation layer described above with reference to FIG. 6, unless otherwise described.

Matters regarding the first electron transport layer 746, the second light emitting layer 754, the second electron transport layer 756, and the electron injection layer 758 may be the same as those regarding the light emitting layer, the electron transport layer and the electron injection layer described above with reference to FIG. 4, unless otherwise described.

Figure 9:
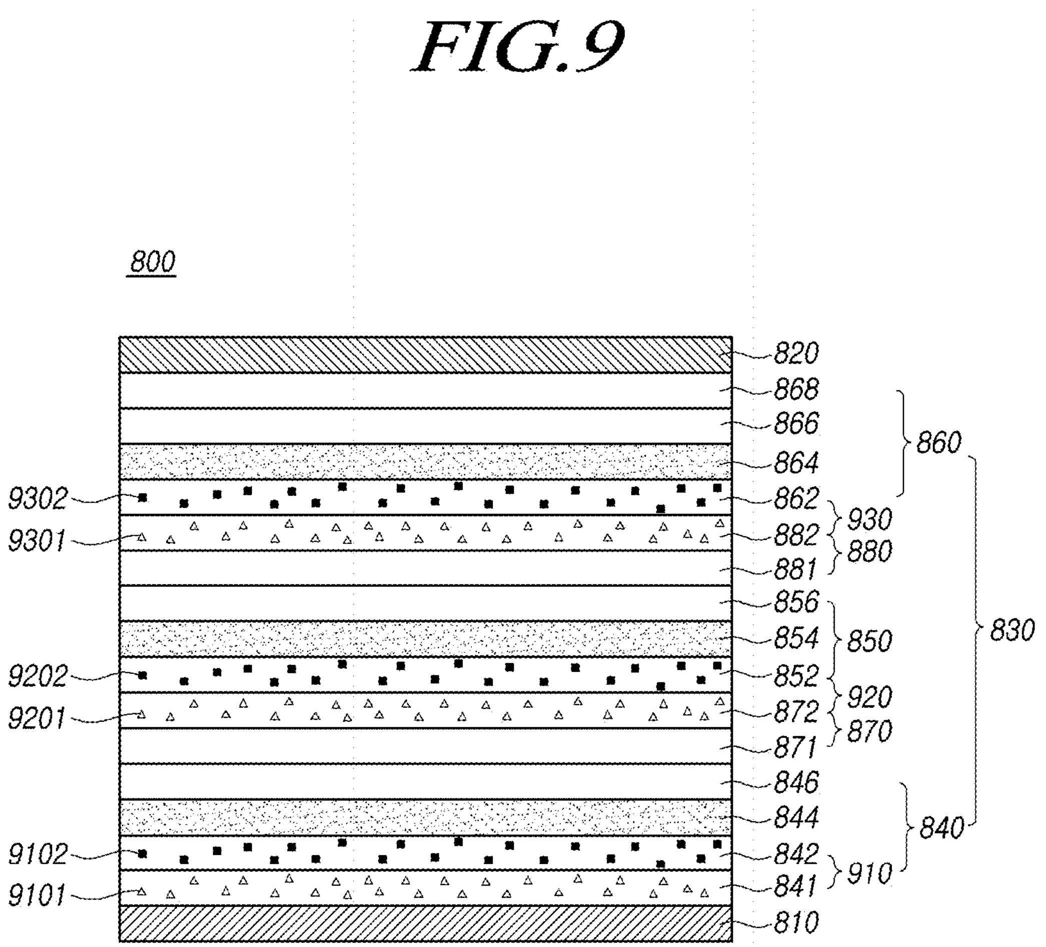

FIG. 9 is a cross-sectional view schematically illustrating an organic light emitting element 800 according to example embodiments of the present disclosure.

As shown in FIG. 9, the organic light emitting element 800 according to embodiments of the present disclosure includes a first electrode 810, a second electrode 820, and an organic material layer 830 positioned between the first electrode 810 and the second electrode 820.

The organic material layer 830 may include a first light emitting layer 844, a second light emitting layer 854, a third light emitting layer 864, a first charge generation layer 870 positioned between the first light emitting layer 844 and the second light emitting layer 854, and a second charge generation layer 880 positioned between the second light emitting layer 854 and the third light emitting layer 864. In other words, the organic light emitting element 800 may be a tandem type organic light emitting element including three or more light emitting layers. The tandem type organic light emitting element may include a plurality of stacks each including a light emitting layer. For example, the tandem type organic light emitting element may include a first stack 840 including a first light emitting layer 844, a second stack 850 including a second light emitting layer 854 and a third stack 860 including a third light emitting layer 864. In this example, the first stack 840 may include additional functional layers in addition to the first light emitting layer 844. Further, the second stack 850 may include additional functional layers in addition to the second light emitting layer 854. Further, the third stack 860 may include additional functional layers in addition to the third light emitting layer 864.

The first light emitting layer 844, the second light emitting layer 854 and the third light emitting layer 864 may be formed of the same material or different materials. The first light emitting layer 844 may emit light having a first color, the second light emitting layer 854 may emit light having a second color, and the third light emitting layer 864 may emit light having a third color. The first color, the second color and the third color may be the same or different from each other.

The organic material layer 830 may include a first layer 920 positioned between the first light emitting layer 844 and the second light emitting layer 854, a second layer 910 positioned between the first electrode 810 and the first light emitting layer 844 and a third layer 930 positioned between the second light emitting layer 854 and the third light emitting layer 864.

The first layer 920 includes a first compound 9201 represented by chemical formula 1 and a second compound 9202 represented by chemical formula 2. The first compound 9201 and the second compound 9202 are described below in detail. As the first layer 920 includes the first compound 9201 represented by chemical formula 1 and the second compound 9202 represented by chemical formula 2, the organic light emitting element may have high efficiency, long lifespan, or low driving voltage.

The first layer 920 may include a charge generation layer and a hole transport layer. For example, the organic light emitting element 800 may include a first charge generation layer 870 and a hole transport layer positioned between the first light emitting layer 844 and the second light emitting layer 854. The first charge generation layer 870 may include a first p-type charge generation layer 872 and a first n-type charge generation layer 871. The hole transport layer may be a second hole transport layer 852 included in the second stack 850. In this example, the first layer 920 may be a first p-type charge generation layer 872 and a second hole transport layer 852.

The first p-type charge generation layer 872 may include the first compound 9201 represented by chemical formula 1 as a dopant. The first compound 9201 may be included in the first p-type charge generation layer 872 as a p-type dopant. For example, the first p-type charge generation layer 872 may be formed by doping with 1 wt % to 40 wt % of the first compound 9201 represented by chemical formula 1. Alternatively, the first p-type charge generation layer 872 may include only the first compound 9201 represented by chemical formula 1 but do not include other compounds. As the first p-type charge generation layer 872 includes the first compound 9201 represented by chemical formula 1, the organic light emitting element may have high efficiency, long lifespan, or low driving voltage.

The second hole transport layer 852 may include the second compound 9202 represented by chemical formula 2. However, the material for the hole transport layer is not limited to those described above, and may include other compounds that may be used as hole transport materials in the field of organic light emitting elements. As the second hole transport layer 852 includes the second compound 9202 represented by chemical formula 2, the organic light emitting element may have high efficiency, long lifespan, or low driving voltage.

As the first p-type charge generation layer 872 includes the first compound 9201 represented by chemical formula 1 and the second hole transport layer 852 includes the second compound 9202 represented by chemical formula 2, the organic light emitting element may have high efficiency, long lifespan, or low driving voltage.

The second layer 910 includes a first compound 9101 represented by chemical formula 1 and a second compound 9102 represented by chemical formula 2. The first compound 9101 and the second compound 9102 are described below in detail. As the second layer 910 includes the first compound 9101 represented by chemical formula 1 and the second compound 9102 represented by chemical formula 2, the organic light emitting element may have high efficiency, long lifespan, or low driving voltage.

The second layer 910 may include a hole injection layer and a hole transport layer. For example, the organic light emitting element 800 may include a hole injection layer 841 and a first hole transport layer 842 positioned between the first electrode 810 and the first light emitting layer 844.

The hole injection layer 841 may include the first compound 9101 represented by chemical formula 1 as a dopant. The first compound 9101 may be included in the hole injection layer 841 as a p-type dopant. For example, the hole injection layer 841 may be formed by doping with 1 wt % to 40 wt % of the first compound 9101 represented by chemical formula 1. Alternatively, the hole injection layer 841 may include only the first compound 9101 represented by chemical formula 1 but do not include other compounds. As the hole injection layer 841 includes the first compound 9101 represented by chemical formula 1, the organic light emitting element may have high efficiency, long lifespan, or low driving voltage.

The first hole transport layer 842 may include the second compound 9102 represented by chemical formula 2. However, the material for the hole transport layer is not limited to those described above, and may include other compounds that may be used as hole transport materials in the field of organic light emitting elements. As the first hole transport layer 842 includes the second compound 9102 represented by chemical formula 2, the organic light emitting element may have high efficiency, long lifespan, or low driving voltage.

As the hole injection layer 841 includes the first compound 9101 represented by chemical formula 1 and the first hole transport layer 842 includes the second compound 9102 represented by chemical formula 2, the organic light emitting element may have high efficiency, long lifespan, or low driving voltage.

The third layer 930 includes a first compound 9301 represented by chemical formula 1 and a second compound 9302 represented by chemical formula 2. The first compound 9301 and the second compound 9302 are described below in detail. As the third layer 930 includes the first compound 9301 represented by chemical formula 1 and the second compound 9302 represented by chemical formula 2, the organic light emitting element may have high efficiency, long lifespan, or low driving voltage.

The third layer 930 may include a charge generation layer and a hole transport layer. For example, the organic light emitting element 800 may include a second charge generation layer 880 and a hole transport layer positioned between the second light emitting layer 854 and the third light emitting layer 864. The second charge generation layer 880 may include a second p-type charge generation layer 882 and a second n-type charge generation layer 881. The hole transport layer may be a third hole transport layer 862 included in the third stack 860. In this example, the third layer 930 may be a second p-type charge generation layer 882 and a third hole transport layer 862.

The second p-type charge generation layer 882 may include the first compound 9301 represented by chemical formula 1 as a dopant. The first compound 9301 may be included in the second p-type charge generation layer 882 as a p-type dopant. For example, the second p-type charge generation layer 882 may be formed by doping with 1 wt % to 40 wt % of the first compound 9301 represented by chemical formula 1. Alternatively, the second p-type charge generation layer 882 may include only the first compound 9301 represented by chemical formula 1 but do not include other compounds. As the second p-type charge generation layer 882 includes the first compound 9301 represented by chemical formula 1, the organic light emitting element may have high efficiency, long lifespan, or low driving voltage.

The third hole transport layer 862 may include the second compound 9302 represented by chemical formula 2. However, the material for the hole transport layer is not limited to those described above, and may include other compounds that may be used as hole transport materials in the field of organic light emitting elements. As the third hole transport layer 862 includes the second compound 9302 represented by chemical formula 2, the organic light emitting element may have high efficiency, long lifespan, or low driving voltage.

As the second p-type charge generation layer 882 includes the first compound 9301 represented by chemical formula 1 and the third hole transport layer 862 includes the second compound 9302 represented by chemical formula 2, the organic light emitting element may have high efficiency, long lifespan, or low driving voltage.

The first stack 840 may further include a functional layer in addition to the first light emitting layer 844. For example, the first stack 840 may include a hole injection layer 841, a first hole transport layer 842, a first light emitting layer 844 and a first electron transport layer 846.

The second stack 850 may further include a functional layer in addition to the second light emitting layer 854. For example, the second stack 850 may include a second hole transport layer 852, a second light emitting layer 854 and a second electron transport layer 856.

The third stack 860 may further include a functional layer in addition to the third light emitting layer 864. For example, the third stack 860 may include a third hole transport layer 862, a third light emitting layer 864, a third electron transport layer 866 and an electron injection layer 868.

The hole injection layer 841 may be positioned on the first electrode 810 as the anode electrode. The first hole transport layer 842 may be positioned on the hole injection layer 841. The first light emitting layer 844 may be positioned on the first hole transport layer 842. The first electron transport layer 846 may be positioned on the first light emitting layer 844. The first n-type charge generation layer 871 may be positioned on the first electron transport layer 846. The first p-type charge generation layer 872 may be positioned on the first n-type charge generation layer 871. The second hole transport layer 852 may be positioned on the first p-type charge generation layer 872. The second light emitting layer 854 may be positioned on the second hole transport layer 852. The second electron transport 856 layer may be positioned on the second light emitting layer 854. The electron injection layer 758 may be positioned on the second electron transport layer 756. In this example, the first layer 790 may be a p-type charge generation layer 762 and a second hole transport layer 752. The second layer 780 may be a hole injection layer 741 and a first hole transport layer 742.

The second n-type charge generation layer 881 may be positioned on the second electron transport layer 856. The second p-type charge generation layer 882 may be positioned on the second n-type charge generation layer 881. The third hole transport layer 862 may be positioned on the second p-type charge generation layer 882. The third light emitting layer 864 may be positioned on the third hole transport layer 862. The third electron transport 866 layer may be positioned on the third light emitting layer 864. The electron injection layer 868 may be positioned on the third electron transport layer 866. In this example, the first layer 920 may be a first p-type charge generation layer 872 and a second hole transport layer 852. The second layer 910 may be a hole injection layer 841 and a first hole transport layer 842. The third layer 930 may be a second p-type charge generation layer 882 and a third hole transport layer 862.

Matters regarding the first light emitting layer 844, the first n-type charge generation layer 871 and the second n-type charge generation layer 881 may be the same as those regarding the first light emitting layer and the n-type charge generation layer described above with reference to FIG. 6, unless otherwise described.

Matters regarding the first electron transport layer 846, the second light emitting layer 854, the third light emitting layer 864, the second electron transport layer 856, the third electron transport layer 866, and the electron injection layer 868 may be the same as those regarding the light emitting layer, the electron transport layer and the electron injection layer described above with reference to FIG. 4, unless otherwise described.

Hereinafter, the first compounds 2301, 3401, 4401, 5601, 6601, 7801, 7901, 9101, 9201, and 9301 represented by chemical formula 1 and the second compounds 2302, 3402, 4402, 5602, 6602, 7802, 7902, 9102, 9202, and 9302 represented by chemical formula 2 are described below.

The first compounds 2301, 3401, 4401, 5601, 6601, 7801, 7901, 9101, 9201, and 9301 are represented by chemical formula 1 below.

[Chemical formula 1]

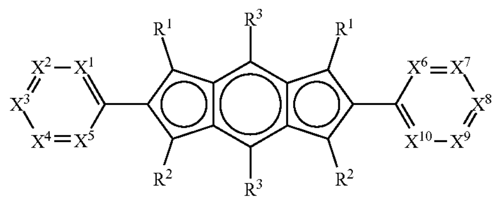

Hereinafter, chemical formula 1 is described.

$R^1$ and $R^2$ may be each independently selected from the group consisting of a hydrogen, a deuterium, a tritium, a halogen, a cyano group, a $C_1$-$C_{50}$ alkyl group, a $C_1$-$C_{50}$ haloalkyl group, a $C_1$-$C_{30}$ alkoxy group, a $C_1$-$C_{30}$ haloalkoxy group, a $C_6$-$C_{60}$ aryl group, a $C_6$-$C_{60}$ haloaryl group, a $C_2$-$C_{60}$ heterocyclic group including at least one heteroatom selected from the group consisting of O, N, S, Si and P, a $C_2$-$C_{60}$ haloheterocyclic group including at least one heteroatom selected from the group consisting of O, N, S, Si and P, and a malononitrile group.

For example, $R^1$ and $R^2$ may be each independently selected from the group consisting of a hydrogen, a deuterium, a tritium, a cyano group and a malononitrile group.

$R^3$ may be each independently selected from the group consisting of a hydrogen, a deuterium, a tritium, a halogen, a cyano group, a malononitrile group, a $C_1$-$C_{50}$ alkyl group, a $C_1$-$C_{50}$ haloalkyl group, a $C_1$-$C_{30}$ alkoxy group, a $C_1$-$C_{30}$ haloalkoxy group, a $C_6$-$C_{60}$ aryl group, a $C_6$-$C_{60}$ haloaryl group, a $C_2$-$C_{60}$ heterocyclic group including at least one heteroatom selected from the group consisting of O, N, S, Si and P, and a $C_2$-$C_{60}$ haloheterocyclic group of including at least one heteroatom selected from the group consisting of O, N, S, Si and P.

For example, $R^3$ may be each independently selected from the group consisting of a hydrogen, a deuterium, a tritium, a halogen and a cyano group.

$X^1$ to $X^5$ may be each independently $CR^a$ or N, and at least two of $X^1$ to $X^5$ may be $CR^a$.

$R^a$ may be each independently selected from the group consisting of a hydrogen, a deuterium, a tritium, a halogen, a cyano group, a $C_1$-$C_{50}$ alkyl group, and a $C_1$-$C_{50}$ alkoxy group. At least one of $R^a$ may be a halogen, or a cyano group. In other words, at least one of $R^a$ may be an electron withdrawing group (EWG).

For example, $R^a$ may be each independently selected from the group consisting of a hydrogen, a deuterium, a tritium, a halogen, and a cyano group. At least one of $R^a$ may be a halogen, or a cyano group.

$X^6$ to $X^{10}$ may be each independently $CR^b$ or N, and at least two of $X^6$ to $X^{10}$ may be $CR^b$.

$R^b$ may be each independently selected from the group consisting of a hydrogen, a deuterium, a tritium, a halogen, a cyano group, a $C_1$-$C_{50}$ alkyl group, and a $C_1$-$C_{50}$ alkoxy group. At least one of $R^b$ may be a halogen, or a cyano group. In other words, at least one of $R^b$ may be an electron withdrawing group (EWG).

For example, $R^b$ may be each independently selected from the group consisting of a hydrogen, a deuterium, a tritium, a halogen, and a cyano group. At least one of $R^b$ may be a halogen, or a cyano group.

In $R^1$ to $R^3$, $R^a$ and $R^b$ of chemical formula 1, the alkyl group, the haloalkyl group, the alkoxy group, the haloalkoxy group, the aryl group, the haloaryl group, the heterocyclic group, and the haloheterocyclic group may each be further substituted with one or more substituents selected from the group consisting of deuterium, a nitro group, a cyano group, an amino group, a $C_1$-$C_{20}$ alkoxy group, a $C_1$-$C_{20}$ haloalkoxy group, a $C_1$-$C_{20}$ alkyl group, a $C_1$-$C_{20}$ haloalkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group including at least one heteroatom selected from the group consisting of O, N, S, Si and P, a $C_3$-$C_{60}$ alkylsilyl group, a $C_{18}$-$C_{60}$ arylsilyl group, and a $C_8$-$C_{60}$ alkylarylsilyl group.

The first compounds 2301, 3401, 4401, 5601, 6601, 7801, 7901, 9101, 9201, and 9301 represented by chemical formula 1 may be represented by any one of chemical formula 3 and chemical formula 4 below.

[Chemical formula 3]

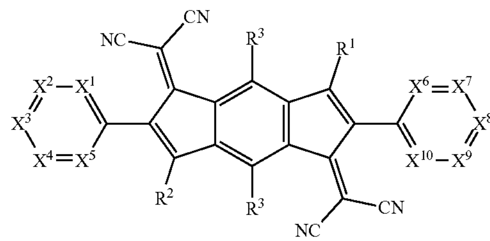

[Chemical formula 4]

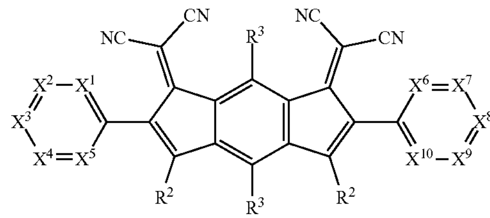

In chemical formula 3 and chemical formula 4, $R^1$ to $R^3$ and $X^1$ to $X^{10}$ may be the same as $R^1$ to $R^3$ and $X^1$ to $X^{10}$ defined for chemical formula 1 described above.

The first compounds 2301, 3401, 4401, 5601, 6601, 7801, 7901, 9101, 9201, and 9301 represented by chemical formula 1 may be represented by any one of chemical formula 5 and chemical formula 6 below.

[Chemical formula 5]

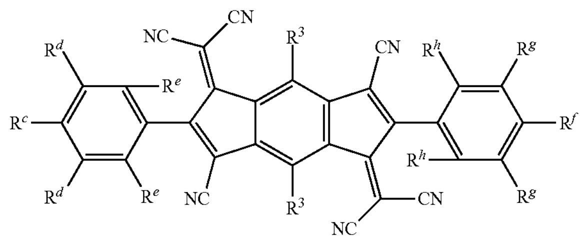

[Chemical formula 6]

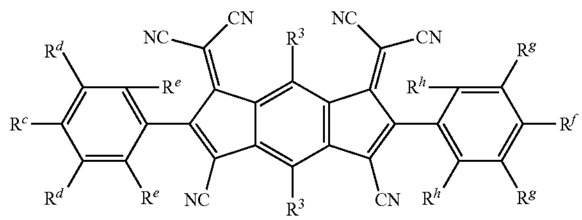

Hereinafter, chemical formula 5 and chemical formula 6 are described.

$R^c$ and $R^d$ may be each independently selected from the group consisting of a hydrogen, a deuterium, a tritium, a halogen, a cyano group, a $C_1$-$C_{50}$ alkyl group, and a $C_1$-$C_{50}$ alkoxy group.

$R^e$ may be each independently selected from the group consisting of a hydrogen, a deuterium, a tritium, a halogen, and a cyano group.

$R^f$ and $R^g$ may be each independently selected from the group consisting of a hydrogen, a deuterium, a tritium, a halogen, a cyano group, a $C_1$-$C_{50}$ alkyl group, and a $C_1$-$C_{50}$ alkoxy group.

$R^h$ may be each independently selected from the group consisting of a hydrogen, a deuterium, a tritium, a halogen, and a cyano group.

$R^3$ may be the same as $R^3$ defined for chemical formula 1.

Hereinafter, chemical formula 5 is described in more detail.

$R^c$ may be each independently a halogen, or a cyano group. In other words, $R^c$ may be an electron withdrawing group (EWG).

One $R^d$ may be a hydrogen, a deuterium, or a tritium, and the other $R^d$ may be a halogen, or a cyano group. In this example, one $R^d$ of the two $R^d$s may be an electron withdrawing group (EWG).

In another example, two $R^d$s may be each independently a halogen, or a cyano group. In this example, both the $R^d$s may be an electron withdrawing group (EWG).

In the benzene ring of chemical formula 5 in which $R^c$ and $R^d$ are substituted, $R^c$, which is a para position in relation to indacene moiety, may be an electron withdrawing group (EWG), and at least one of $R^d$, which is an ortho position in relation to $R^c$, may be an electron withdrawing group (EWG). In $R^c$ and $R^d$, the electron withdrawing group (EWG) may be substituted with a substituent other than a cyano group. The organic light emitting elements 200, 300, 400, 500, 600, 700, and 800 including the first compounds 2301, 3401, 4401, 5601, 6601, 7801, 7901, 9101, 9201, and 9301 having such a structure and represented in chemical formula 5 have excellent efficiency, a long lifespan, or a low driving voltage.

One $R^e$ may be a hydrogen, a deuterium, or a tritium, and the other $R^e$ may be a halogen, or a cyano group. For example, one $R^e$ may be a hydrogen, and the other $R^e$ may be a halogen, or a cyano group. In the six-membered ring connected to the indacene moiety in the center, the halogen or cyano group which is an electron withdrawing group (EWG) may be substituted at only one of the two carbons which are in the ortho positions of the carbons connected to the indacene moiety. By including the first compounds 2301, 3401, 4401, 5601, 6601, 7801, 7901, 9101, 9201, and 9301 having such a structure, the organic light emitting elements 200, 300, 400, 500, 600, 700, and 800 may have excellent efficiency, long lifespan or low driving voltage.

$R^f$ may be each independently a halogen, or a cyano group. In other words, $R^f$ may be an electron withdrawing group (EWG).

One $R^g$ may be a hydrogen, a deuterium, or a tritium, and the other $R^g$ may be a halogen, or a cyano group. In this example, one $R^g$ of the two $R^g$s may be an electron withdrawing group (EWG).

In another example, two $R^g$s may be each independently a halogen, or a cyano group. In this example, both the $R^g$s may be an electron withdrawing group (EWG).

In the benzene ring of chemical formula 5 in which $R^f$ and $R^g$ are substituted, $R^f$, which is a para position in relation to indacene moiety, may be an electron withdrawing group (EWG), and at least one of $R^g$, which is an ortho position in relation to $R^f$, may be an electron withdrawing group (EWG). In $R^f$ and $R^g$, the electron withdrawing group (EWG) may be substituted with a substituent other than a cyano group. The organic light emitting elements 200, 300, 400, 500, 600, 700, and 800 including the first compounds 2301, 3401, 4401, 5601, 6601, 7801, 7901, 9101, 9201, and 9301 having such a structure and represented in chemical formula 5 have excellent efficiency, a long lifespan, or a low driving voltage.

One $R^h$ may be a hydrogen, a deuterium, or a tritium, and the other $R^h$ may be a halogen, or a cyano group. For example, one $R^h$ may be a hydrogen, and the other $R^h$ may be a halogen, or a cyano group. In the six-membered ring connected to the indacene moiety in the center, the halogen or cyano group which is an electron withdrawing group (EWG) may be substituted at only one of the two carbons which are in the ortho positions of the carbons connected to the indacene moiety. By including the first compounds 2301, 3401, 4401, 5601, 6601, 7801, 7901, 9101, 9201, and 9301 having such a structure, the organic light emitting elements 200, 300, 400, 500, 600, 700, and 800 may have excellent efficiency, long lifespan or low driving voltage.

Hereinafter, chemical formula 6 is described in more detail.

$R^c$ may be each independently a halogen, or a cyano group. In other words, $R^c$ may be an electron withdrawing group (EWG).

One $R^d$ may be a hydrogen, a deuterium, or a tritium, and the other $R^d$ may be a halogen, or a cyano group. In this example, one $R^d$ of the two $R^d$s may be an electron withdrawing group (EWG).

In another example, two $R^d$s may be each independently a halogen, or a cyano group. In this example, both the $R^d$s may be an electron withdrawing group (EWG).

In the benzene ring of chemical formula 6 in which $R^c$ and $R^d$ are substituted, $R^c$, which is a para position in relation to indacene moiety, may be an electron withdrawing group (EWG), and at least one of $R^d$, which is an ortho position in relation to $R^c$, may be an electron withdrawing group (EWG). In $R^c$ and $R^d$, the electron withdrawing group (EWG) may be substituted with a substituent other than a cyano group. The organic light emitting elements 200, 300, 400, 500, 600, 700, and 800 including the first compounds 2301, 3401, 4401, 5601, 6601, 7801, 7901, 9101, 9201, and 9301 having such a structure and represented in chemical formula 6 have excellent efficiency, a long lifespan, or a low driving voltage.

One $R^e$ may be a hydrogen, a deuterium, or a tritium, and the other $R^e$ may be a halogen, or a cyano group. For example, one $R^e$ may be a hydrogen, and the other $R^e$ may be a halogen, or a cyano group. In the six-membered ring connected to the indacene moiety in the center, the halogen or cyano group which is an electron withdrawing group (EWG) may be substituted at only one of the two carbons which are in the ortho positions of the carbons connected to the indacene moiety. By including the first compounds 2301, 3401, 4401, 5601, 6601, 7801, 7901, 9101, 9201, and 9301 having such a structure, the organic light emitting elements 200, 300, 400, 500, 600, 700, and 800 may have excellent efficiency, long lifespan or low driving voltage.

$R^f$ may be each independently a halogen, or a cyano group. In other words, $R^f$ may be an electron withdrawing group (EWG).

One $R^g$ may be a hydrogen, a deuterium, or a tritium, and the other $R^g$ may be a halogen, or a cyano group. In this example, one $R^g$ of the two $R^g$s may be an electron withdrawing group (EWG).

In another example, two $R^g$s may be each independently a halogen, or a cyano group. In this example, both the $R^g$s may be an electron withdrawing group (EWG).

One $R^h$ may be a hydrogen, a deuterium, or a tritium, and the other $R^h$ may be a halogen, or a cyano group. For example, one $R^h$ may be a hydrogen, and the other $R^h$ may be a halogen, or a cyano group. In the six-membered ring connected to the indacene moiety in the center, the halogen or cyano group which is an electron withdrawing group (EWG) may be substituted at only one of the two carbons which are in the ortho positions of the carbons connected to the indacene moiety. By including the first compounds 2301, 3401, 4401, 5601, 6601, 7801, 7901, 9101, 9201, and 9301 having such a structure, the organic light emitting elements 200, 300, 400, 500, 600, 700, and 800 may have excellent efficiency, long lifespan or low driving voltage.

In $R^c$ to $R^h$ of chemical formulas 5 and 6, the haloalkyl group and haloalkoxy group may each be further substituted with one or more substituents selected from the group consisting of deuterium, a nitro group, a cyano group, an amino group, an alkoxy group of $C_1$-$C_{20}$, a haloalkoxy group of $C_1$-$C_{20}$, an alkyl group of $C_1$-$C_{20}$, a haloalkyl group of $C_1$-$C_{20}$, an alkenyl group of $C_2$-$C_{20}$, an alkynyl group of $C_2$-$C_{20}$, an aryl group of $C_6$-$C_{20}$, an aryl group of $C_6$-$C_{20}$ substituted with deuterium, a fluorenyl group, a heterocyclic group of $C_2$-$C_{20}$, an alkylsilyl group of $C_3$-$C_{60}$, an arylsilyl group of $C_{18}$-$C_{60}$, and an alkylarylsilyl group of $C_8$-$C_{60}$ may be further substituted.

The first compounds 2301, 3401, 4401, 5601, 6601, 7801, 7901, 9101, 9201, and 9301 represented by chemical formula 1 may be represented by any one of chemical formula 7 to chemical formula 16 below. More specifically, the compound represented by chemical formula 3 described above may be represented by any one of chemical formula 7 to chemical formula 11, and the compound represented by chemical formula 4 described above may be represented by any one of chemical formula 12 to chemical formula 16.

[Chemical formula 7]

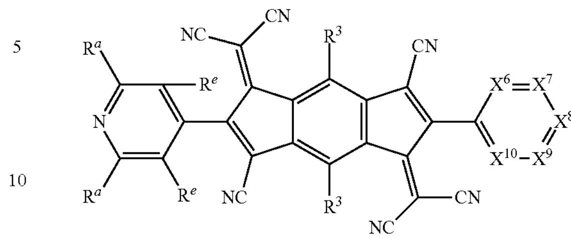

[Chemical formula 8]

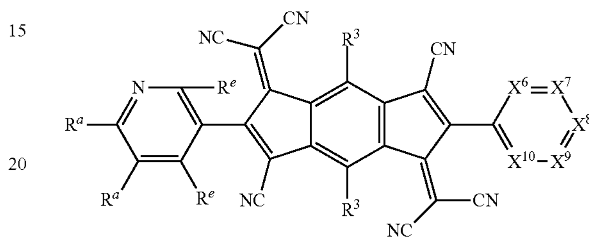

[Chemical formula 9]

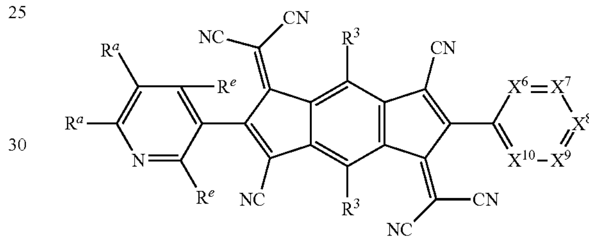

[Chemical formula 10]

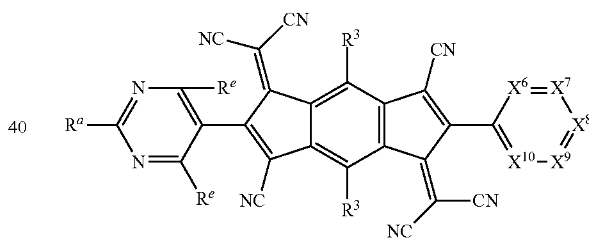

[Chemical formula 11]

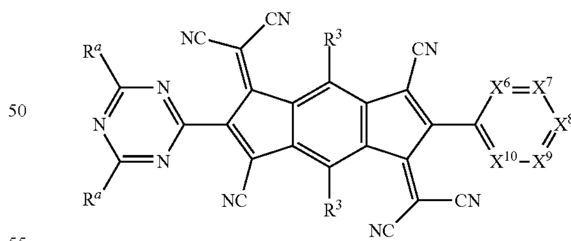

[Chemical formula 12]

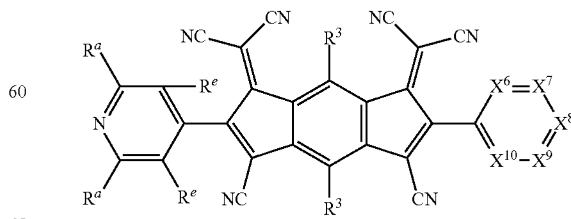

-continued

[Chemical formula 13]

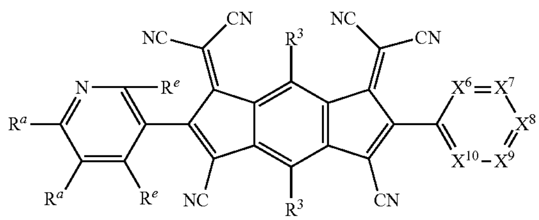

[Chemical formula 14]

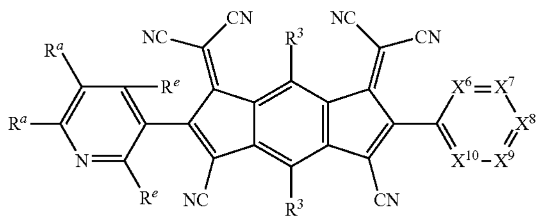

[Chemical formula 15]

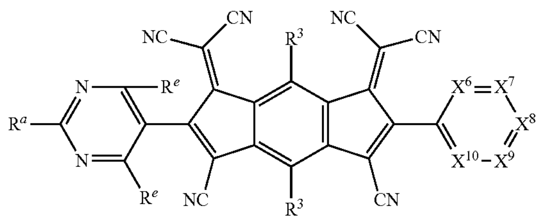

[Chemical formula 16]

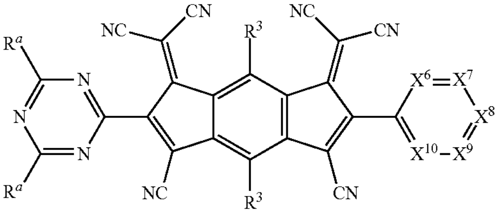

Hereinafter, chemical formula 7 to chemical formula 16 are described.

$R^a$, $R^3$ and $X^6$ to $X^{10}$ may be the same as $R^a$, $R^3$ and $X^6$ to $X^{10}$ defined for chemical formula 1 described above.

$R^e$ may be each independently selected from the group consisting of a hydrogen, a deuterium, a tritium, a halogen, and a cyano group. For example, one $R^e$ may be a hydrogen, and the other $R^e$ may be a halogen, or a cyano group. In the six-membered ring connected to the indacene moiety in the center, the halogen or cyano group which is an electron withdrawing group (EWG) may be substituted at only one of the two carbons which are in the ortho positions of the carbons connected to the indacene moiety. By including the first compounds 2301, 3401, 4401, 5601, 6601, 7801, 7901, 9101, 9201, and 9301 having such a structure, the organic light emitting elements 200, 300, 400, 500, 600, 700, and 800 may have excellent efficiency, long lifespan or low driving voltage.

Hereinafter, chemical formula 7 is described in more detail.

One $R^e$ may be a hydrogen, a deuterium, or a tritium, and the other $R^e$ may be a halogen, or a cyano group. For example, one $R^e$ may be a hydrogen, and the other $R^e$ may be a halogen, or a cyano group.

Hereinafter, chemical formula 8 is described in more detail.

One $R^e$ may be a hydrogen, a deuterium, or a tritium, and the other $R^e$ may be a halogen, or a cyano group. For example, one $R^e$ may be a hydrogen, and the other $R^e$ may be a halogen, or a cyano group.

Hereinafter, chemical formula 9 is described in more detail.

One $R^e$ may be a hydrogen, a deuterium, or a tritium, and the other $R^e$ may be a halogen, or a cyano group. For example, one $R^e$ may be a hydrogen, and the other $R^e$ may be a halogen, or a cyano group.

Hereinafter, chemical formula 10 is described in more detail.

One $R^e$ may be a hydrogen, a deuterium, or a tritium, and the other $R^e$ may be a halogen, or a cyano group. For example, one $R^e$ may be a hydrogen, and the other $R^e$ may be a halogen, or a cyano group.

Hereinafter, chemical formula 11 is described in more detail.

One $R^e$ may be a hydrogen, a deuterium, or a tritium, and the other $R^e$ may be a halogen, or a cyano group. For example, one $R^e$ may be a hydrogen, and the other $R^e$ may be a halogen, or a cyano group.

Hereinafter, chemical formula 12 is described in more detail.

One $R^e$ may be a hydrogen, a deuterium, or a tritium, and the other $R^e$ may be a halogen, or a cyano group. For example, one $R^e$ may be a hydrogen, and the other $R^e$ may be a halogen, or a cyano group.

Hereinafter, chemical formula 13 is described in more detail.

One $R^e$ may be a hydrogen, a deuterium, or a tritium, and the other $R^e$ may be a halogen, or a cyano group. For example, one $R^e$ may be a hydrogen, and the other $R^e$ may be a halogen, or a cyano group.

Hereinafter, chemical formula 14 is described in more detail.

One $R^e$ may be a hydrogen, a deuterium, or a tritium, and the other $R^e$ may be a halogen, or a cyano group. For example, one $R^e$ may be a hydrogen, and the other $R^e$ may be a halogen, or a cyano group.

Hereinafter, chemical formula 15 is described in more detail.

One $R^e$ may be a hydrogen, a deuterium, or a tritium, and the other $R^e$ may be a halogen, or a cyano group. For example, one $R^e$ may be a hydrogen, and the other $R^e$ may be a halogen, or a cyano group.

Hereinafter, chemical formula 16 is described in more detail.

One $R^e$ may be a hydrogen, a deuterium, or a tritium, and the other $R^e$ may be a halogen, or a cyano group. For example, one $R^e$ may be a hydrogen, and the other $R^e$ may be a halogen, or a cyano group.

In chemical formula 7 to chemical formula 16 described above, at least one electron withdrawing group (EWG) may be substituted at the heterocyclic group bonded to the indacene moiety. The organic light emitting elements 200, 300, 400, 500, 600, 700, and 800 including the first compounds 2301, 3401, 4401, 5601, 6601, 7801, 7901, 9101, 9201, and 9301 having such a structure may have excellent efficiency, long lifespan or low driving voltage.

Further, an electron withdrawing group (EWG) is substituted at only one of the two carbons ortho-positioned to the carbon atoms of the 6-membered ring bonded to the indacene moiety. The organic light emitting elements 200, 300, 400, 500, 600, 700, and 800 including the first compounds 2301, 3401, 4401, 5601, 6601, 7801, 7901, 9101, 9201, and 9301 having such a structure may have excellent efficiency, long lifespan or low driving voltage.
The first compounds 2301, 3401, 4401, 5601, 6601, 7801, 7901, 9101, 9201, and 9301 represented by chemical formula 1 may be one or more of the compounds described below.
1
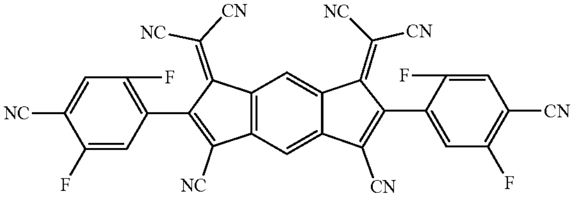
2
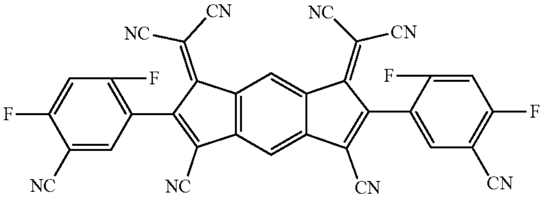
3
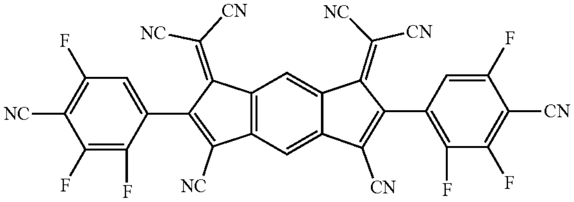
4
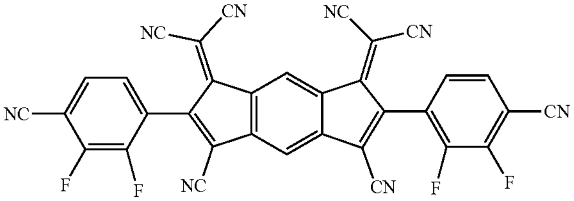
5
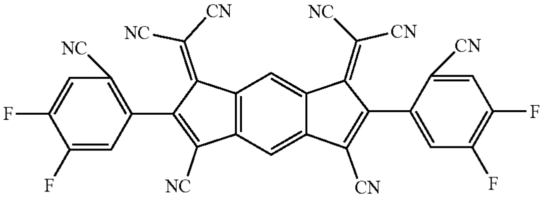
6
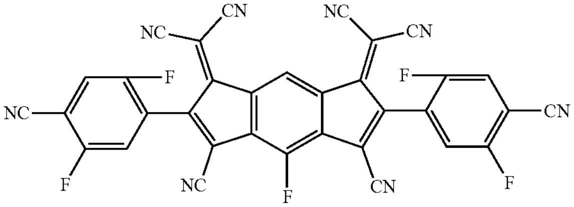
-continued
7
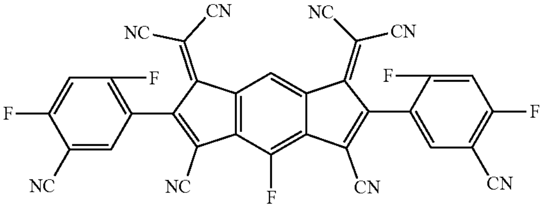
8
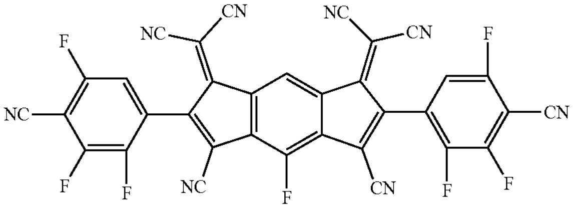
9
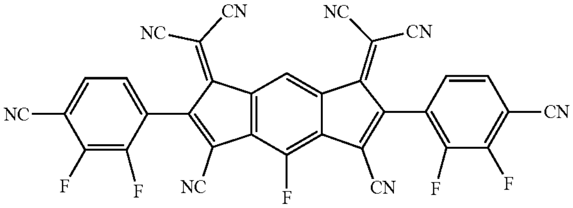
10
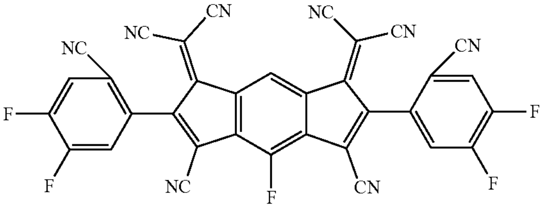
11
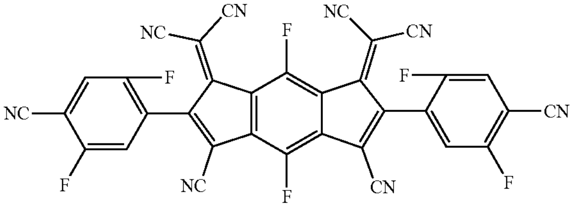
12
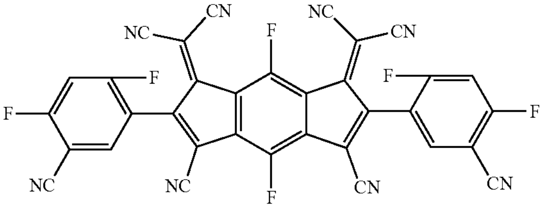

-continued
13
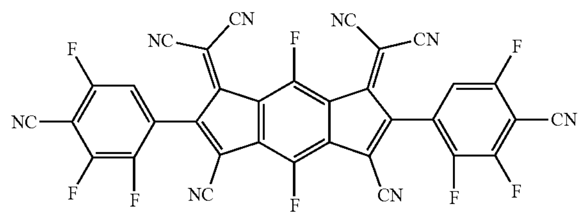
14
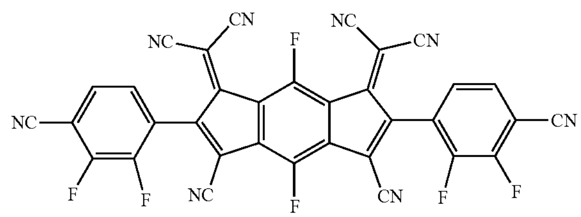
15
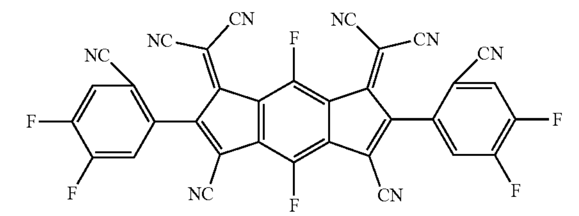
16
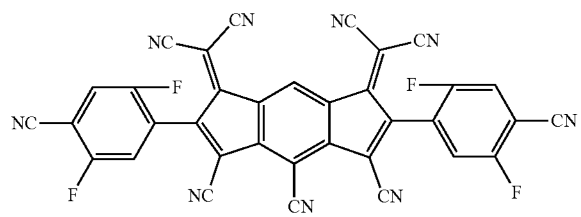
17
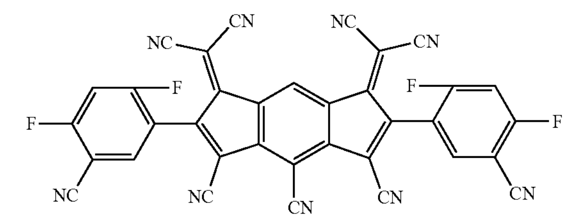
18
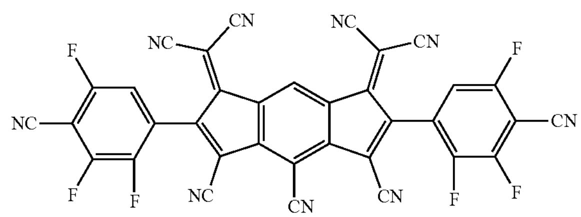
-continued
19
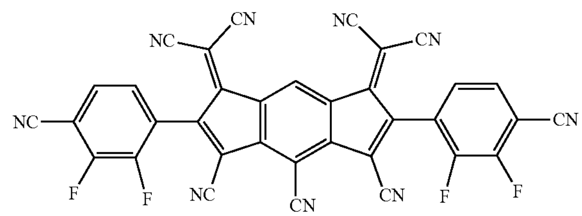
20
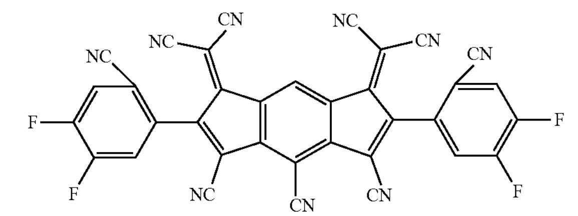
21
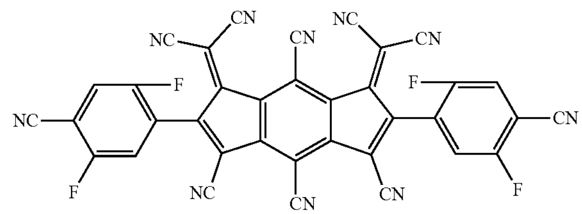
22
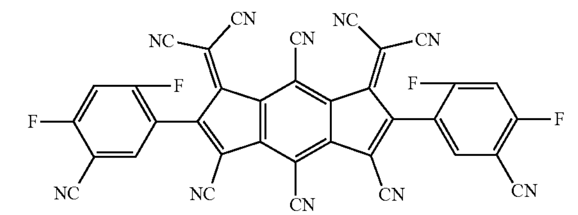
23
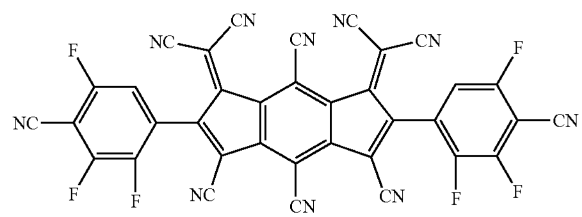
24
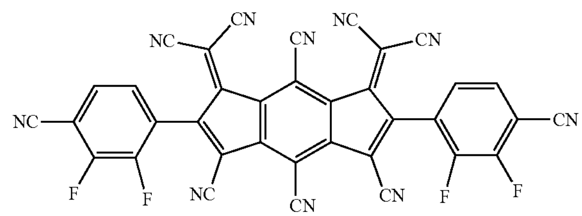

-continued
25
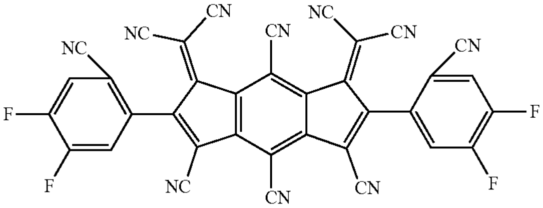
26
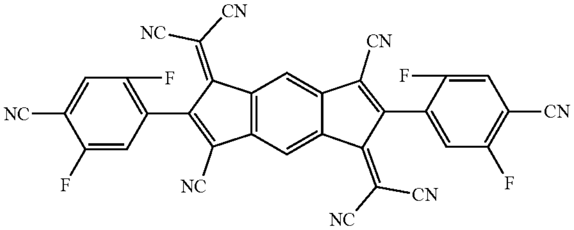
27
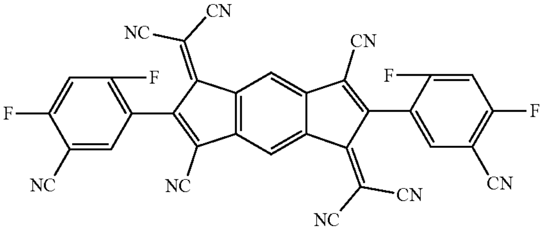
28
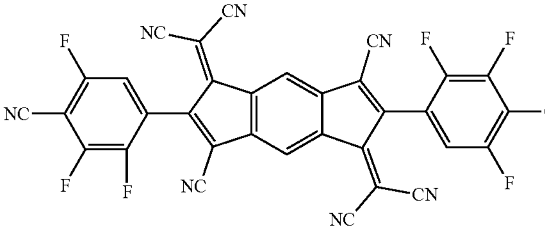
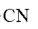
29
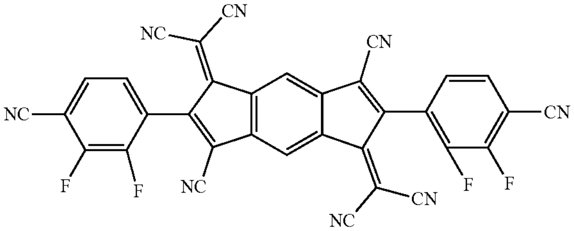
30
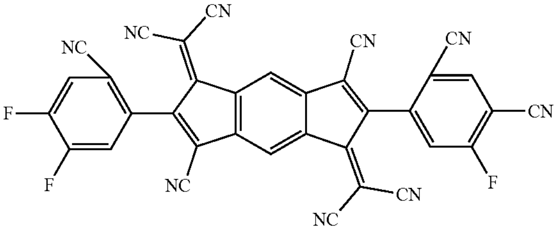
-continued
31
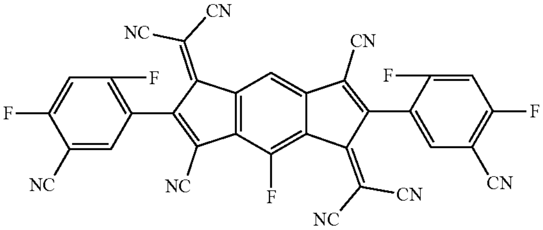
32
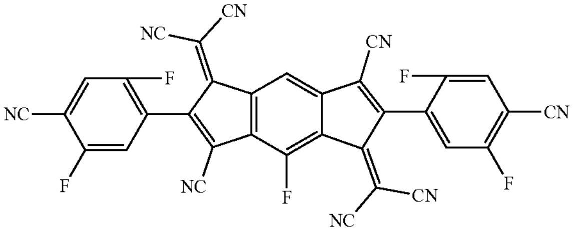
33
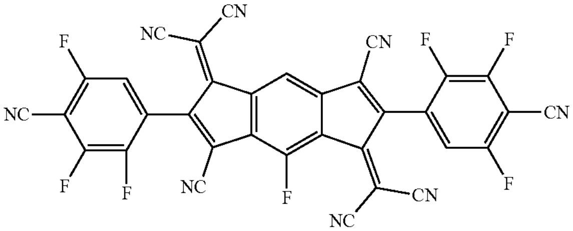
34
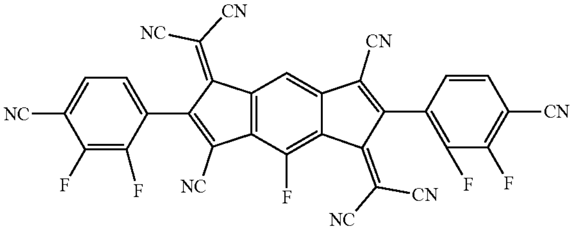
35
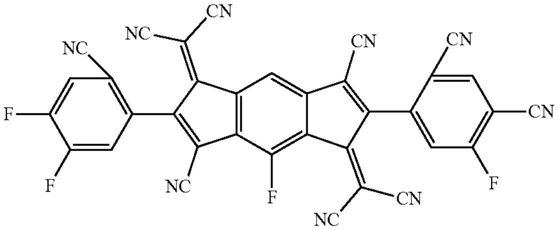
36
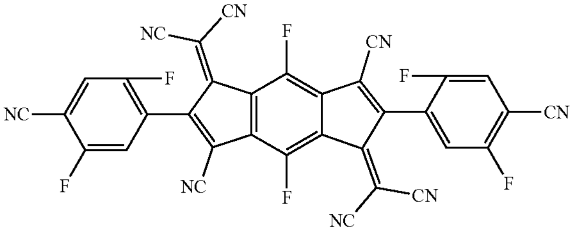

-continued
37
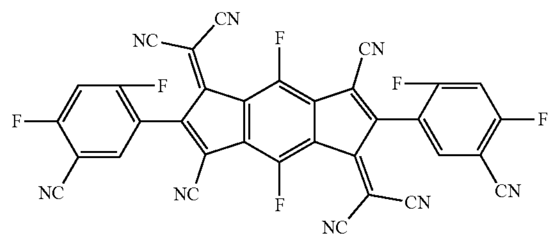
38
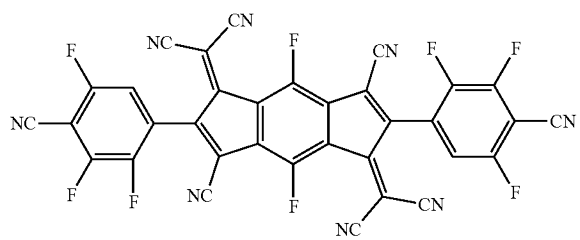
39
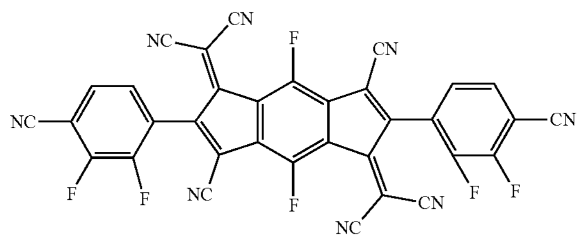
40
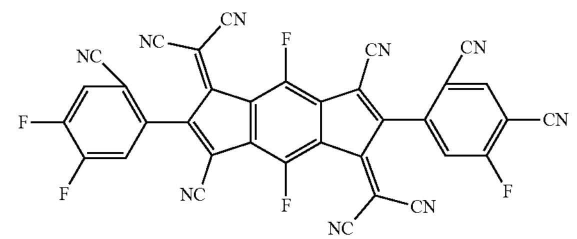
41
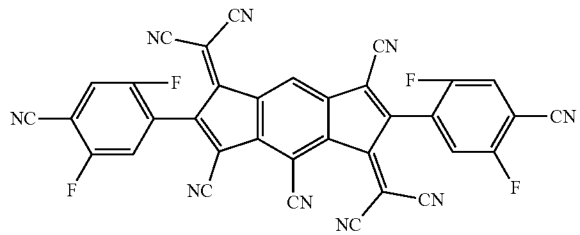
42
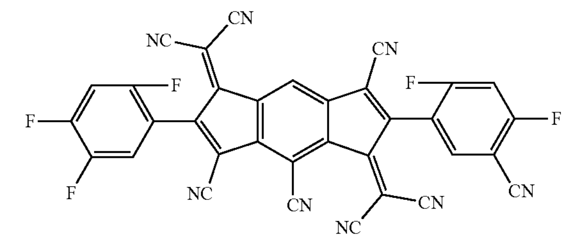
-continued
43
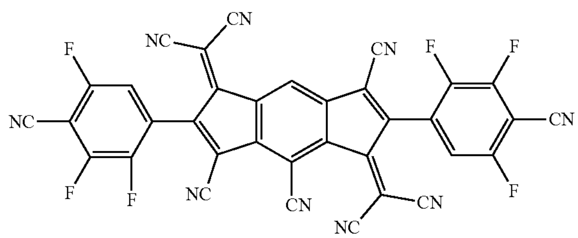
44
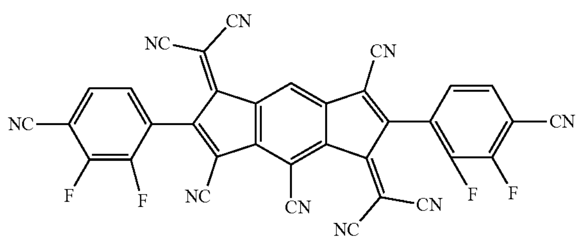
45
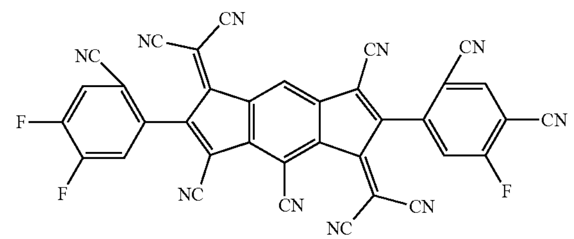
46
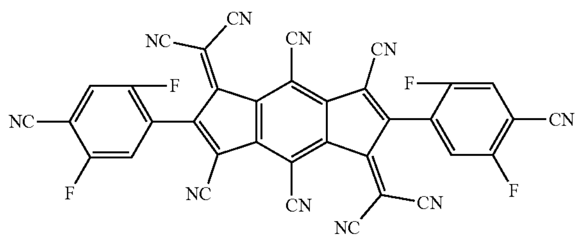
47
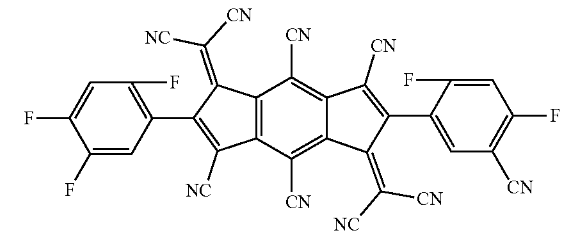
48
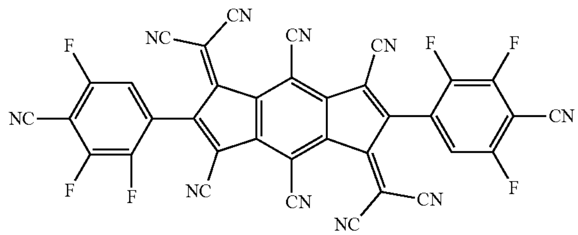

-continued
49
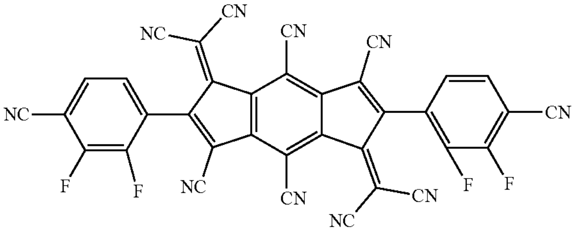
50
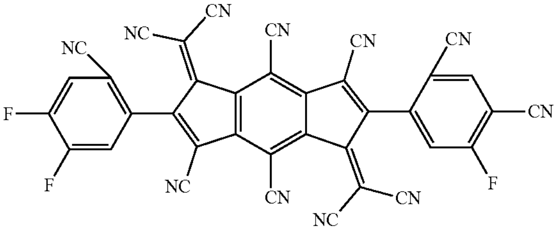
51
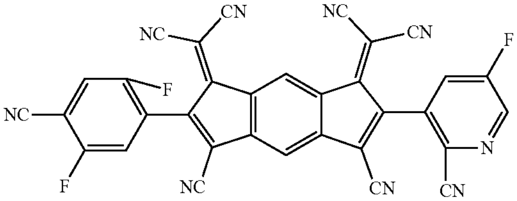
52
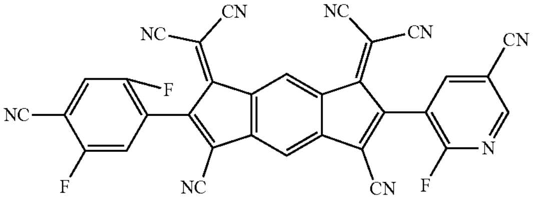
53
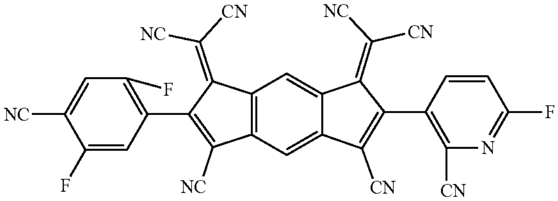
54
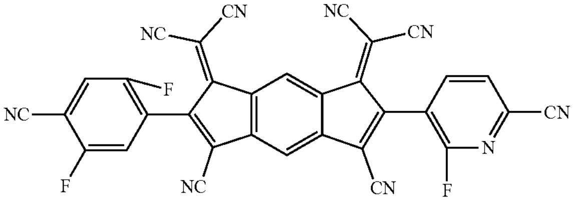
55
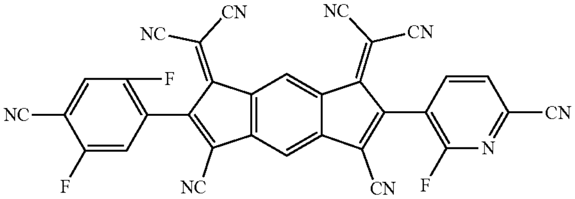
-continued
56
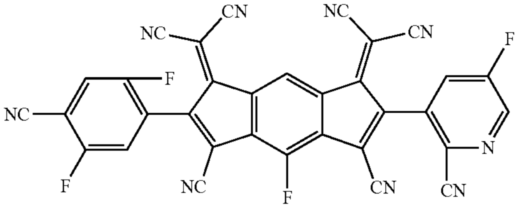
57
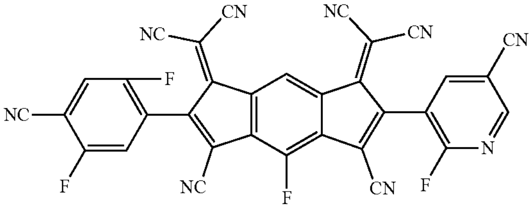
58
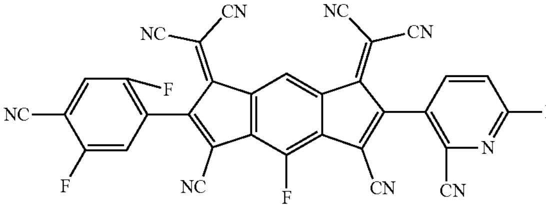
59
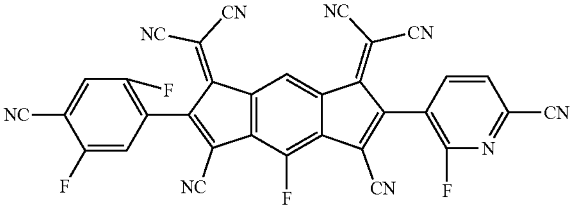
60
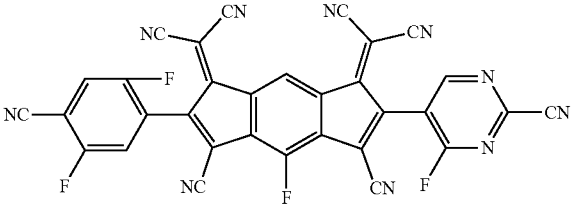
61
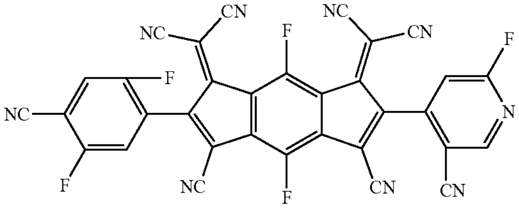
62
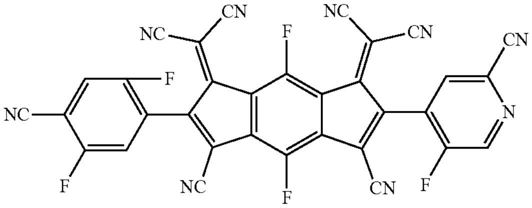

-continued
63
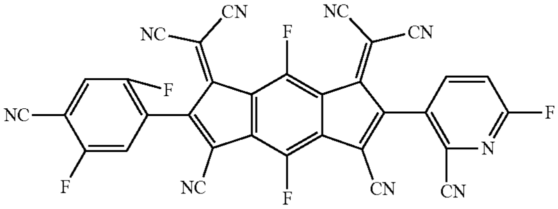
64
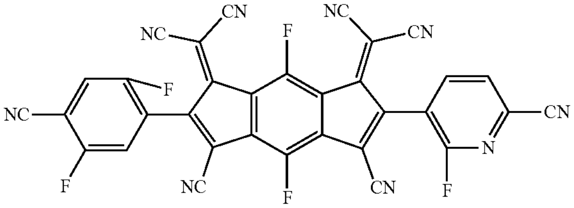
65
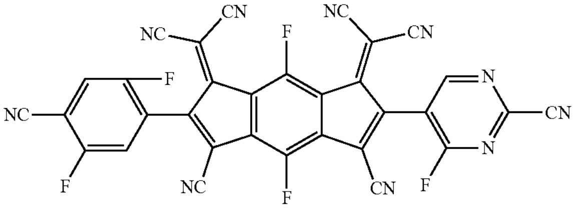
66
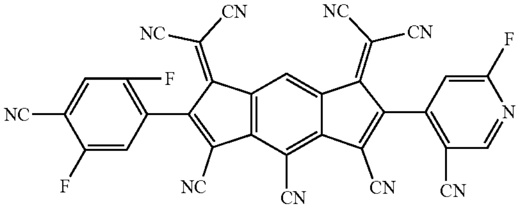
67
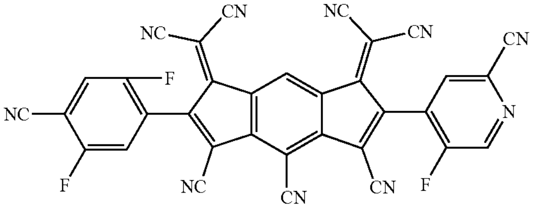
68
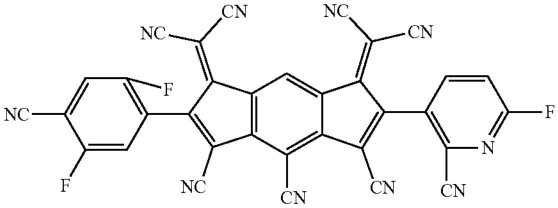
69
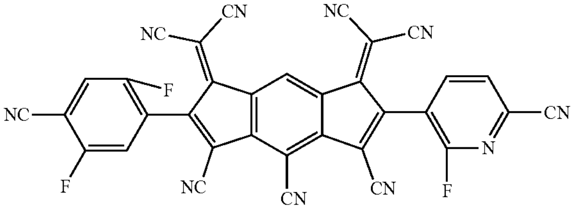
-continued
70
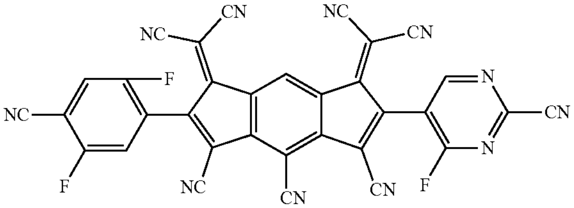
71
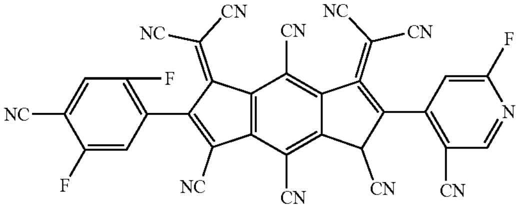
72
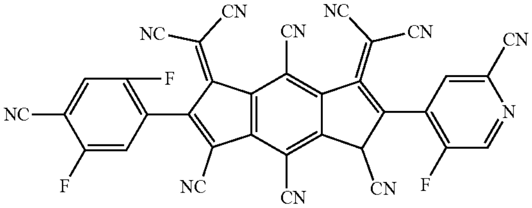
73
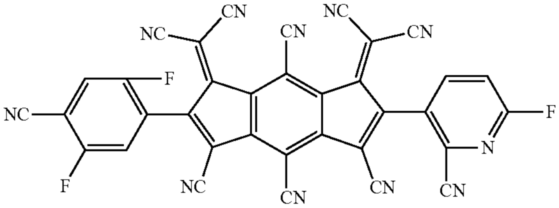
74
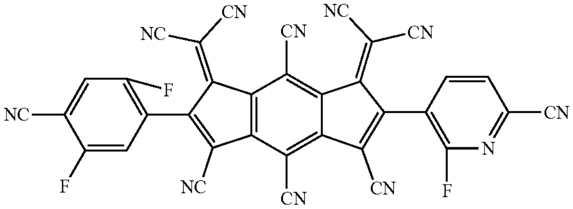
75
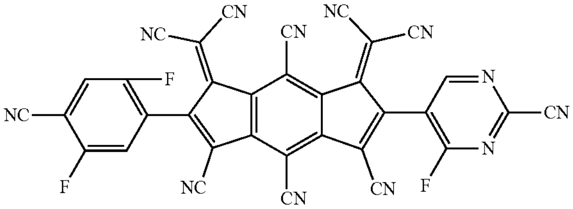

-continued
76
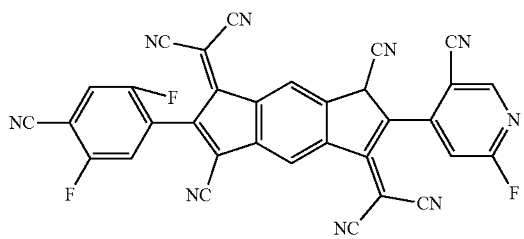
77
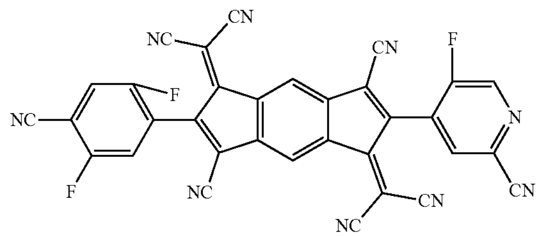
78
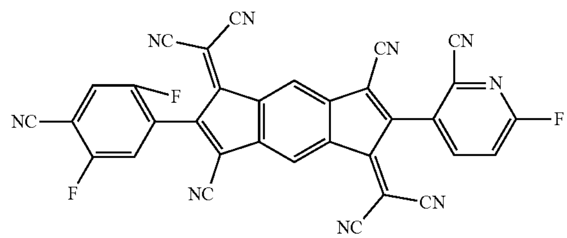
79
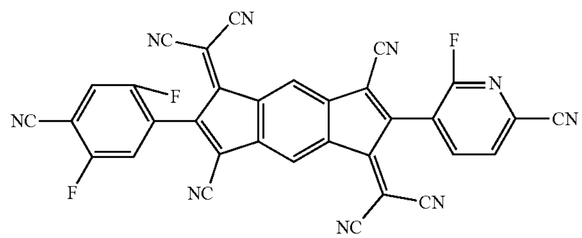
80
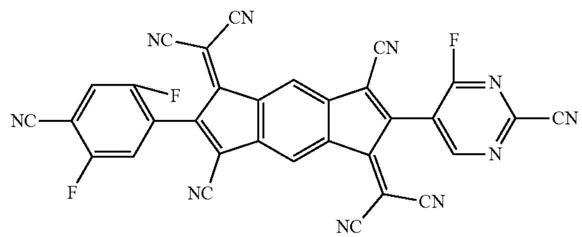
81
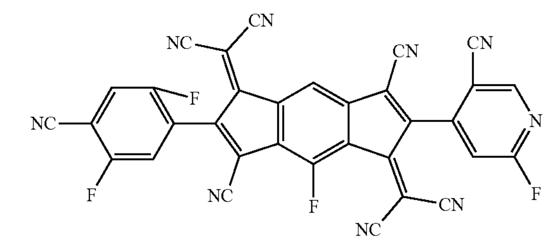
-continued
82
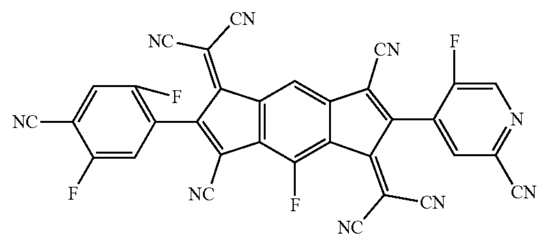
83
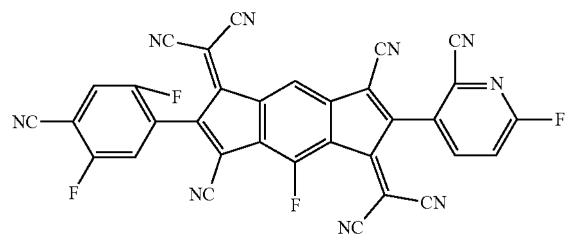
84
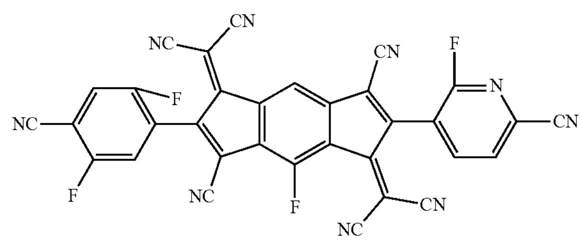
85
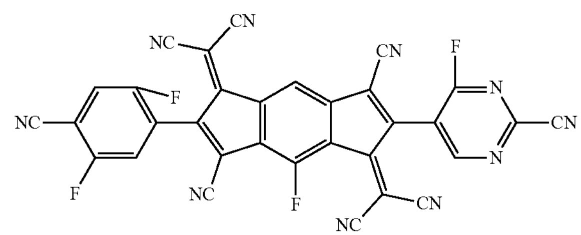
86
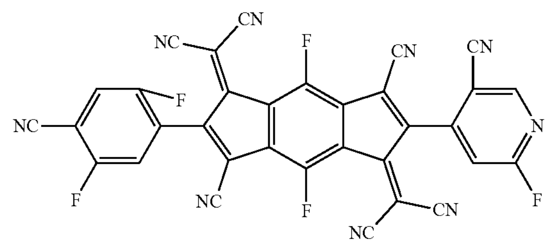
87
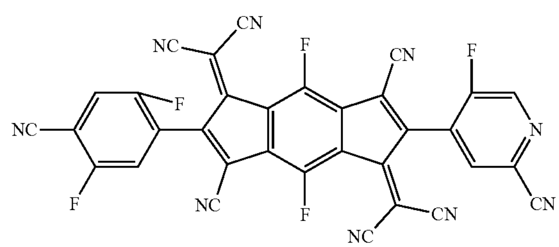

-continued
88
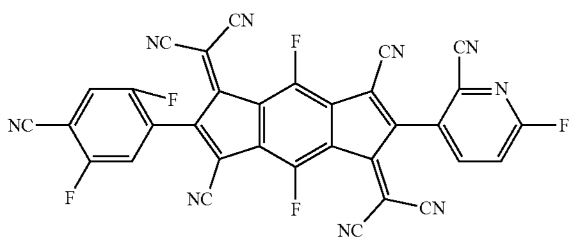
89
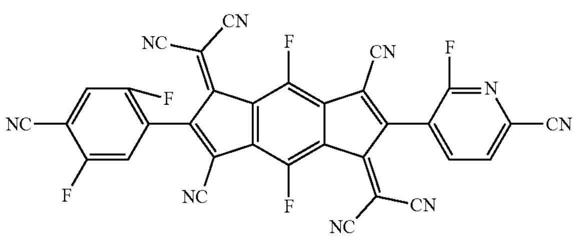
90
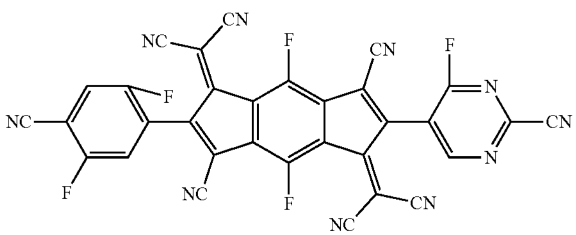
91
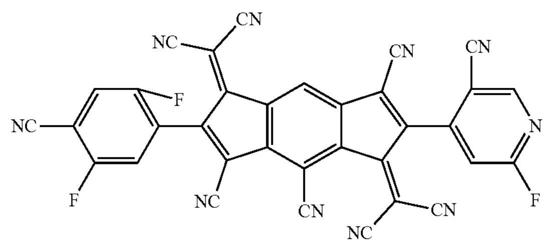
92
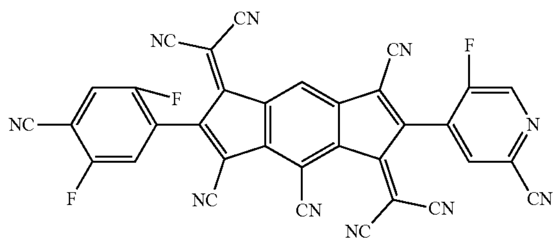
93
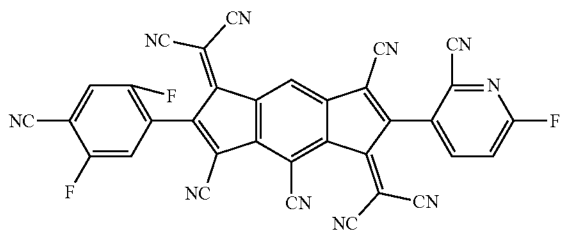
-continued
94
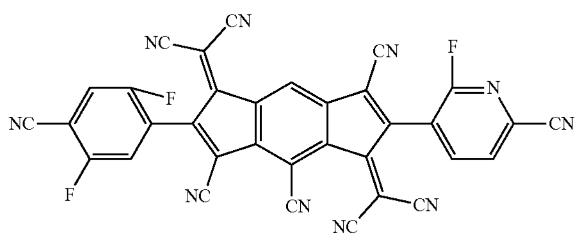
95
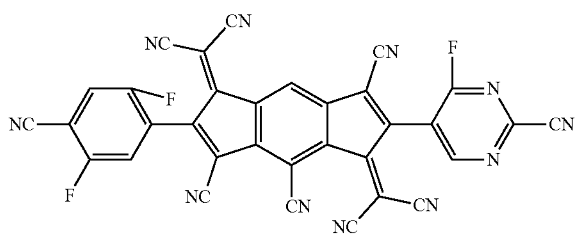
96
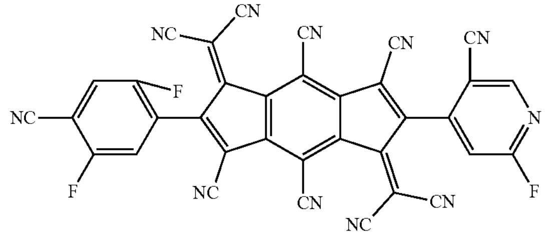
97
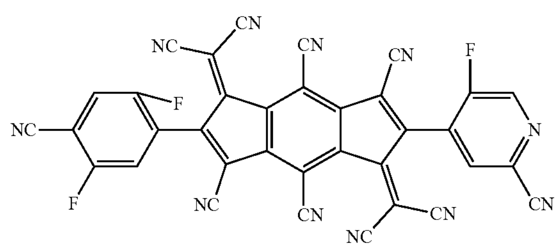
98
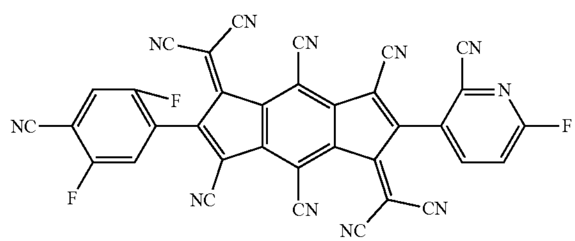
99
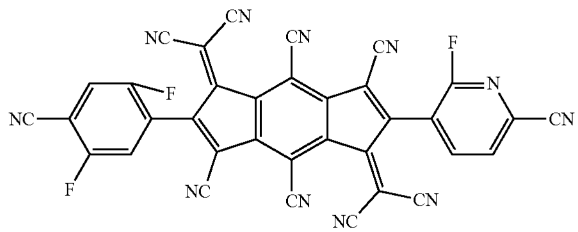

-continued
100
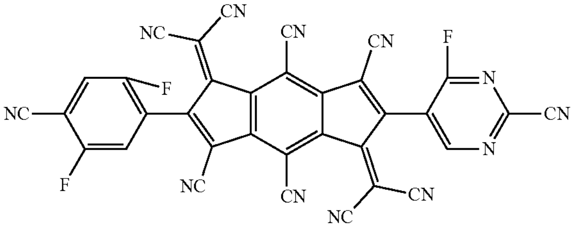
101
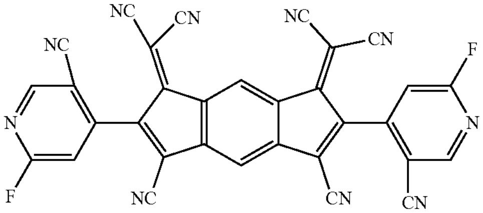
102
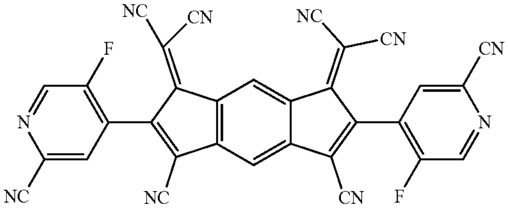
103
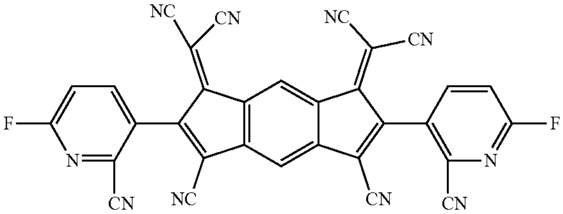
104
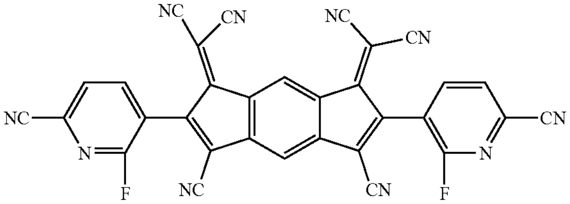
105
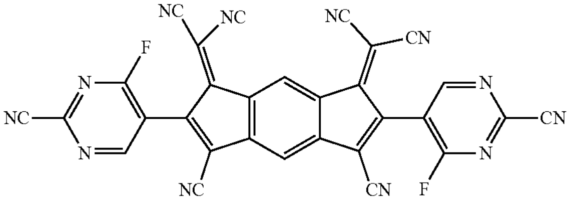
106
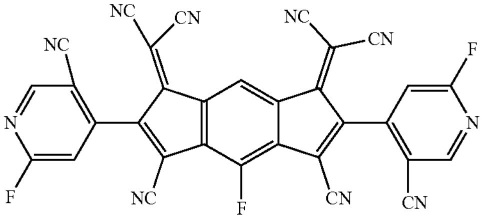
-continued
107
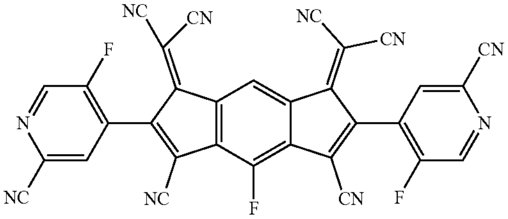
108
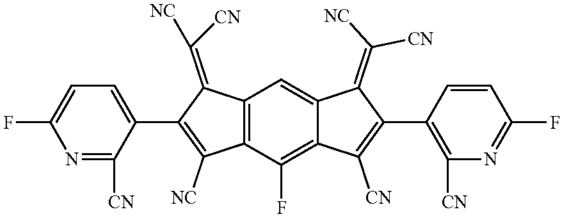
109
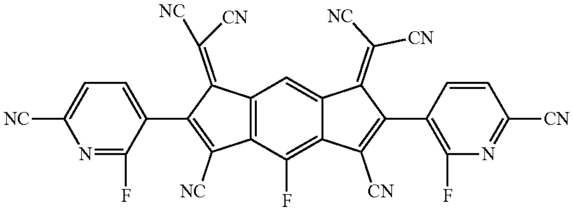
110
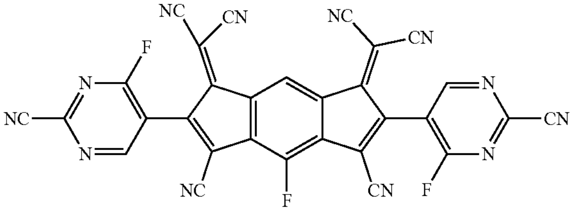
111
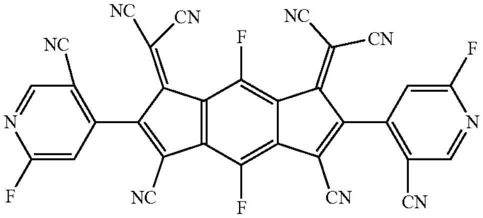
112
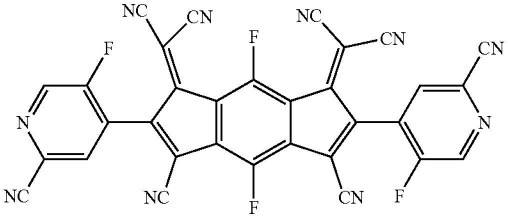

-continued
113
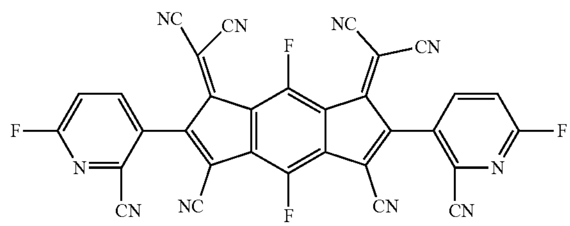
114
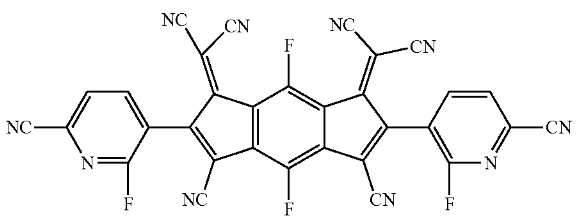
115
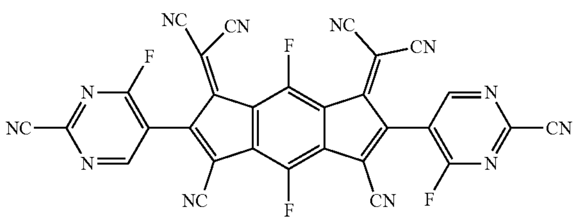
116
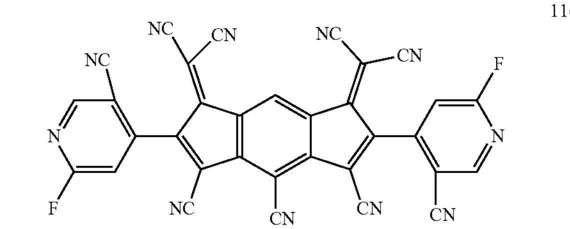
117
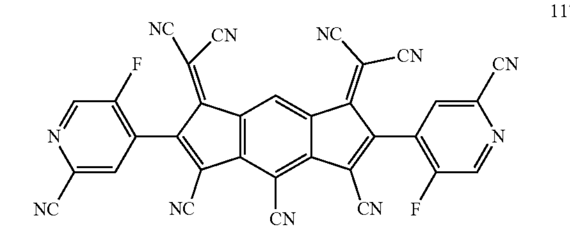
118
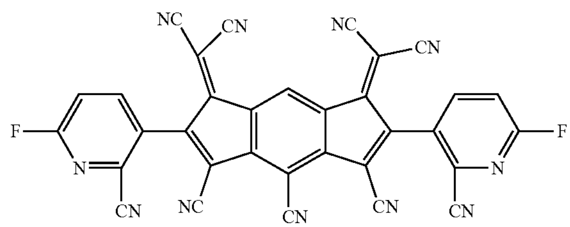
-continued
119
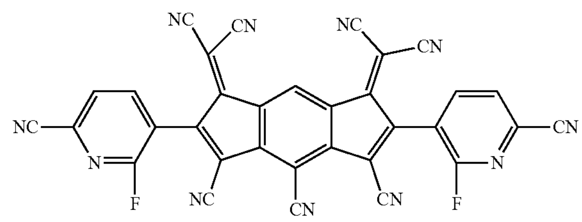
120
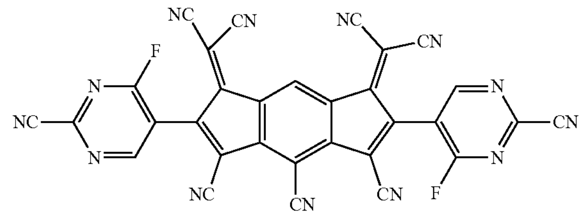
121
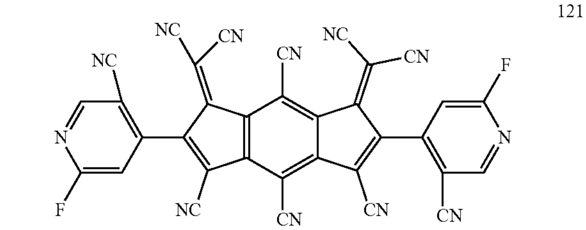
122
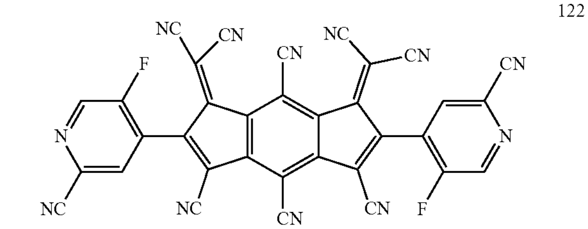
123
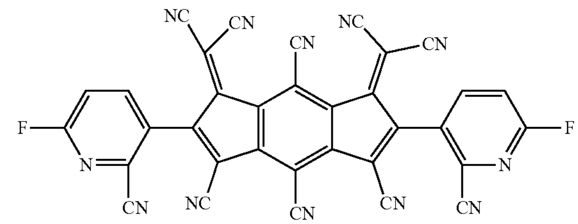
124
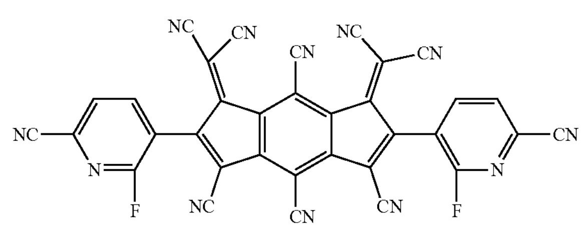

-continued
125
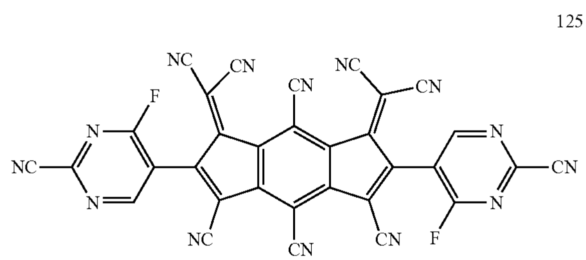
126
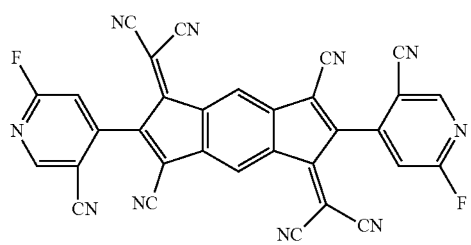
127
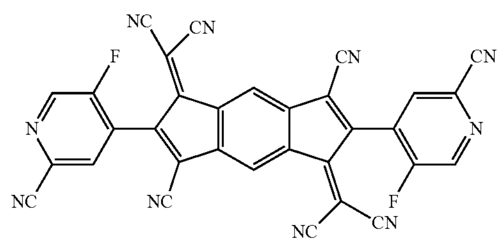
128
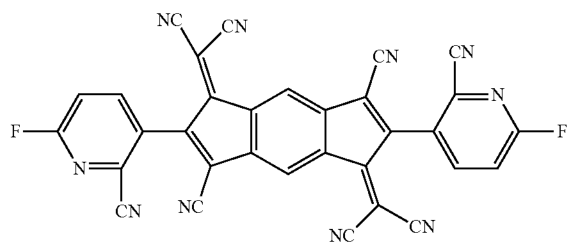
129
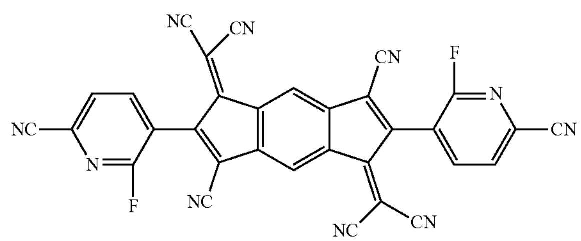
130
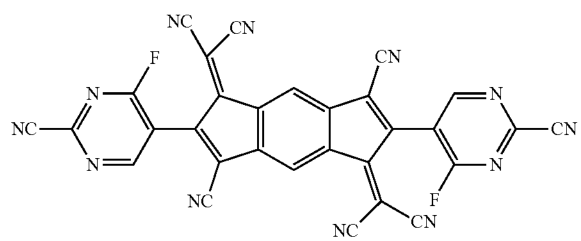
-continued
131
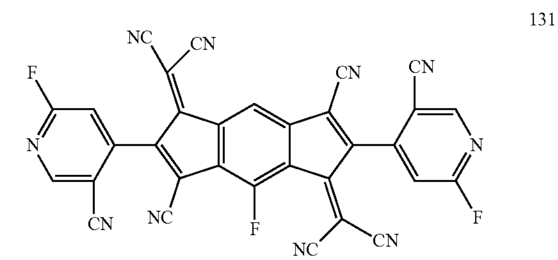
132
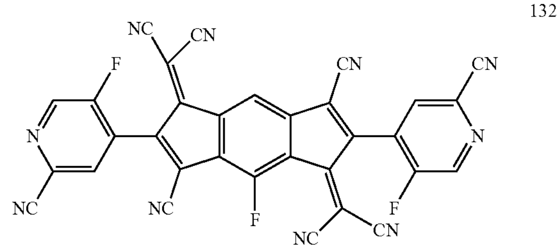
133
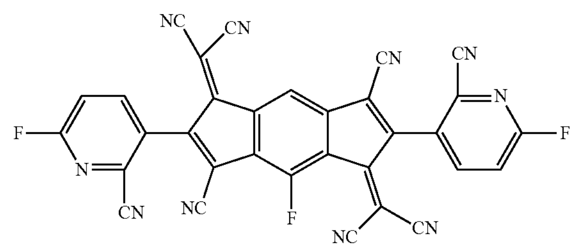
134
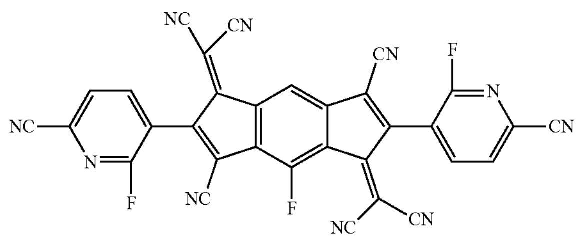
135
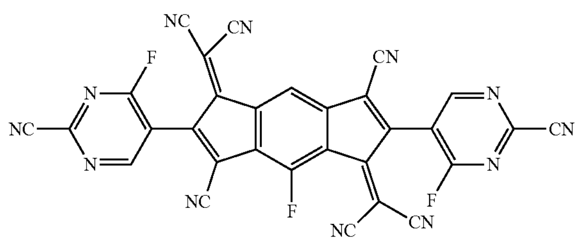
136
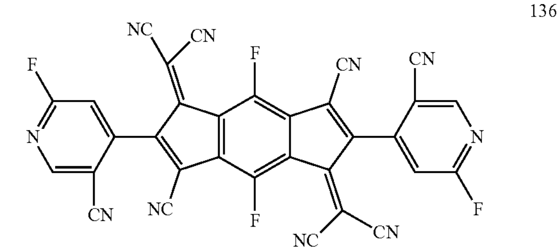

-continued
137
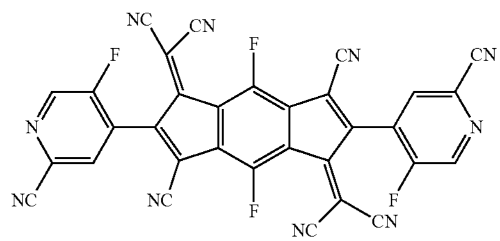
138
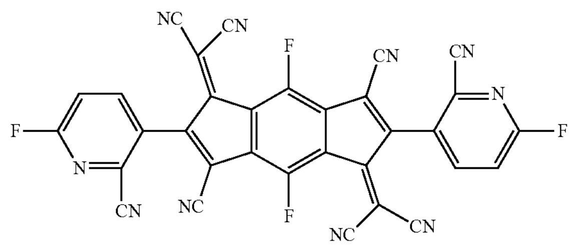
139
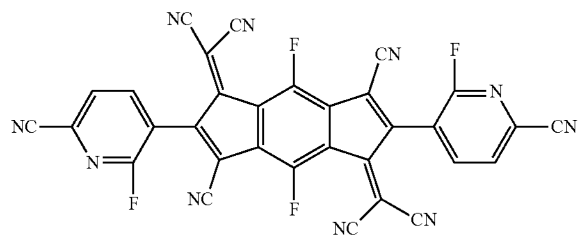
140
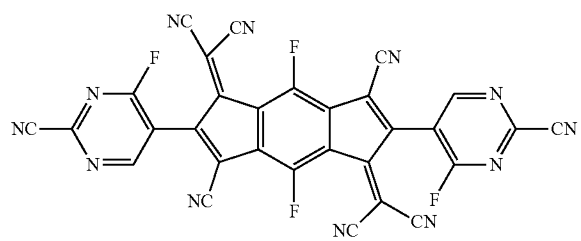
141
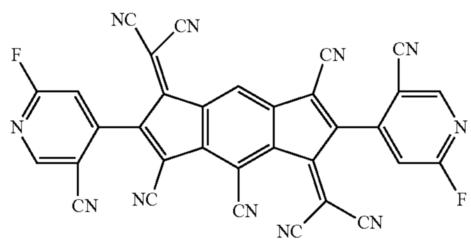
142
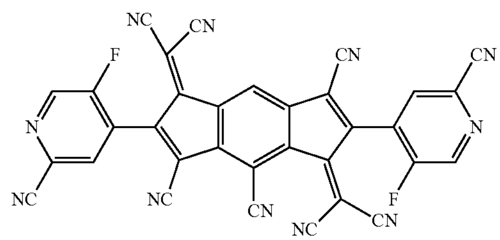
-continued
143
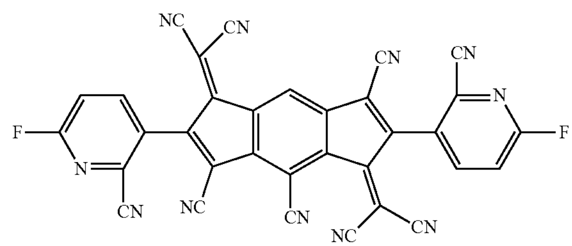
144
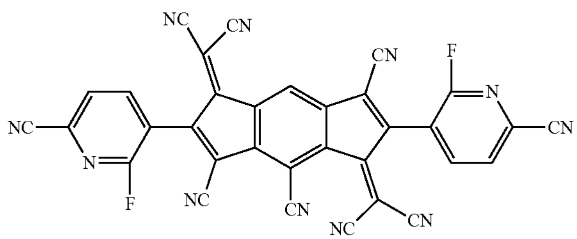
145
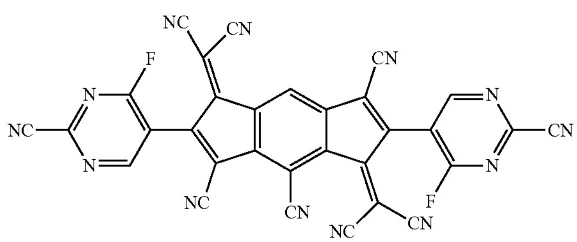
146
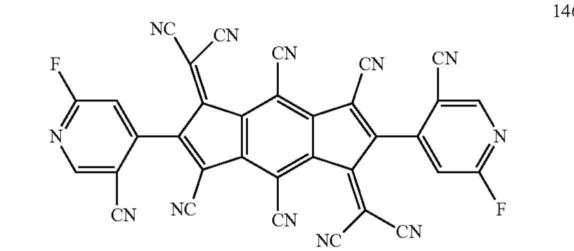
147
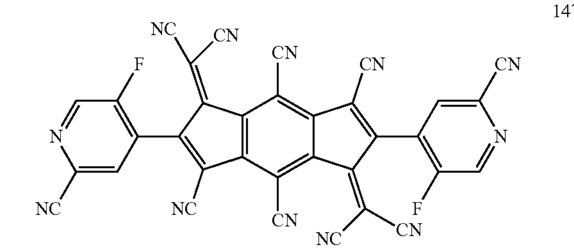
148
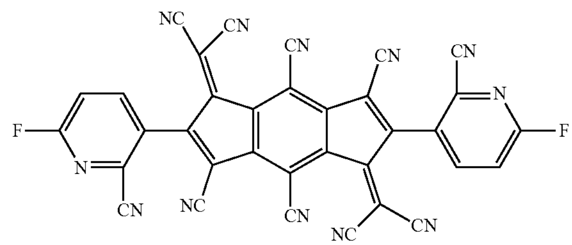

-continued

149

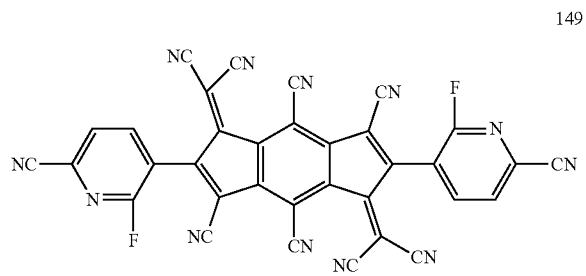

150

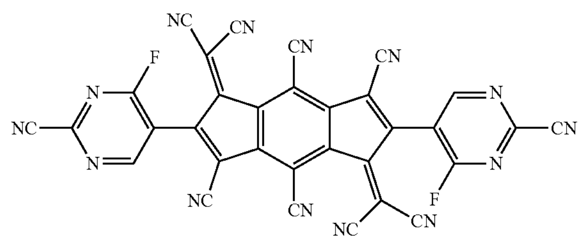

The second compounds 2302, 3402, 4402, 5602, 6602, 7802, 7902, 9102, 9202, and 9302 are represented by chemical formula 2 below.

[Chemical formula 2]

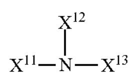

Hereinafter, chemical formula 2 is described.

$X^{11}$ to $X^{13}$ may be each independently selected from the group consisting of a $C_6$-$C_{60}$ aryl group, a fluorenyl group, a $C_2$-$C_{60}$ heterocyclic group including at least one heteroatom selected from the group consisting of O, N, S, Si and P, and a fused ring group of a $C_3$-$C_{60}$ aliphatic ring and a $C_6$-$C_{60}$ aromatic ring, or may be represented by one of the following chemical formula 2-1 to chemical formula 2-4.

In $X^{11}$ to $X^{13}$ of chemical formula 2, the aryl group, the fluorenyl group, the heterocyclic group, and the fused ring group may each be further substituted with at least one substituent selected from the group consisting of deuterium, a nitro group, a cyano group, a halogen group, an amino group, a $C_1$-$C_{20}$ alkoxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group including at least one heteroatom selected from the group consisting of O, N, S, Si and P, a $C_3$-$C_{60}$ alkylsilyl group, a $C_{18}$-$C_{60}$ arylsilyl group, and a $C_8$-$C_{60}$ alkylarylsilyl group.

[Chemical formula 2-1]

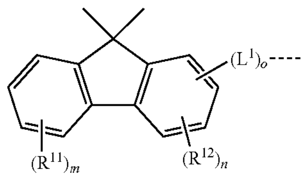

-continued

[Chemical formula 2-2]

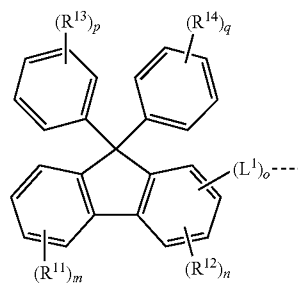

[Chemical formula 2-3]

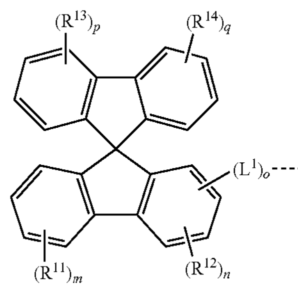

[Chemical formula 2-4]

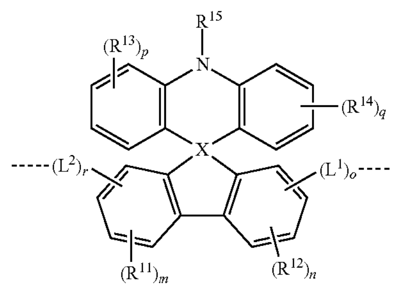

Hereinafter, chemical formula 2-1 to chemical formula 2-4 are described.

m, n, o and r may be each independently an integer of 0 to 4.

m+r may be an integer of 0 to 4, and n+o may be an integer of 0 to 4.

p and q may be each independently an integer of 0 to 5.

$R^{11}$ to $R^{15}$ may be each independently selected from the group consisting of a hydrogen, a deuterium, a tritium, a halogen, a cyano group, a nitro group, a $C_6$-$C_{60}$ aryl group, a fluorenyl group, a $C_2$-$C_{60}$ heterocyclic group including at least one heteroatom selected from the group consisting of O, N, S, Si and P, a fused ring group of a $C_3$-$C_{60}$ aliphatic ring and a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxy group, a $C_6$-$C_{30}$ aryloxy group, a $C_3$-$C_{60}$ alkylsilyl group, a $C_{18}$-$C_{60}$ arylsilyl group, and a $C_8$-$C_{60}$ alkylarylsilyl group.

When $R^{11}$ to $R^{15}$ are each an aryl group, $R^{11}$ to $R^{15}$ may be each independently a $C_6$-$C_{40}$ aryl group, a $C_6$-$C_{30}$ aryl group, or a $C_6$-$C_{12}$ aryl group.

When $R^{11}$ to $R^{15}$ are each an alkyl group, $R^{11}$ to $R^{15}$ may be each independently a $C_1$-$C_{30}$ alkyl group, a $C_1$-$C_{20}$ alkyl group, or a $C_1$-$C_{12}$ alkyl group.

$L^1$ and $L^2$ may be each independently selected from the group consisting of a single bond, a $C_6$-$C_{60}$ arylene group, a fluorenylene group, a $C_2$-$C_{60}$ divalent heterocyclic group including at least one heteroatom selected from the group consisting of O, N, S, Si and P, and a divalent fused ring group of a $C_3$-$C_{60}$ aliphatic ring and a $C_6$-$C_{50}$ aromatic ring.

In chemical formula 2-1 to chemical formula 2-4, a portion of a broken line connected to $L^1$ or $L^2$ represents a position where $X^{11}$ to $X^{13}$ may be bonded to N in chemical formula 2, or a position where the hydrogen may be bonded. For example, in chemical formula 2-1 to chemical formula 2-3, the portion of the broken line connected to $L^1$ may be a position to be bonded to N of chemical formula 2. In the case of chemical formula 2-4, any one of the broken lines can be bonded to N of chemical formula 2, and the other one of the broken lines can be bonded to the hydrogen.

In $R^{11}$ to $R^{15}$, $L^1$ and $L^2$ of chemical formula 2-1 to chemical formula 2-4, the aryl group, the fluorenyl group, the heterocyclic group, the fused ring group, the alkyl group, the alkenyl group, the alkynyl group, the alkoxy group, the aryloxy group, the alkylsilyl group, the arylsilyl group, the alkylarylsilyl group, the arylene group, the fluorenylene group, the divalent fused ring group, and the divalent fused ring group may each be further substituted with one or more substituents selected from the group consisting of a deuterium, a nitro group, a cyano group, a halogen group, an amino group, a $C_1$-$C_{20}$ alkoxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group including at least one heteroatom selected from the group consisting of O, N, S, Si and P, a $C_3$-$C_{60}$ alkylsilyl group, a $C_{18}$-$C_{60}$ arylsilyl group, and a $C_8$-$C_{60}$ alkylarylsilyl group.

The second compounds 2302, 3402, 4402, 5602, 6602, 7802, 7902, 9102, 9202, and 9302 represented by chemical formula 2 may be one or more of the compounds described below.

H1

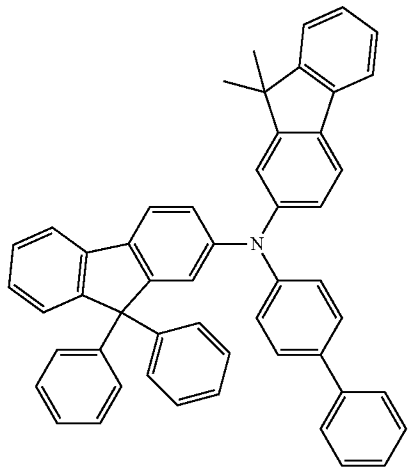

-continued

H2

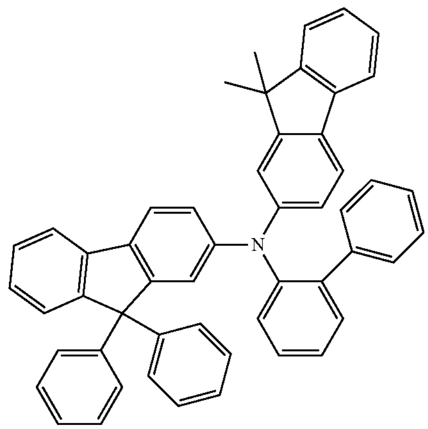

H3

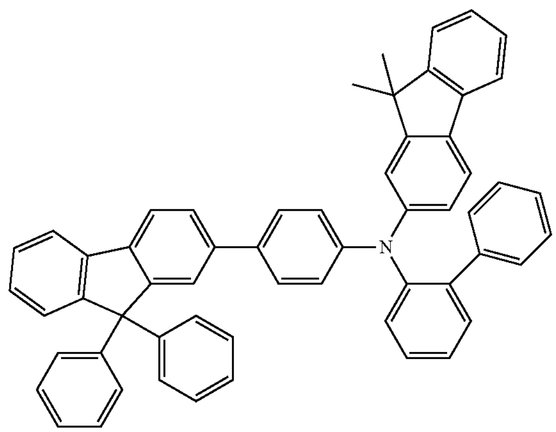

H4

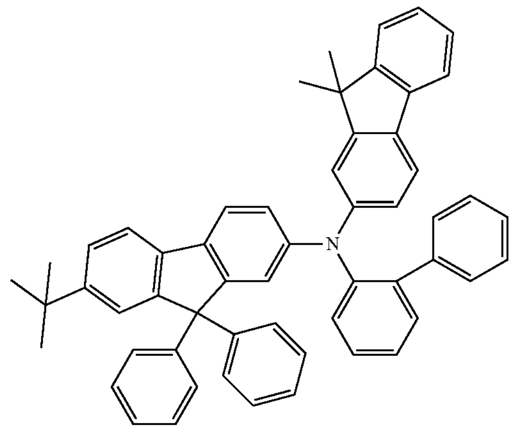

-continued
H5
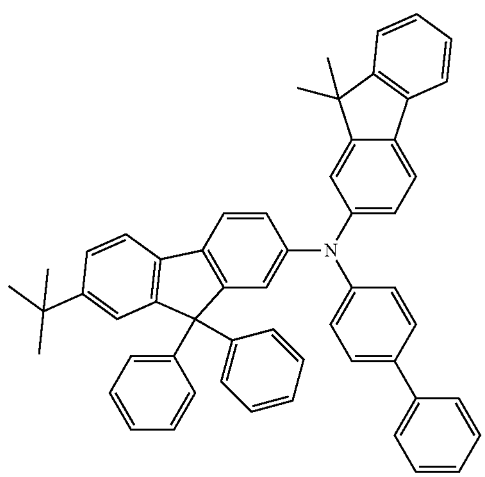
H6
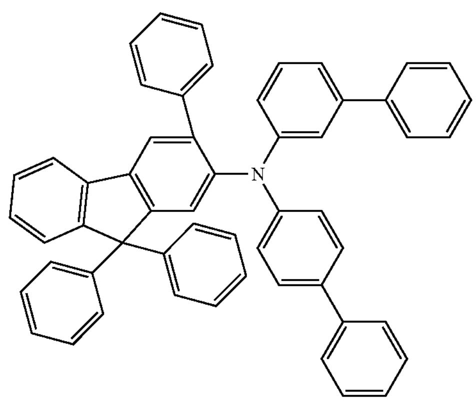
H7
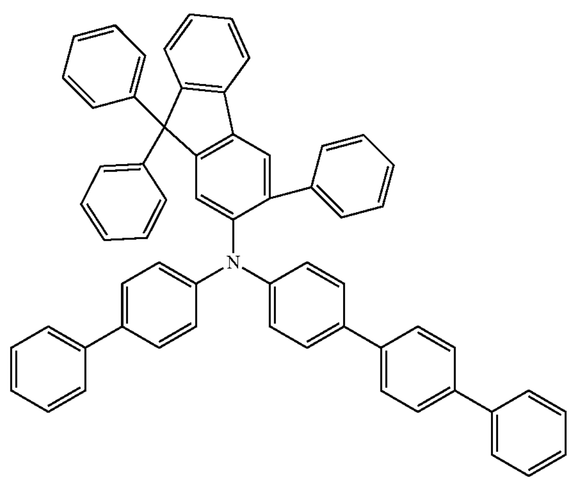
-continued
H8
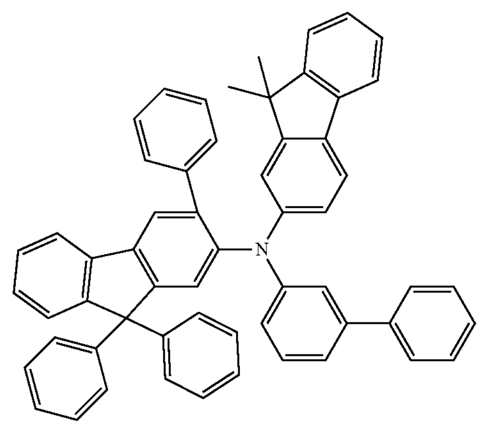
H9
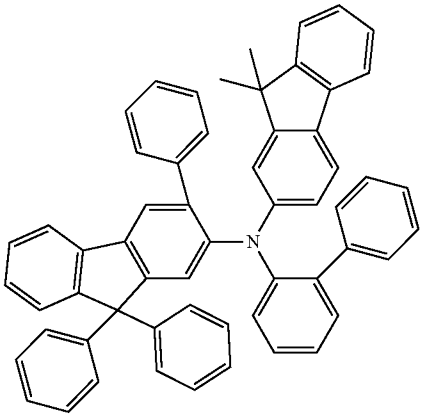
H10
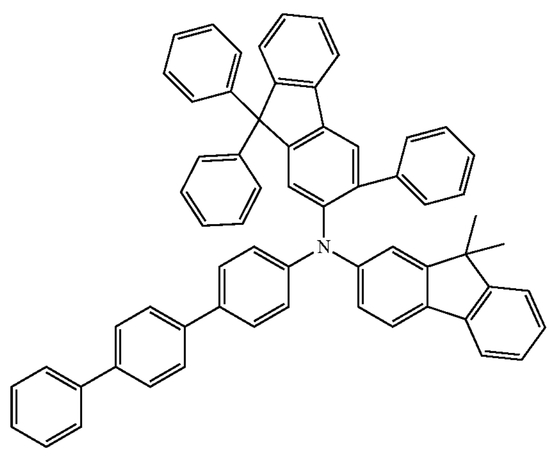

-continued
H11
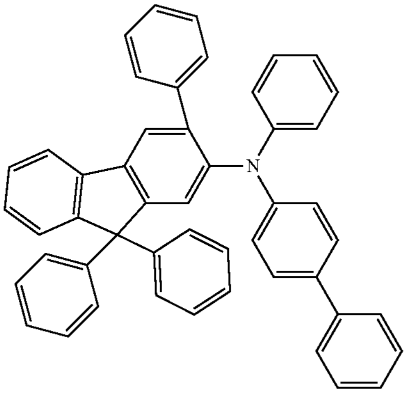
H12
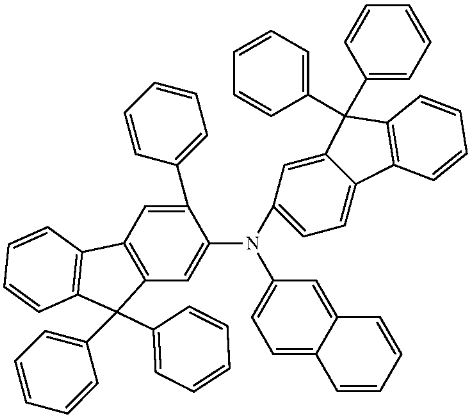
H13
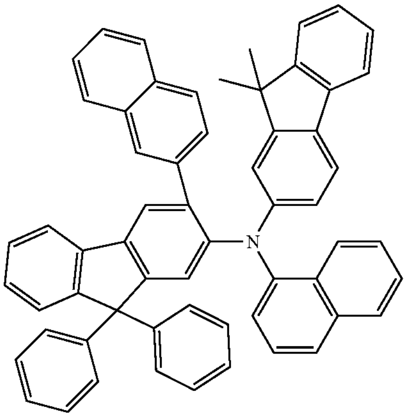
H14
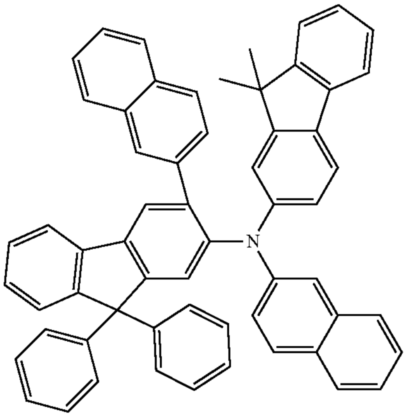
-continued
H15
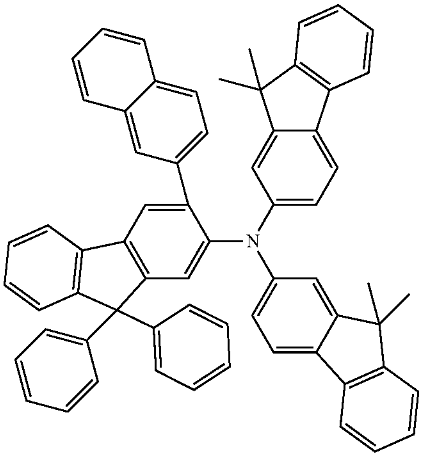
H16
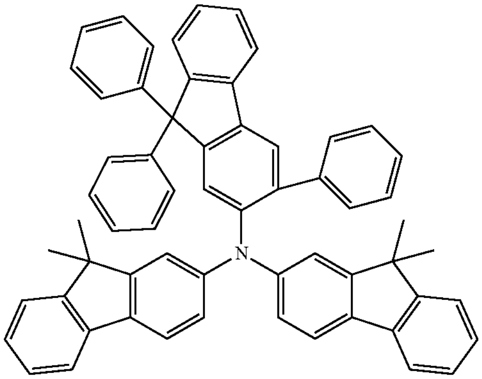
H17
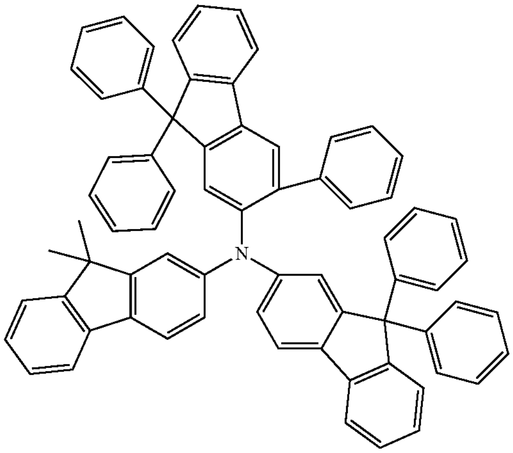

-continued
H18
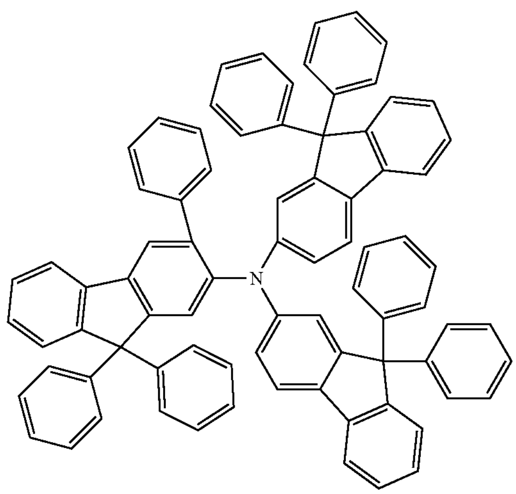
H19
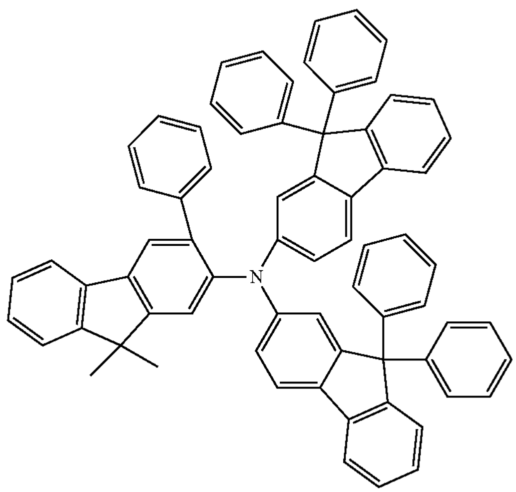
H20
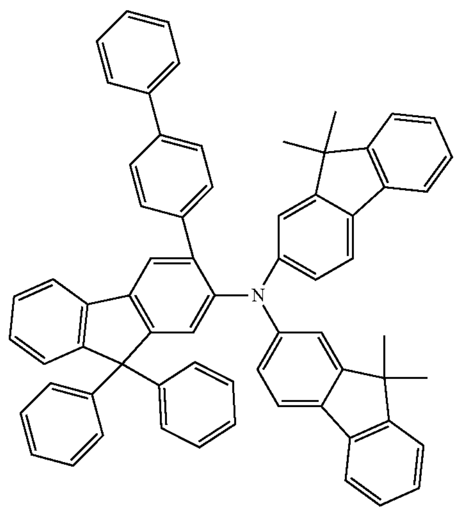
-continued
H21
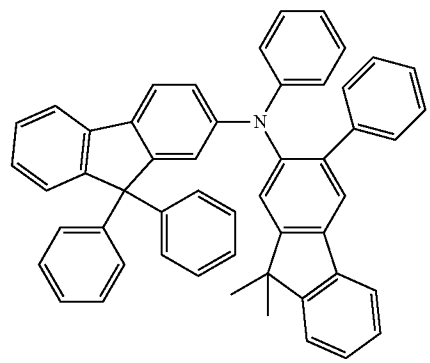
H22
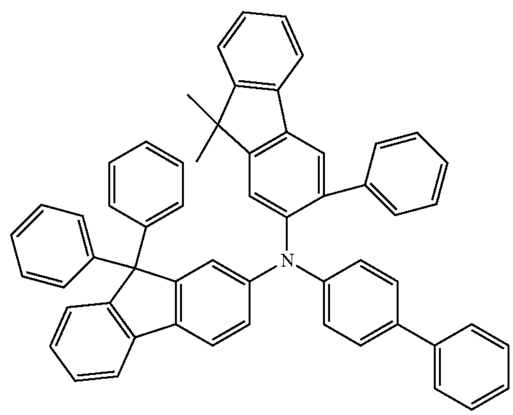
H23
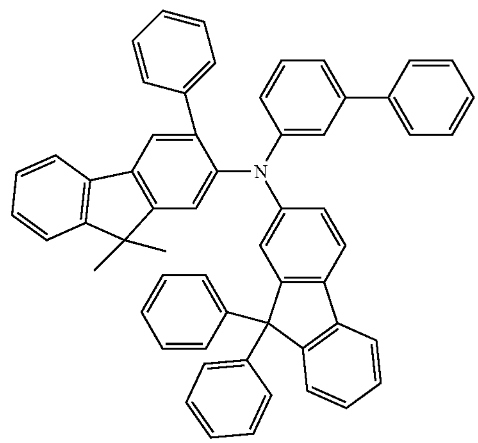
H24
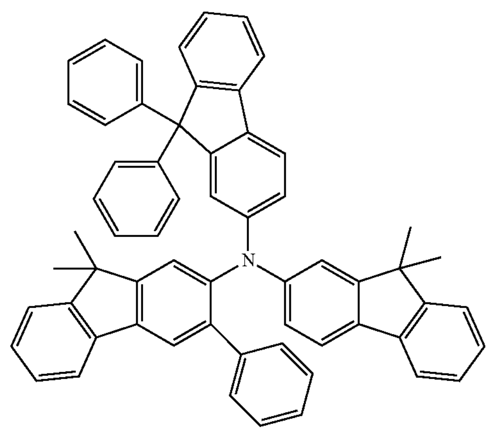

-continued
H25
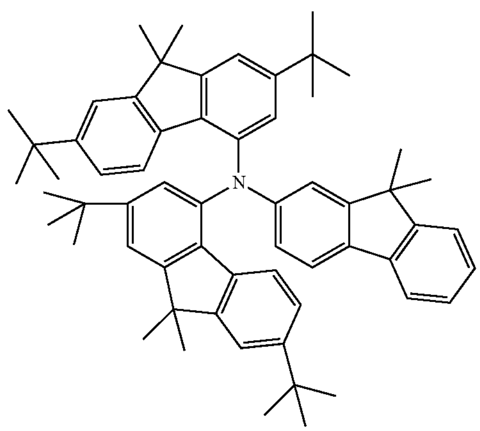
H26
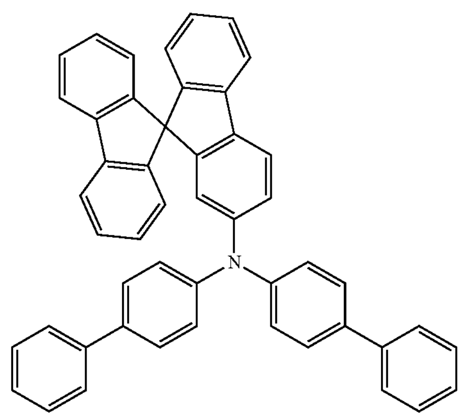
H27
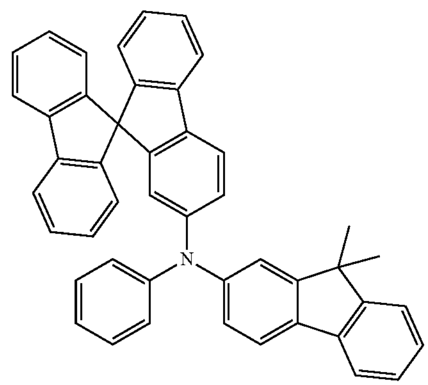
-continued
H28
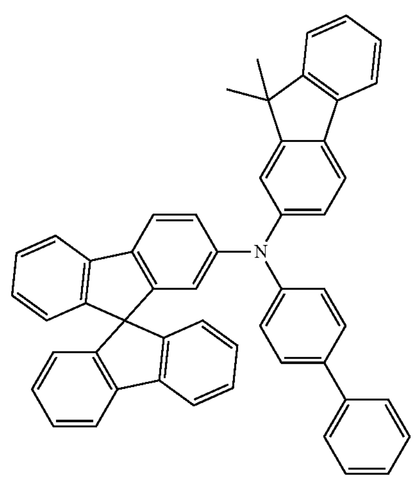
H29
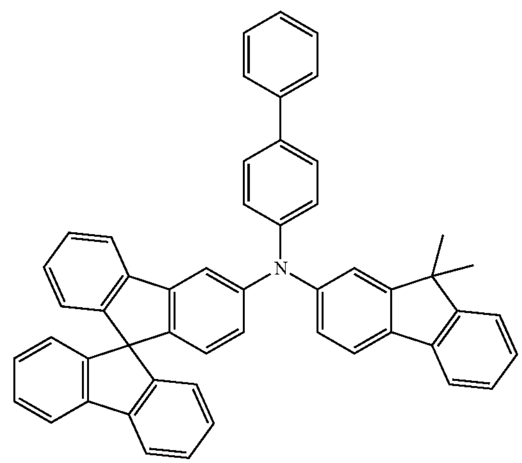
H30
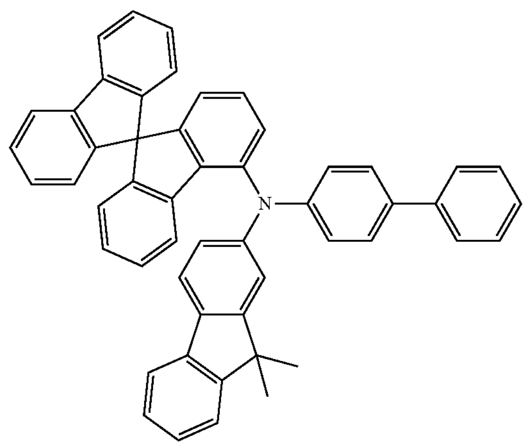

-continued
H31
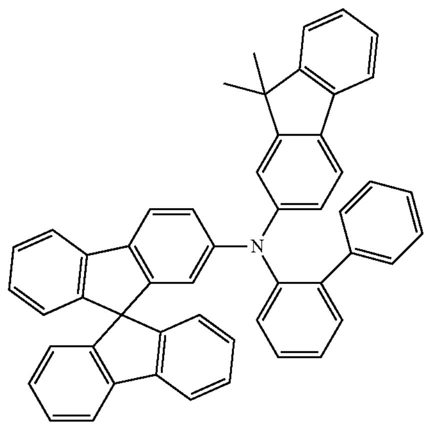
H32
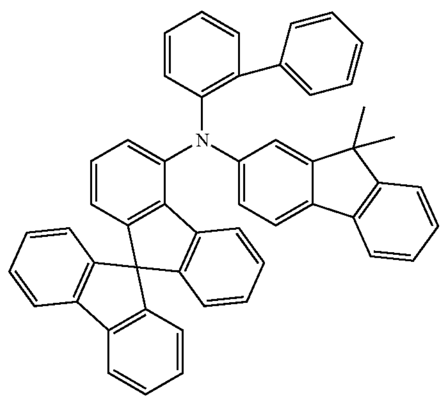
H33
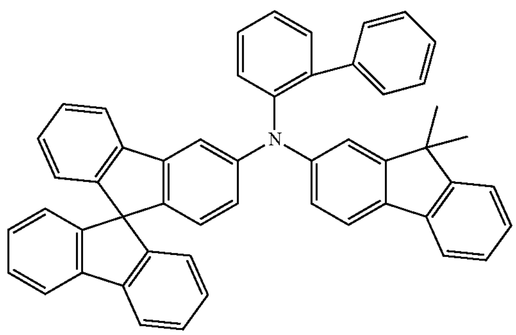
H34
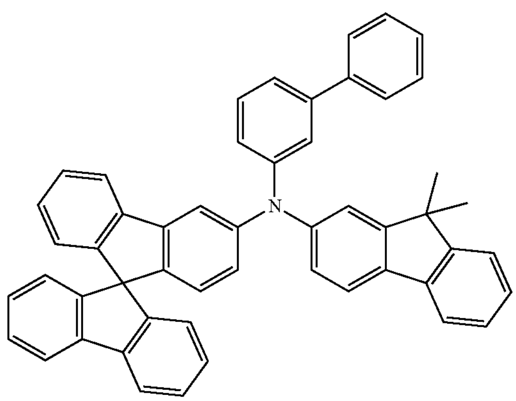
-continued
H35
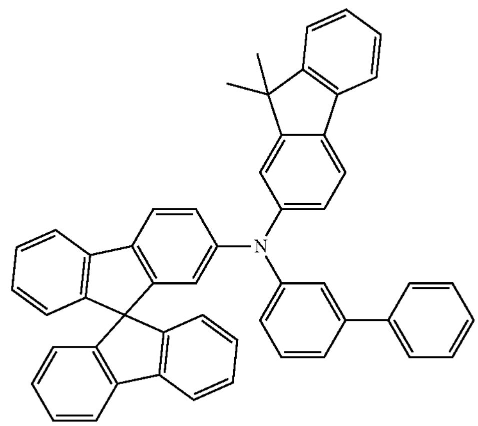
H36
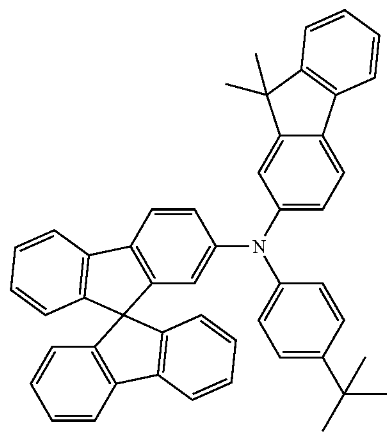
H37
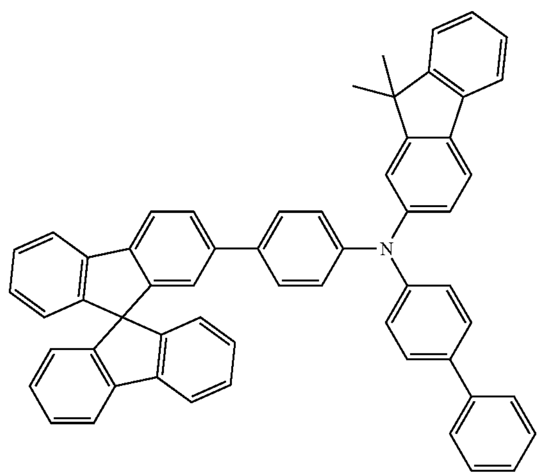

-continued
H38
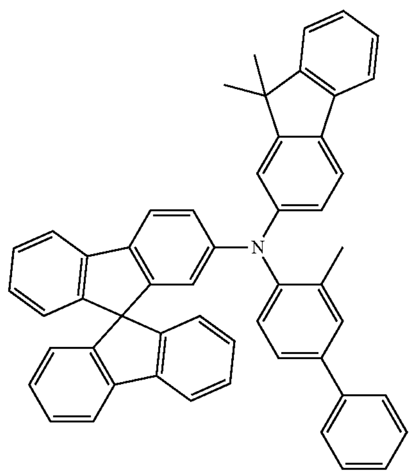
H39
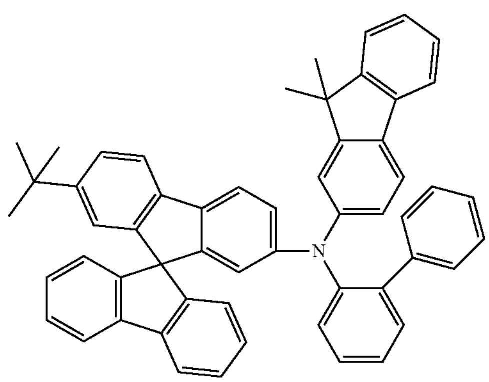
H40
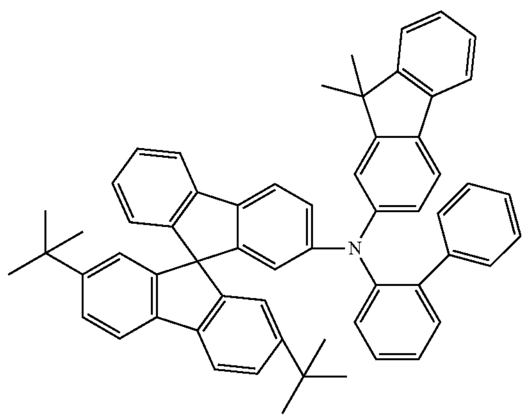
-continued
H41
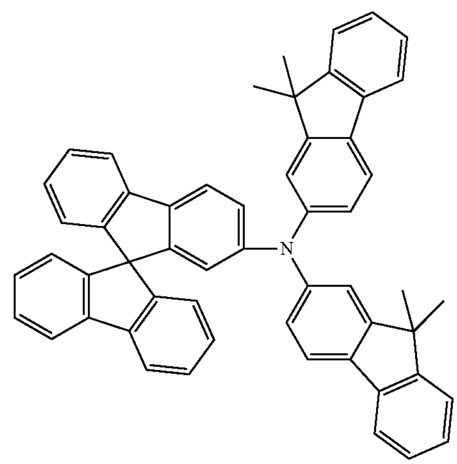
H42
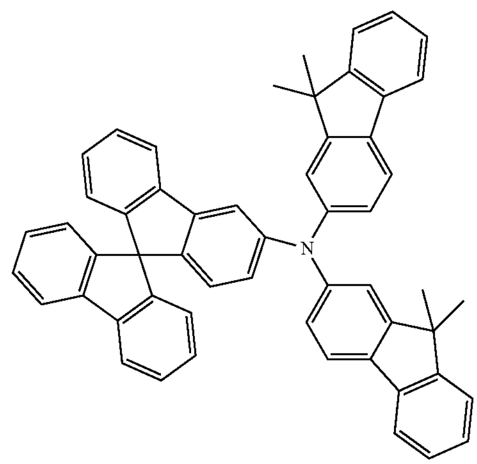
H43
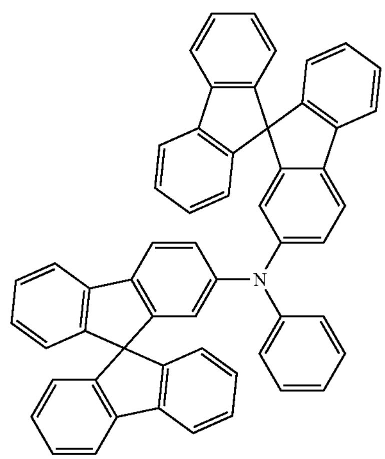

H44
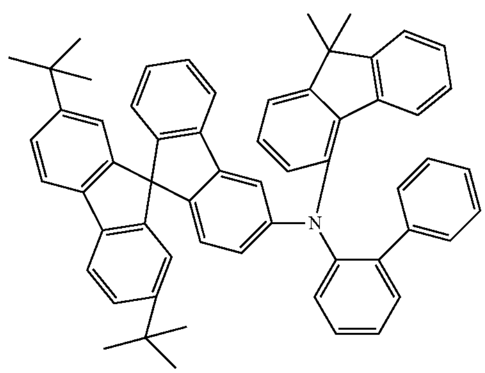
H45
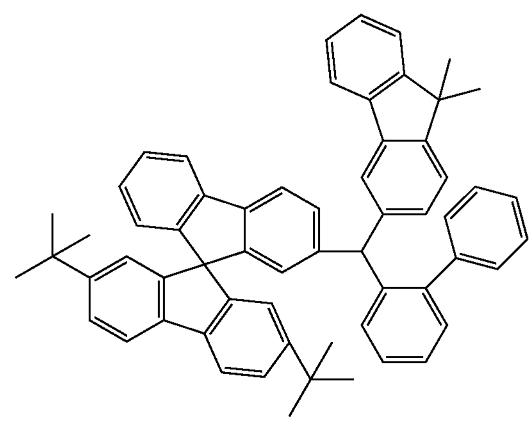
H46
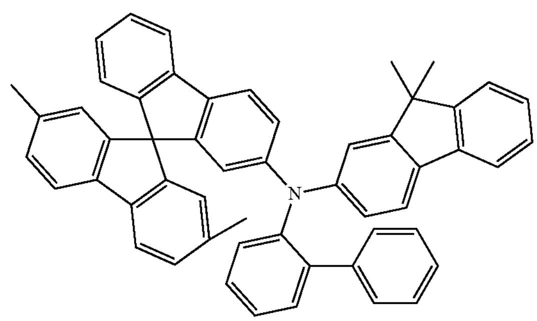
H47
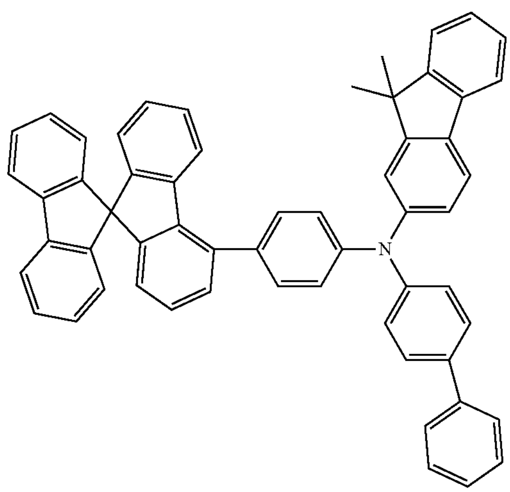
H48
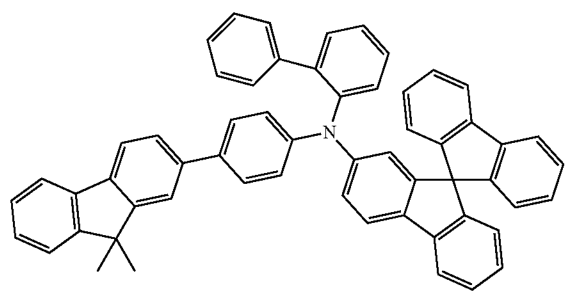
H49
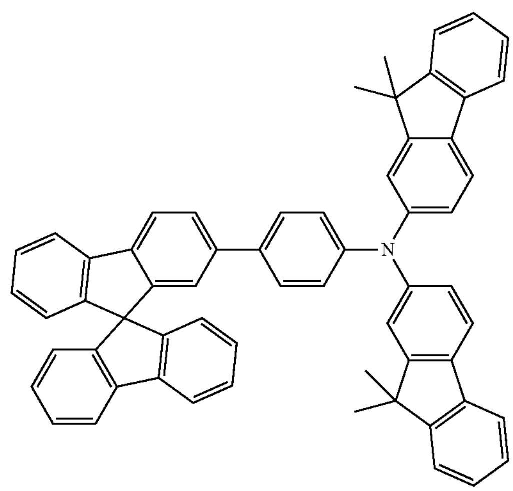
H50
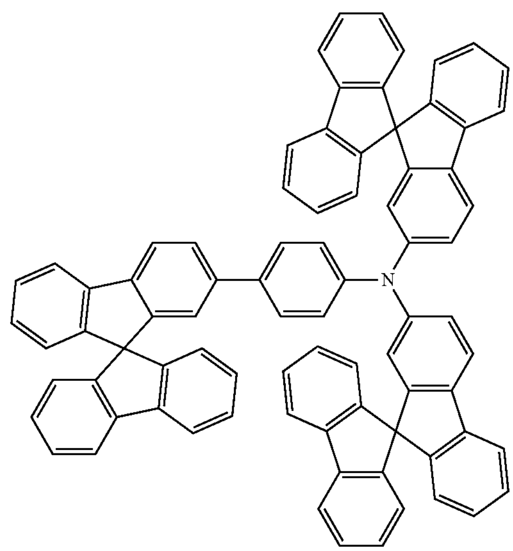

-continued

H51

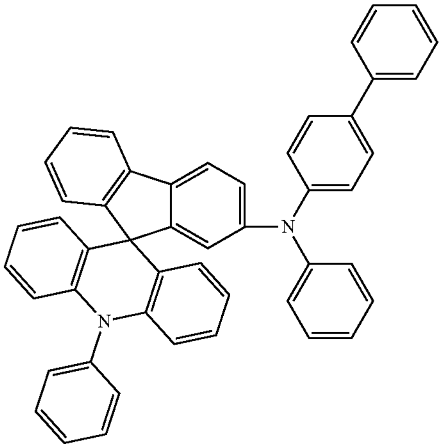

H52

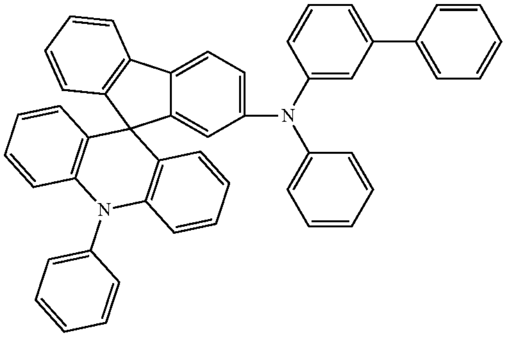

H53

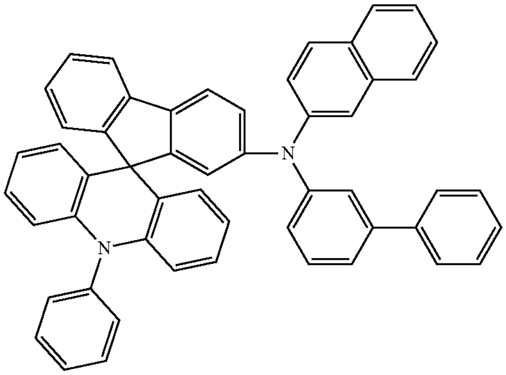

H54

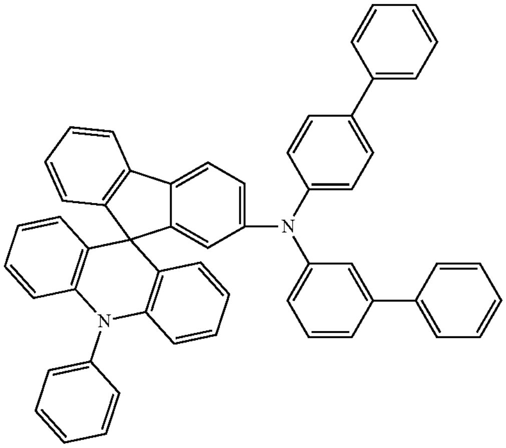

-continued

H55

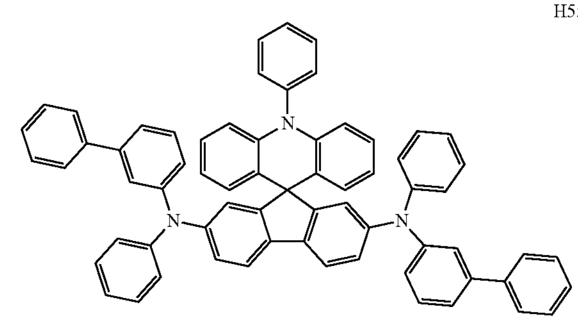 [SMILES: c1ccc(-c2cccc(N(c3ccccc3)c3ccc4c(c3)C3(c5cc(N(c6ccccc6)c6cccc(-c7ccccc7)c6)ccc5-4)c4ccccc4N(c4ccccc4)c4ccccc43)c2)cc1]

Other example embodiments of the present disclosure may provide a display panel. The display panel may include the organic light emitting elements 200, 300, 400, 500, 600, 700, and 800. The display panel may include a subpixel including the organic light emitting elements 200, 300, 400, 500, 600, 700, and 800.

Other example embodiments of the present disclosure may provide a display device 100. The display device 100 may include the organic light emitting elements 200, 300, 400, 500, 600, 700, and 800. The display device 100 may include a display panel including the organic light emitting elements 200, 300, 400, 500, 600, 700, and 800. The display device 100 may include a driving circuit.

Hereinafter, examples of manufacturing an organic light emitting element according to example embodiments of the present disclosure are described below in detail with reference to example embodiments thereof, but embodiments of the present disclosure are not limited to the following embodiments.

COMPOUND SYNTHESIS EXAMPLES

Examples for synthesizing the first compounds and the second compounds according to example embodiments of the present disclosure will be described in detail with reference to examples, but the present disclosure is not limited to the following examples.

1. Synthesis Example of Compound 1

(1) Synthesis Example of Compound 1-A

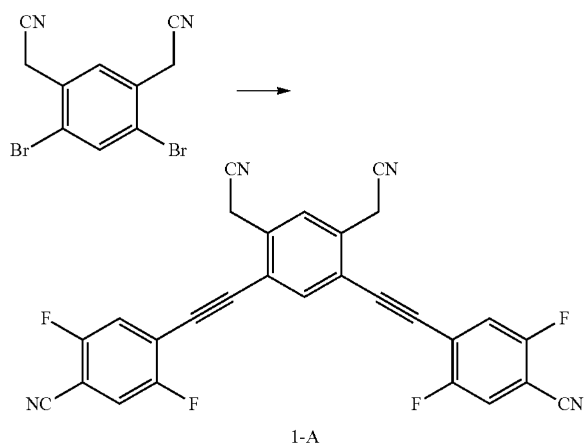

1-A 78.5 g (250.0 mmol) of 2,2'-(4,6-dibromo-1,3-phenylene) diacetonitrile, 1.2 L of toluene, 20.0 mmol of copper iodide, 20.0 mmol of tetrakistriphenylphosphine palladium, 1250.0 mmol of diisopropylamine, and 625.0 mmol of 4-ethynyl-2,5-difluorobenzonitrile were mixed, heated to 100° C., and stirred for 2 hours. After the reaction, 1.0 L of the solvent was distilled, and the reaction solution returned to room temperature was filtered to obtain a solid. After dissolving the solid in chloroform and extracting with water, magnesium sulfate and acid clay were added and stirred for one hour. After filtering the stirred solution, the solvent was distilled off again, and recrystallization was performed twice with tetrahydrofuran/ethanol to obtain 26.3 g of compound 1-A (yield 22%, MS[M+H]=479).

(2) Synthesis Example of Compound 1-B

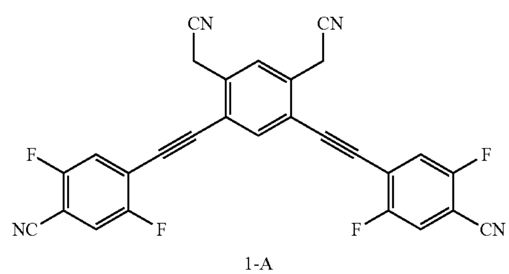

1-A

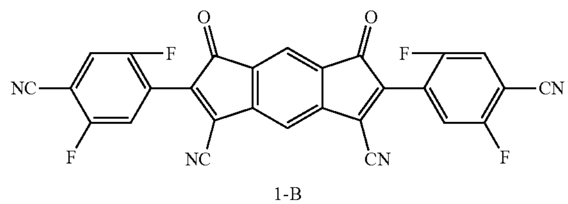

1-B 26.3 g (55.0 mmol) of 1-A, 550.0 mL of 1,4-dioxane, 330.0 mmol of diphenyl sulfoxide, 11.0 mmol of copper bromide (II), and 11.0 mmol of palladium acetate were mixed, heated to 100° C., and stirred for 5 hours. After the reaction, the solvent was distilled off, dissolved in chloroform, acid clay was added, and stirred for one hour. After filtering the stirred solution, the solvent was distilled off again and reverse-precipitation was performed using hexane to obtain a solid. The obtained solid was recrystallized with tetrahydrofuran/hexane and filtered to obtain 3.9 g of compound 1-B (yield 14%, MS[M+H]=507).

(3) Synthesis Example of Compound 1

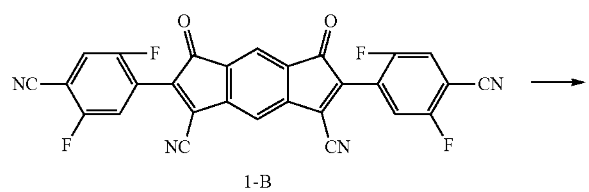

1-B

-continued

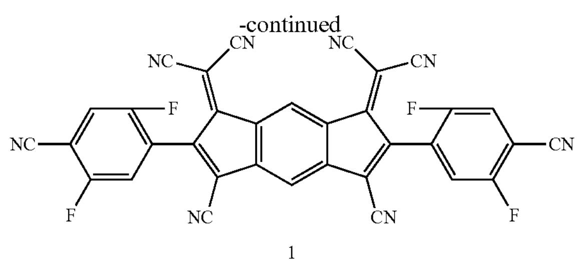

1

3.9 g (7.7 mmol) of 1-B, 154.0 mL of dichloromethane, and 46.2 mmol of malononitrile were added and cooled to 0° C. After slowly adding 38.5 mmol of titanium chloride (IV), it was stirred for 1 hour while remaining at 0° C. 57.8 mmol of pyridine was dissolved in 48.0 mL of dichloromethane, and then added slowly at 0° C., and then it was stirred for one hour while maintaining the temperature. After the reaction was complete, 77.0 mmol of acetic acid was added and stirred for an additional 30 minutes. After the reaction solution was extracted with water, the organic layer was reverse-precipitated in hexane to obtain a solid. The obtained solid was extracted with acetonitrile and filtered to obtain a filtrate. After adding magnesium sulfate and acid clay to the obtained filtrate, the solution obtained was stirred for 30 minutes. After filtering the solution, it was recrystallized with acetonitrile/toluene and washed with toluene. The obtained solid was recrystallized again using acetonitrile/tert-butylmethylether and purified by sublimation, obtaining 0.8 g of compound 1 (yield 18%, MS[M+H]=603).

2. Synthesis Example of Compound 26

(1) Synthesis Example of Compound 26-A

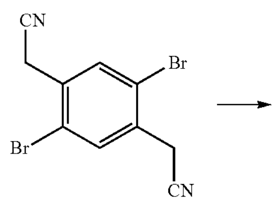

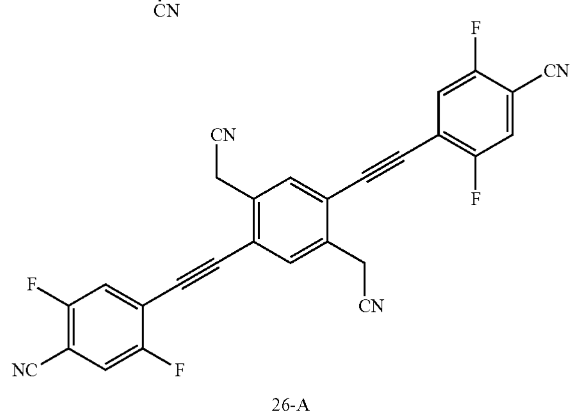

26-A 78.5 g (250.0 mmol) of 2,5-dibromobenzene-1,4-diacetonitrile, 900.0 ml of toluene, 20.0 mmol of copper iodide, 20.0 mmol of tetrakistriphenylphosphine palladium, 1250.0 mmol of diisopropylamine, and 625.0 mmol of 4-ethynyl-2,5-difluorobenzonitrile were mixed, heated to 100° C., and stirred for 2 hours. After the reaction, 800.0 mL of the solvent was distilled, and the reaction solution returned to room temperature was filtered to obtain a solid. After dissolving the solid in chloroform and extracting with water, magnesium sulfate and acid clay were added and stirred for one hour. After filtering the stirred solution, the solvent was distilled off again, and recrystallization was performed twice with tetrahydrofuran/ethanol to obtain 16.8 g of compound 26-A (yield 14%, MS[M+H]=479).

(2) Synthesis Example of Compound 26-B

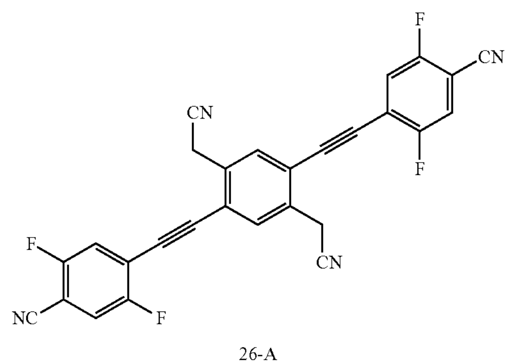

26-A

26-A

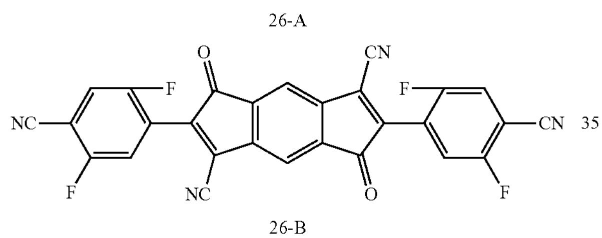

26-B 16.8 g (35.0 mmol) of 26-A, 220.0 mL of 1,4-dioxane, 210.0 mmol of diphenyl sulfoxide, 7.0 mmol of copper bromide (II), and 7.0 mmol of palladium acetate were mixed, heated to 100° C., and stirred for 5 hours. After the reaction, the solvent was distilled off, dissolved in chloroform, acid clay was added, and stirred for one hour. After filtering the stirred solution, the solvent was distilled off again and reverse-precipitation was performed using hexane to obtain a solid. The obtained solid was recrystallized with tetrahydrofuran/hexane and filtered to obtain 4.1 g of compound 26-B (yield 23%, MS[M+H]=507).

(3) Synthesis Example of Compound 26

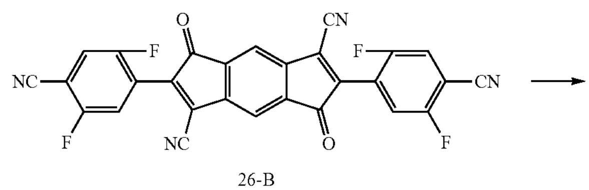

26-B

-continued

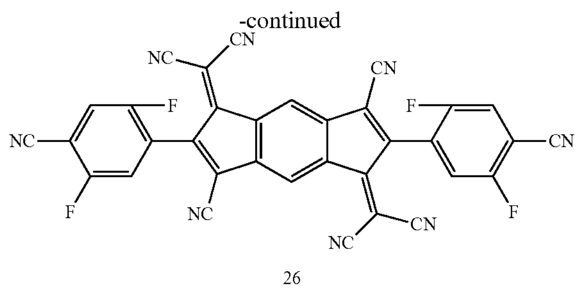

26

4.1 g (8.5 mmol) of 26-B, 130.0 mL of dichloromethane, and 59.5 mmol of malononitrile were added and cooled to 0° C. After slowly adding 42.5 mmol of titanium chloride (IV), it was stirred for 1 hour while remaining at 0° C. 59.5 mmol of pyridine was dissolved in 41.0 mL of dichloromethane, and then added slowly at 0° C., and then it was stirred for one hour while maintaining the temperature. After the reaction was complete, 42.5 mmol of acetic acid was added and stirred for an additional 30 minutes. After the reaction solution was extracted with water, the organic layer was reverse-precipitated in hexane to obtain a solid. The obtained solid was extracted with acetonitrile and filtered to obtain a filtrate. After adding magnesium sulfate and acid clay to the obtained filtrate, the solution obtained was stirred for 30 minutes. After filtering the solution, it was recrystallized with acetonitrile/toluene and washed with toluene. The obtained solid was recrystallized again using acetonitrile/tert-butylmethylether and purified by sublimation, obtaining 0.8 g of compound 26 (yield 17%, MS[M+H]=603).

3. Synthesis Example of Compound 52

(1) Synthesis Example of Compound 52-A

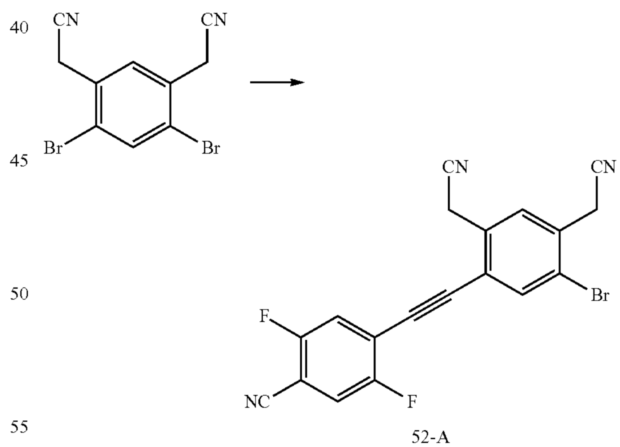

52-A 240.6 g (766.4 mmol) of 2,2'-(4,6-dibromo-1,3-phenylene)diacetonitrile, 4.0 L of toluene, 153.28 mmol of copper iodide, 153.28 mmol of tetrakistriphenylphosphine palladium, 3832.0 mmol of diisopropylamine, and 766.4 mmol of 4-ethynyl-2,5-difluorobenzonitrile were mixed, and heated to 100° C. After the reaction, 3.6 L of the solvent was distilled, and the reaction solution returned to room temperature was filtered to obtain a solid. After dissolving the solid in chloroform and extracting with water, magnesium sulfate and acid clay were added and stirred for one hour.

After filtering the stirred solution, the solvent was distilled off again, and recrystallization was performed twice with ethanol to obtain 121.4 g of compound 52-A (yield 40%, MS[M+H]=397).

(2) Synthesis Example of Compound 52-B

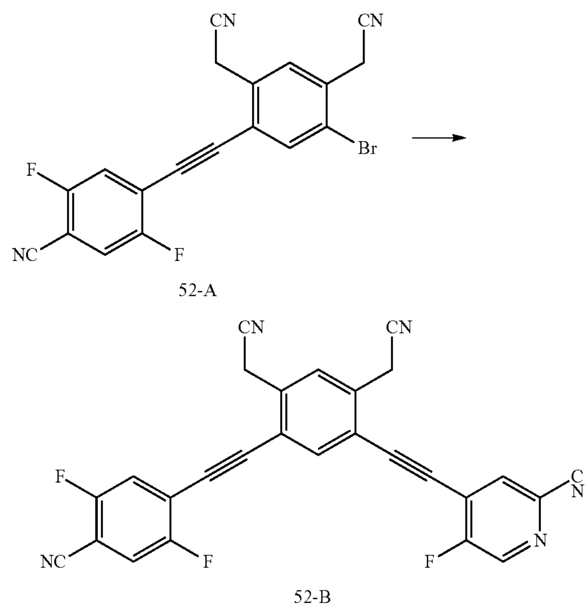

52-A

52-B 101.4 g (256.0 mmol) of 52-A, 1.2 L of toluene, 51.2 mmol of copper iodide, 51.2 mmol of tetrakistriphenylphosphine palladium, 1280 mmol of diisopropylamine, and 256.0 mmol of 4-ethinyl-6-fluoropyridine-3-carbonitrile were mixed, heated to 100° C., and stirred for 2 hours. After the reaction, 1.0 L of the solvent was distilled, and the reaction solution returned to room temperature was filtered to obtain a solid. After dissolving the solid in chloroform and extracting with water, magnesium sulfate and acid clay were added and stirred for one hour. After filtering the stirred solution, the solvent was distilled off again, and recrystallization was performed twice with tetrahydrofuran/ethanol to obtain 29.5 g of compound 52-B (yield 25%, MS[M+H]=462).

(3) Synthesis Example of Compound 52-C

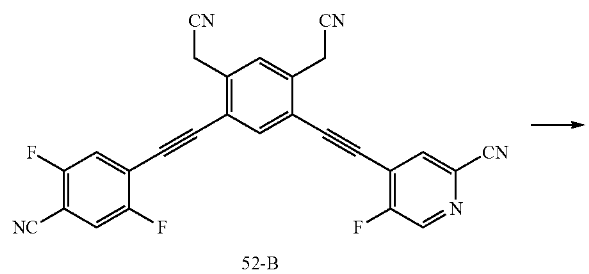

52-B

-continued

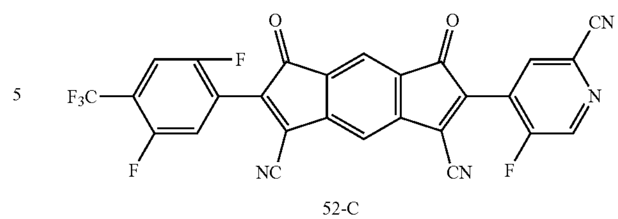

52-C 22.6 g (49.1 mmol) of 52-B, 300 mL of 1,4-dioxane, 294.6 mmol of diphenyl sulfoxide, 9.82 mmol of copper bromide (II), and 9.82 mmol of palladium acetate were mixed, heated to 100° C., and stirred for 5 hours. After the reaction, the solvent was distilled off, dissolved in chloroform, acid clay was added, and stirred for one hour. After filtering the stirred solution, the solvent was distilled off again and reverse-precipitation was performed using hexane to obtain a solid. The obtained solid was recrystallized with tetrahydrofuran/hexane and filtered to obtain 4.8 g of compound 52-C (yield 20%, MS[M+H]=490).

(4) Synthesis Example of Compound 52

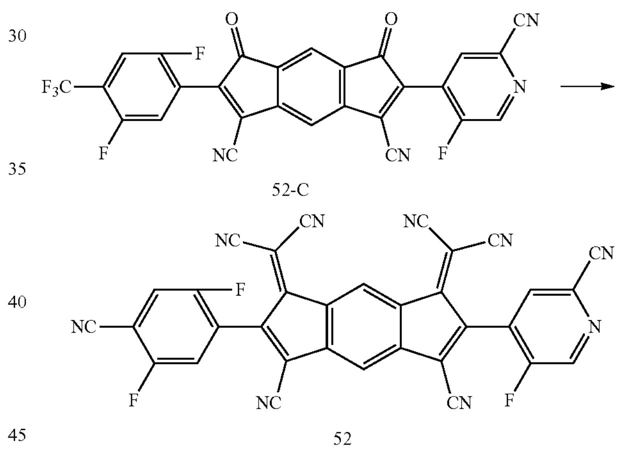

52-C

52

3.7 g (7.6 mmol) of 52-C, 120 mL of dichloromethane, and 53.2 mmol of malononitrile were added and cooled to 0° C. After slowly adding 38.0 mmol of titanium chloride (IV), it was stirred for 1 hour while remaining at 0° C. 53.2 mmol of pyridine was dissolved in 40 mL of dichloromethane, and then added slowly at 0° C., and then it was stirred for one hour while maintaining the temperature. After the reaction was complete, 53.2 mmol of acetic acid was added and stirred for an additional 30 minutes. After the reaction solution was extracted with water, the organic layer was reverse-precipitated in hexane to obtain a solid. The obtained solid was extracted with acetonitrile and filtered to obtain a filtrate. After adding magnesium sulfate and acid clay to the obtained filtrate, the solution obtained was stirred for 30 minutes. After filtering the solution, it was recrystallized with acetonitrile/toluene and washed with toluene. The obtained solid was recrystallized again using acetonitrile/tert-butylmethylether and purified by sublimation, obtaining 0.8 g of compound 52 (yield 18%, MS[M+H]=586).

4. Synthesis Example of Compound 102

(1) Synthesis Example of Compound 102-A

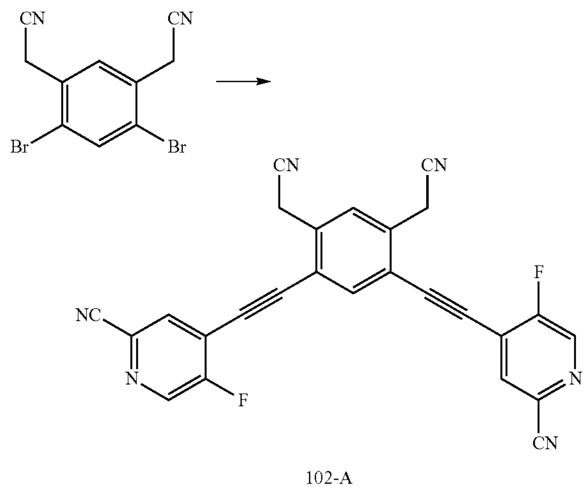

102-A 74.3 g (236.5 mmol) of 2,2'-(4,6-dibromo-1,3-phenylene) diacetonitrile, 1.0 L of toluene, 47.3 mmol of copper iodide, 47.3 mmol of tetrakistriphenylphosphine palladium, 1182.5 mmol of diisopropylamine, and 709.5 mmol of 4-ethinyl-5-fluoropyridine-2-carbonitrile were mixed, heated to 100° C., and stirred for 2 hours. After the reaction, 900 mL of the solvent was distilled, and the reaction solution returned to room temperature was filtered to obtain a solid. After dissolving the solid in chloroform and extracting with water, magnesium sulfate and acid clay were added and stirred for one hour. After filtering the stirred solution, the solvent was distilled off again, and recrystallization was performed twice with tetrahydrofuran/ethanol to obtain 31.5 g of compound 102-A (yield 30%, MS[M+H]=445).

(2) Synthesis Example of Compound 102-B

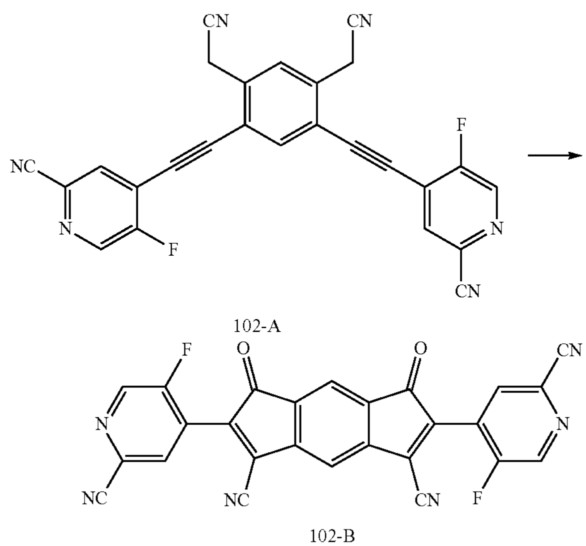

102-A

102-B 29.8 g (67.1 mmol) of 102-A, 400 mL of 1,4-dioxane, 402.6 mmol of diphenyl sulfoxide, 13.4 mmol of copper bromide (II), and 13.4 mmol of palladium acetate were mixed, heated to 100° C., and stirred for 5 hours. After the reaction, the solvent was distilled off, dissolved in chloroform, acid clay was added, and stirred for one hour. After filtering the stirred solution, the solvent was distilled off again and reverse-precipitation was performed using hexane to obtain a solid. The obtained solid was recrystallized with tetrahydrofuran/hexane and filtered to obtain 5.8 g of compound 102-B (yield 18%, MS[M+H]=473).

(3) Synthesis Example of Compound 102

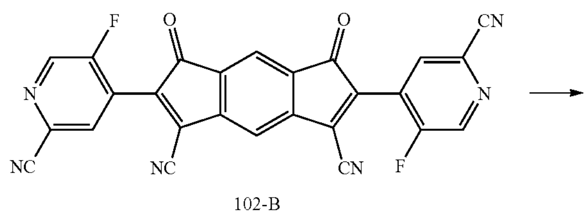

102-B

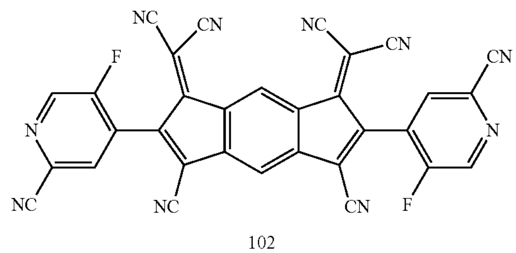

102

4.2 g (8.8 mmol) of 102-B, 130 mL of dichloromethane, and 61.6 mmol of malononitrile were added and cooled to 0° C. After slowly adding 44.0 mmol of titanium chloride (IV), it was stirred for 1 hour while remaining at 0° C. 61.6 mmol of pyridine was dissolved in 40 mL of dichloromethane, and then added slowly at 0° C., and then it was stirred for one hour while maintaining the temperature. After the reaction was complete, 61.6 mmol of acetic acid was added and stirred for an additional 30 minutes. After the reaction solution was extracted with water, the organic layer was reverse-precipitated in hexane to obtain a solid. The obtained solid was extracted with acetonitrile and filtered to obtain a filtrate. After adding magnesium sulfate and acid clay to the obtained filtrate, the solution obtained was stirred for 30 minutes. After filtering the solution, it was recrystallized with acetonitrile/toluene and washed with toluene. The obtained solid was recrystallized again using acetonitrile/tert-butylmethylether and purified by sublimation, obtaining 1.0 g of compound 102 (yield 20%, MS[M+H]=569).

5. Synthesis Example of Compound H16

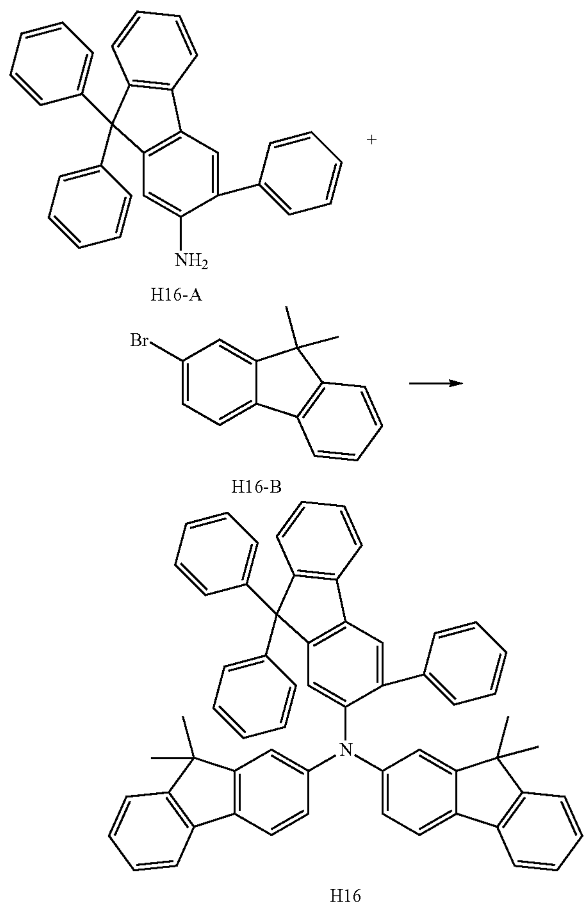

H16-A

H16-B

H16

7.4 g (18.0 mmol) of H16-A, 54.0 mmol of H16-B, 400 ml of toluene, 54.0 mmol of sodium tert-butoxide, and 3.6 mmol of bis(tri-tert-butylphosphine)palladium were mixed, and the resulting mixture was heated and refluxed, and stirred for 10 hours. After the reaction temperature was lowered to room temperature and the reaction was completed, and then resulting product was recrystallized with tetrahydrofuran/ethyl acetate and filtered to obtain 10 g of compound H16 (yield 70%, MS[M+H]=795).

6. Synthesis Example of Compound H35

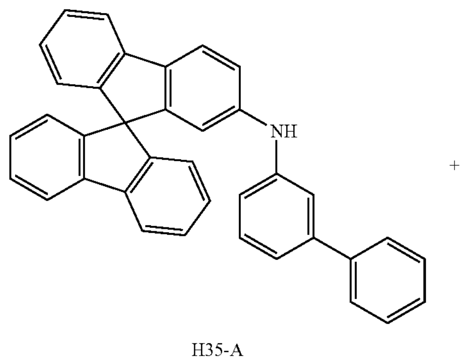

H35-A

-continued

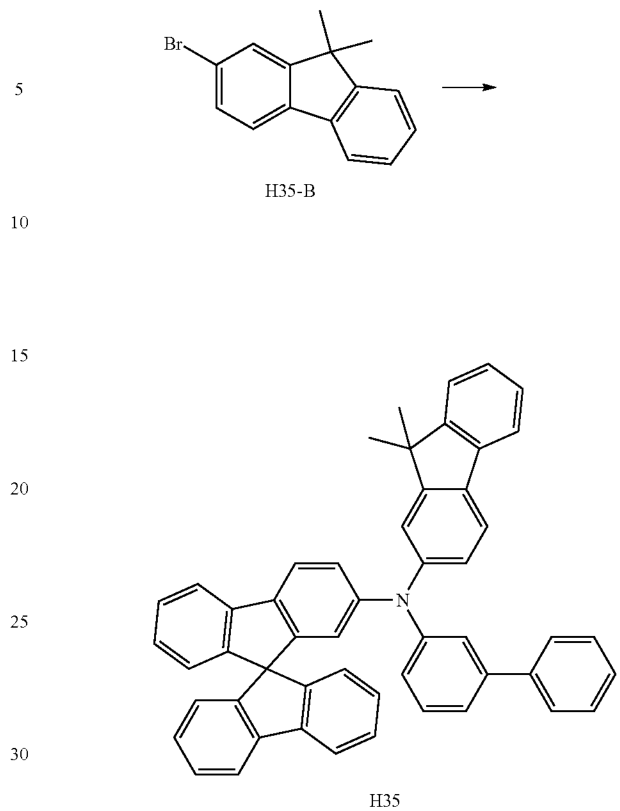

H35-B

H35

In the synthesis method of H16, H35 was obtained by proceeding with the same synthesis method except that H35-A and H35-B were used instead of H16-A and H16-B.

7. Synthesis Example of Compound H54

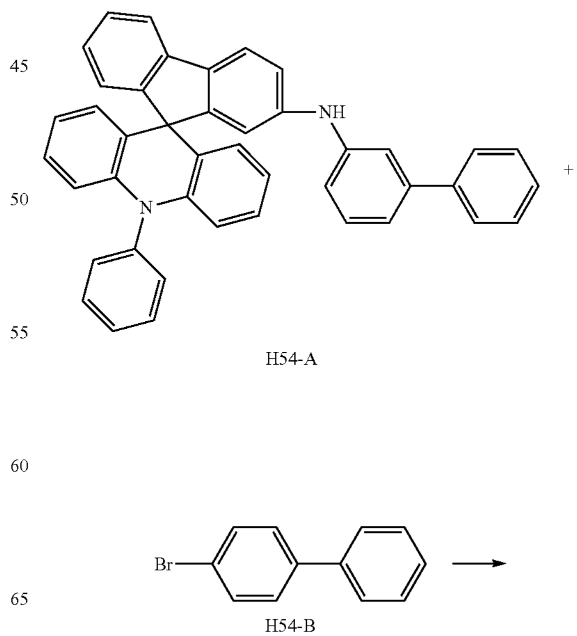

H54-A

H54-B

-continued

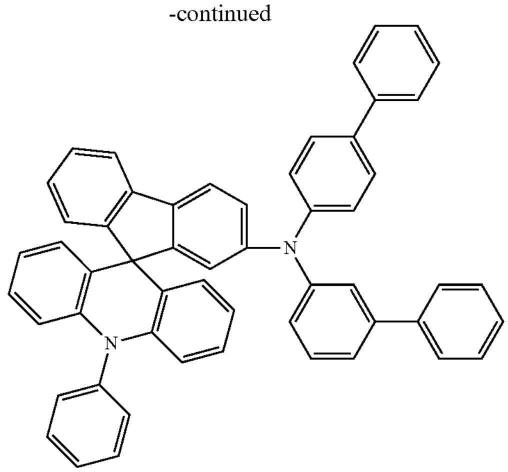

H54

In the synthesis method of H16, H54 was obtained by proceeding with the same synthesis method except that H54-A and H54-B were used instead of H16-A and H16-B.

[Manufacturing Evaluation of Organic Light Emitting Element]

[Manufacturing of Organic Light Emitting Element]

A hole injection layer (HIL, 80 Å, NPD+HATCN (5 wt %)), a first hole transport layer (HTL1, 950 Å, NPD), a first light emitting layer (EML1, 250 Å, host (AND)+dopant (PRN, 3 wt %), an first electron transport layer (ETL1, 150 Å, TmPyPB), an n-type charge generation layer (n-CGL, 200 Å, Bphen+Li (2 wt %)), a p-type charge generation layer (p-CGL, 150 Å), a second hole transport layer (HTL2, 300 Å), a second light emitting layer (EML2, 300 Å, host (CBP)+dopant ($Ir(ppy)_3$, 8 wt %)), a second electron transport layer (ETL2, 200 Å, TPBi)), an electron injection layer (EIL, LiF, 10 Å) and a cathode (Al, 2000 Å) were sequentially stacked on an ITO (anode), forming an organic light emitting element.

1. Comparative Examples (Comp. Ex.)

The p-type charge generation layer p-CGL was formed by doping the NPD with 20 wt % of the p-type dopant compound shown in Table 1 below, and the second hole transport layer HTL2 was formed with the hole transport compound shown in Table 1 below, to prepare the organic light emitting devices of Comparative Example 1 to Comparative Example 15.

2. Embodiments

The p-type charge generation layer p-CGL was formed by doping the NPD with 20 wt % of the p-type dopant compound shown in Table 1 below, and the second hole transport layer HTL2 was formed with the hole transport compound shown in Table 1 below, to prepare the organic light emitting devices of embodiment 1 to embodiment 12.

The compounds of comparative examples and embodiments are as follows.

NPD: N,N'-di-1-naphthyl-N—N'-diphenyl-(1,1'-biphenyl)-4,4'-diamine

HATCN: 1,4,5,8,9,11-Hexaazatriphenylenehexacarbonitile

AND: 9,10-di(naphtha-2-yl)anthracene

PRN: 1,6-bis(diphenylamine)pyrene

TmPyPB: 1,3,5-Tri(m-pyridin-3-ylphenyl)benzene

Bphen: Bathophenanthroline

CBP: 4,4'-Bis(N-Carbazolyl)-1,1'-biphenyl $Ir(ppy)_3$: tris(2-phenylpyridine) Iridium(III)

TPBi: 2,2',2"-(1,3,5-Benzinetriyl)-tris(1-phenyl-1-H benzimidazole)

PD1

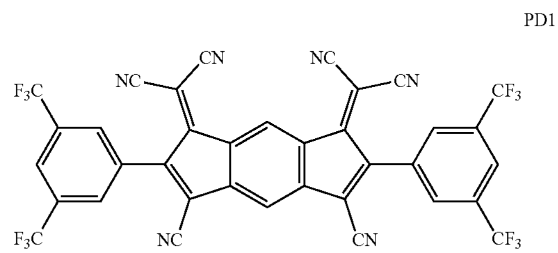

PD2

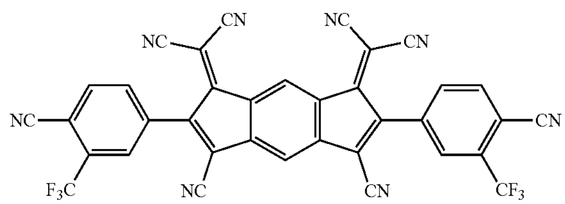

PD3

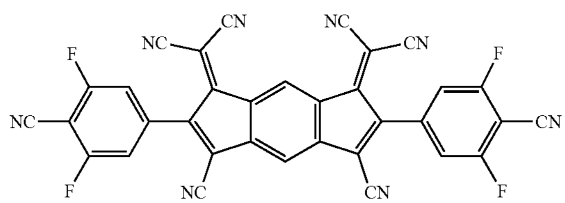

PD4

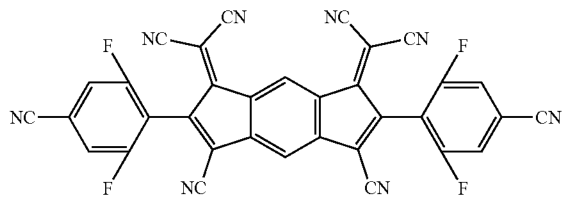

TABLE 1

| | p-CGL | HTL2 | Voltage (V) | Efficiency (relative value, %) | T95 (relative value, %) |
|---|---|---|---|---|---|
| Comp. ex. 1 | HATCN | NPD | 9.8 | 100 | 100 |
| Comp. ex. 2 | HATCN | H16 | 8.7 | 102 | 106 |
| Comp. ex. 3 | HATCN | H35 | 8.8 | 101 | 104 |
| Comp. ex. 4 | PD1 | NPD | 8.4 | 104 | 108 |
| Comp. ex. 5 | PD1 | H16 | 8.1 | 111 | 116 |
| Comp. ex. 6 | PD1 | H35 | 8.2 | 108 | 112 |
| Comp. ex. 7 | PD2 | NPD | 8.3 | 105 | 110 |
| Comp. ex. 8 | PD2 | H16 | 7.9 | 119 | 129 |
| Comp. ex. 9 | PD2 | H35 | 8.0 | 117 | 126 |
| Comp. ex. 10 | PD3 | NPD | 8.1 | 110 | 117 |
| Comp. ex. 11 | PD3 | H16 | 7.9 | 119 | 130 |
| Comp. ex. 12 | PD3 | H35 | 7.9 | 120 | 131 |
| Comp. ex. 13 | PD4 | NPD | 8.2 | 106 | 113 |
| Comp. ex. 14 | PD4 | H16 | 7.9 | 119 | 131 |
| Comp. ex. 15 | PD4 | H35 | 8.0 | 118 | 129 |
| Embodiment 1 | 1 | H16 | 7.8 | 121 | 147 |
| Embodiment 2 | 1 | H35 | 7.8 | 122 | 148 |
| Embodiment 3 | 1 | H54 | 7.9 | 120 | 146 |
| Embodiment 4 | 26 | H16 | 7.7 | 132 | 156 |

TABLE 1-continued

| | p-CGL | HTL2 | Voltage (V) | Efficiency (relative value, %) | T95 (relative value, %) |
|---|---|---|---|---|---|
| Embodiment 5 | 26 | H35 | 7.7 | 132 | 155 |
| Embodiment 6 | 26 | H54 | 7.8 | 128 | 150 |
| Embodiment 7 | 52 | H16 | 7.7 | 133 | 155 |
| Embodiment 8 | 52 | H35 | 7.7 | 131 | 154 |
| Embodiment 9 | 52 | H54 | 7.8 | 127 | 151 |
| Embodiment 10 | 102 | H16 | 7.7 | 132 | 154 |
| Embodiment 11 | 102 | H35 | 7.8 | 127 | 150 |
| Embodiment 12 | 102 | H54 | 7.8 | 126 | 149 |

As shown in Table 1, the organic light emitting elements of the embodiments which use the first compound represented by chemical formula 1 of the present disclosure in the p-type charge generation layer and the second compound represented by chemical formula 2 of the present disclosure in the second hole transport layer have better efficiency, longer lifespan, and lower driving voltage than the organic light emitting elements of the comparative examples.

In the PD1 and PD2 compounds used in the organic light emitting elements of the comparative examples, benzene bonded to the indacene derivative in the center has a cyano group as a substituent, but the first compounds used in the embodiments do not have a cyano group bonded to the corresponding position. Due to this difference, the organic light emitting elements according to the embodiments appear to have better efficiency, longer lifespan, and lower driving voltage than the organic light emitting elements of comparative example 4 to comparative example 9.

In the PD3 and PD4 compounds, in the benzene bonded to the indacene derivative in the center, the electron withdrawing group is not substituted at the two carbons ortho-positioned to the carbon connected to the indacene (PD3) or is substituted at both of the carbons (PD4). The organic light emitting element according to embodiments using the first compound in which the electron withdrawing group is substituted only for one carbon of the two ortho-positioned carbons has better efficiency, longer lifespan or lower driving voltage than the organic light emitting elements of comparative example 10 to comparative example 15 using the compound in which no electron withdrawing group is not substituted at the two ortho-positioned carbons (PD3) or the compound in which the electron withdrawing group is substituted at both of the carbons (PD4).

In addition, the organic light emitting elements according to the embodiments in which the first compound is used in the p-type charge generation layer and the second compound is used in the second hole transport layer at the same time have better efficiency, longer lifespan or lower driving voltage than the organic light emitting elements of comparative example 1 to comparative example 15 in which the second compound is used in the second hole transport layer.

That is, in the organic light emitting element according to embodiments of the present disclosure, the holes are efficiently transferred to the second hole transport layer by including the first compound in the p-type charge generation layer, and at the same time, the hole transfer characteristics are improved by including the second compound in the second hole transport layer. There may be provided the organic light emitting element having high emission efficiency, long lifespan, or low driving voltage.

A brief description of the embodiments of the present disclosure described above is as follows.

An organic light emitting element according to the embodiments of the present disclosure may comprise a first electrode, a second electrode, and an organic material layer positioned between the first electrode and the second electrode, and the organic material layer may include a first compound represented by chemical formula 1 and a second compound represented by chemical formula 2.

In the organic light emitting element according to the embodiments of the present disclosure, the organic material layer may include a first light emitting layer and a first layer, and the first layer may include the first compound and the second compound.

The first electrode may be an anode electrode, and the second electrode may be a cathode electrode, and the first layer may be positioned between the first electrode and the first light emitting layer.

In the organic light emitting element according to the embodiments of the present disclosure, the first layer may include a hole injection layer and a first hole transport layer, and the hole injection layer may include the first compound and the first hole transport layer may include the second compound.

The first compound may be a p-type dopant of the hole injection layer.

In the organic light emitting element according to the embodiments of the present disclosure, the organic material layer may include a first light emitting layer, a second light emitting layer and a first layer, and the first layer may be positioned between the first light emitting layer and the second light emitting layer, and the first layer may include the first compound and the second compound.

In the organic light emitting element according to the embodiments of the present disclosure, the first layer may include a charge generation layer and a second hole transport layer, and the charge generation layer may include the first compound and the second hole transport layer may include the second compound.

The charge generation layer may include a p-type charge generation layer, and the first compound may be a p-type dopant of the p-type charge generation layer.

In the organic light emitting element according to the embodiments of the present disclosure, the organic material layer may include a second layer, and the second layer may be positioned between the first electrode and the first light emitting layer, and the second layer may include the first compound.

The second layer may include a hole injection layer, and the first compound may be a p-type dopant of the hole injection layer.

The second layer may include a first hole transport layer, and the first hole transport layer may include the second compound.

In the organic light emitting element according to the embodiments of the present disclosure, the organic material layer may include a third light emitting layer and a third layer, and the third layer may be positioned between the second light emitting layer and the third light emitting layer, and the third layer may include the first compound and the second compound.

The third layer may include a charge generation layer and a third hole transport layer, and the charge generation layer may include the first compound and the third hole transport layer includes the second compound.

The charge generation layer may be a p-type charge generation layer, and the first compound may be a p-type dopant of the p-type charge generation layer.

The organic material layer may include a second layer, and the second layer may be positioned between the first electrode and the first light emitting layer, and the second layer may include the first compound.

The second layer may include a hole injection layer and the first compound may be a p-type dopant of the hole injection layer.

The second layer may include a first hole transport layer and the first hole transport layer may include the second compound.

A display device according to the embodiments of the present disclosure may comprise the organic light emitting element.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications. The above description and the accompanying drawings provide an example of the technical idea of the present disclosure for illustrative purposes only. That is, the disclosed embodiments are intended to illustrate the scope of the technical idea of the present disclosure.

What is claimed:

1. An organic light emitting element, comprising:

a first electrode;

a second electrode; and an organic material layer positioned between the first electrode and the second electrode, wherein the organic material layer includes a first compound represented by chemical formula 1 and a second compound represented by chemical formula 2 below:

[Chemical formula 1]

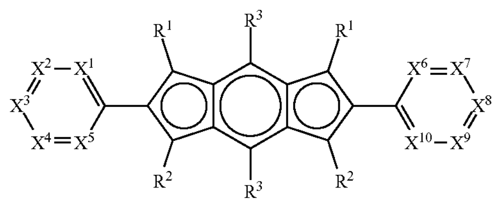

in chemical formula 1, $R^1$ and $R^2$ are independently selected from the group consisting of a hydrogen, a deuterium, a tritium, a halogen, a cyano group, a $C_1$-$C_{50}$ alkyl group, a $C_1$-$C_{50}$ haloalkyl group, a $C_1$-$C_{30}$ alkoxy group, a $C_1$-$C_{30}$ haloalkoxy group, a $C_6$-$C_{60}$ aryl group, a $C_6$-$C_{60}$ haloaryl group, a $C_2$-$C_{60}$ heterocyclic group including at least one heteroatom selected from the group consisting of O, N, S, Si and P, a $C_2$-$C_{60}$ haloheterocyclic group including at least one heteroatom selected from the group consisting of O, N, S, Si and P, and a malononitrile group, $R^3$ is each independently selected from the group consisting of a hydrogen, a deuterium, a tritium, a halogen, a cyano group, a malononitrile group, a $C_1$-$C_{50}$ alkyl group, a $C_1$-$C_{50}$ haloalkyl group, a $C_1$-$C_{30}$ alkoxy group, a $C_1$-$C_{30}$ haloalkoxy group, a $C_6$-$C_{60}$ aryl group, a $C_6$-$C_{60}$ haloaryl group, a $C_2$-$C_{60}$ heterocyclic group including at least one heteroatom selected from the group consisting of O, N, S, Si and P, and a $C_2$-$C_{60}$ haloheterocyclic group including at least one heteroatom selected from the group consisting of O, N, S, Si and P, $X^1$ to $X^5$ are each independently $CR^a$ or N, and at least two of $X^1$ to $X^5$ are $CR^a$, $R^a$ is each independently selected from the group consisting of a hydrogen, a deuterium, a tritium, a halogen, a cyano group, a $C_1$-$C_{50}$ alkyl group, and a $C_1$-$C_{50}$ alkoxy group, and at least one of $R^a$ is a halogen or a cyano group, $X^6$ to $X^{10}$ are each independently $CR^b$ or N, and at least two of $X^6$ to $X^{10}$ are $CR^b$, $R^b$ is each independently selected from the group consisting of a hydrogen, a deuterium, a tritium, a halogen, a cyano group, a $C_1$-$C_{50}$ alkyl group, and a $C_1$-$C_{50}$ alkoxy group, and at least one of $R^b$ is a halogen or a cyano group, in $R^1$ to $R^3$, $R^a$ and $R^b$ of chemical formula 1, the alkyl group, the haloalkyl group, the alkoxy group, the haloalkoxy group, the aryl group, the haloaryl group, the heterocyclic group, and the haloheterocyclic group is each optionally further substituted with one or more substituents selected from the group consisting of a deuterium, a nitro group, a cyano group, an amino group, a $C_1$-$C_{20}$ alkoxy group, a $C_1$-$C_{20}$ haloalkoxy group, a $C_1$-$C_{20}$ alkyl group, a $C_1$-$C_{20}$ haloalkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group including at least one heteroatom selected from the group consisting of O, N, S, Si and P, a $C_3$-$C_{60}$ alkylsilyl group, a $C_{18}$-$C_{60}$ arylsilyl group, and a $C_8$-$C_{60}$ alkylarylsilyl group, and

[Chemical formula 2]

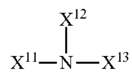

in chemical formula 2, $X^{11}$ to $X^{13}$ are each independently selected from the group consisting of a $C_6$-$C_{60}$ aryl group, a fluorenyl group, a $C_2$-$C_{60}$ heterocyclic group including at least one heteroatom selected from the group consisting of O, N, S, Si and P, and a fused ring group of a $C_3$-$C_{60}$ aliphatic ring and a $C_6$-$C_{60}$ aromatic ring, or are each independently selected of one of the following chemical formula 2-1 to chemical formula 2-4, in $X^{11}$ to $X^{13}$ of chemical formula 2, the aryl group, the fluorenyl group, the heterocyclic group, and the fused ring group is each optionally further substituted with at least one substituent selected from the group consisting of a deuterium, a nitro group, a cyano group, a halogen group, an amino group, a $C_1$-$C_{20}$ alkoxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group including at least one heteroatom selected from the group consisting of O, N, S, Si and P, a $C_3$-$C_{60}$ alkylsilyl group, a $C_{18}$-$C_{60}$ arylsilyl group, and a $C_8$-$C_{60}$ alkylarylsilyl group, and

[Chemical formula 2-1]

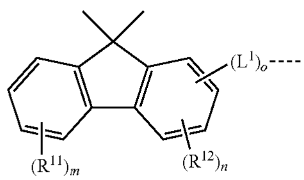

[Chemical formula 2-2]

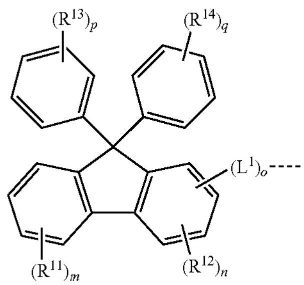

[Chemical formula 2-3]

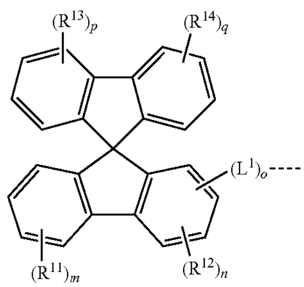

[Chemical formula 2-4]

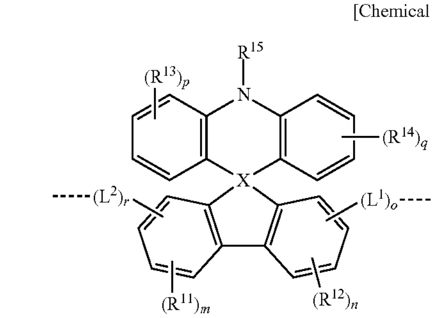

in chemical formula 2-1 to chemical formula 2-4, m, n, o and r are each independently an integer of 0 to 4, m+r is an integer of 0 to 4, and n+o is an integer of 0 to 4, p and q are each independently an integer of 0 to 5, $R^{11}$ to $R^{15}$ are each independently selected from the group consisting of a hydrogen, a deuterium, a tritium, a halogen, a cyano group, a nitro group, a $C_6$-$C_{60}$ aryl group, a fluorenyl group, a $C_2$-$C_{60}$ heterocyclic group including at least one heteroatom selected from the group consisting of O, N, S, Si and P, a fused ring group of a $C_3$-$C_{60}$ aliphatic ring and a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxy group, a $C_6$-$C_{30}$ aryloxy group, a $C_3$-$C_{60}$ alkylsilyl group, a $C_{18}$-$C_{60}$ arylsilyl group, and a $C_8$-$C_{60}$ alkylarylsilyl group, $L^1$ and $L^2$ are each independently selected from the group consisting of a single bond, a $C_6$-$C_{60}$ arylene group, a fluorenylene group, a $C_2$-$C_{60}$ divalent heterocyclic group including at least one heteroatom selected from the group consisting of O, N, S, Si and P, and a divalent fused ring group of a $C_3$-$C_{60}$ aliphatic ring and a $C_6$-$C_{60}$ aromatic ring, and in $R^{11}$ to $R^{15}$, $L^1$ and $L^2$ of chemical formula 2-1 to chemical formula 2-4, the aryl group, the fluorenyl group, the heterocyclic group, the fused ring group, the alkyl group, the alkenyl group, the alkynyl group, the alkoxy group, the aryloxy group, the alkylsilyl group, the arylsilyl group, the alkylarylsilyl group, the arylene group, the fluorenylene group, the divalent fused ring group, and the divalent fused ring group is each optionally further substituted with one or more substituents selected from the group consisting of a deuterium, a nitro group, a cyano group, a halogen group, an amino group, a $C_1$-$C_{20}$ alkoxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group including at least one heteroatom selected from the group consisting of O, N, S, Si and P, a $C_3$-$C_{60}$ alkylsilyl group, a $C_{18}$-$C_{60}$ arylsilyl group, and a $C_8$-$C_{60}$ alkylarylsilyl group.

2. The organic light emitting element of claim 1, wherein the first compound is represented by either chemical formula 3 or chemical formula 4 below:

[Chemical formula 3]

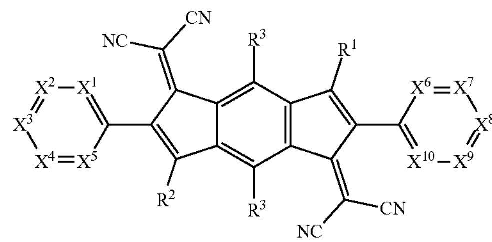

[Chemical formula 4]

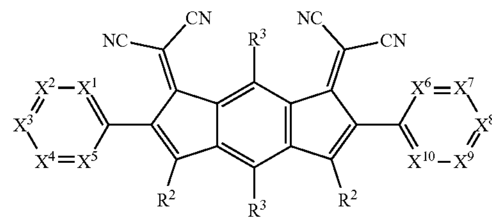

in chemical formula 3 and chemical formula 4, $R^1$ to $R^3$ and $X^1$ to $X^{10}$ are the same as $R^1$ to $R^3$ and $X^1$ to $X^{10}$ defined for chemical formula 1.

3. The organic light emitting element of claim 1, wherein the first compound is represented by either chemical formula 5 or chemical formula 6 below:

[Chemical formula 5]

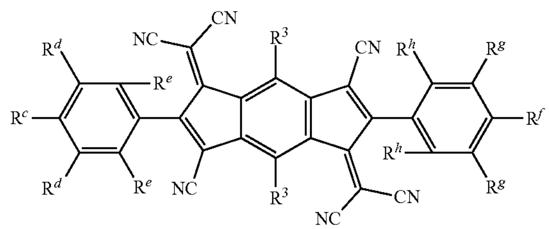

-continued

[Chemical formula 6]

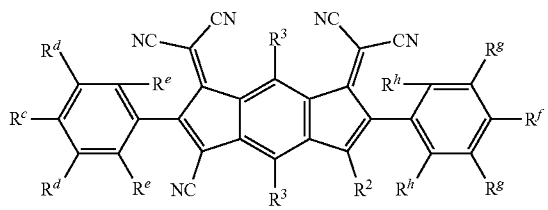

in chemical formula 5 and chemical formula 6, $R^c$ and $R^d$ are each independently selected from the group consisting of a hydrogen, a deuterium, a tritium, a halogen, a cyano group, a $C_1$-$C_{50}$ alkyl group, and a $C_1$-$C_{50}$ alkoxy group, $R^e$ is each independently selected from the group consisting of a hydrogen, a deuterium, a tritium, a halogen, and a cyano group, $R^f$ and $R^g$ are each independently selected from the group consisting of a hydrogen, a deuterium, a tritium, a halogen, a cyano group, a $C_1$-$C_{50}$ alkyl group, and a $C_1$-$C_{50}$ alkoxy group, $R^h$ is each independently selected from the group consisting of a hydrogen, a deuterium, a tritium, a halogen, and a cyano group, and $R^3$ is the same as $R^3$ defined for chemical formula 1.

4. The organic light emitting element of claim 3, wherein in chemical formula 5, $R^c$ is each independently a halogen, or a cyano group, i) one of two $R^d$s is a hydrogen, a deuterium, or a tritium, and the other $R^d$ is a halogen, or a cyano group, or ii) two $R^d$s are each independently a halogen, or a cyano group, one of two Res is a hydrogen, a deuterium, or a tritium, and the other $R^e$ is a halogen, or a cyano group, $R^f$ is each independently a halogen, or a cyano group, i) one of two $R^g$s is a hydrogen, a deuterium, or a tritium, and the other $R^g$ is a halogen, or a cyano group, or ii) two $R^g$s are each independently a halogen, or a cyano group, one of two $R^h$s is a hydrogen, a deuterium, or a tritium, and the other $R^h$ is a halogen, or a cyano group, and wherein in chemical formula 6, $R^c$ is each independently a halogen, or a cyano group, i) one of two $R^d$s is a hydrogen, a deuterium, or a tritium, and the other $R^d$ is a halogen, or a cyano group, or ii) two $R^d$s are each independently a halogen, or a cyano group, one of two Res is a hydrogen, a deuterium, or a tritium, and the other $R^e$ is a halogen, or a cyano group, $R^f$ is each independently a halogen, or a cyano group, i) one of two $R^g$s is a hydrogen, a deuterium, or a tritium, and the other $R^g$ is a halogen, or a cyano group, or ii) two $R^g$s are each independently a halogen, or a cyano group, and one of two $R^h$s is a hydrogen, a deuterium, or a tritium, and the other $R^h$ is a halogen, or a cyano group.

5. The organic light emitting element of claim 1, wherein the first compound is represented by any one of chemical formula 7 to chemical formula 16 below:

[Chemical formula 7]

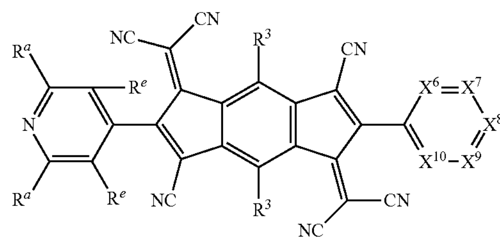

[Chemical formula 8]

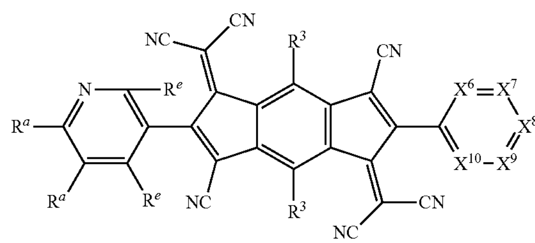

[Chemical formula 9]

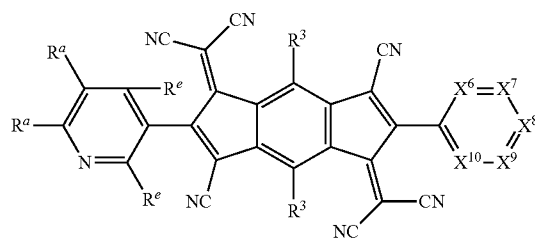

[Chemical formula 10]

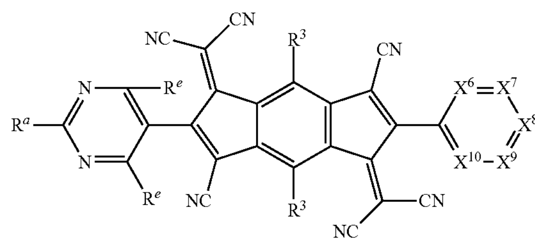

[Chemical formula 11]

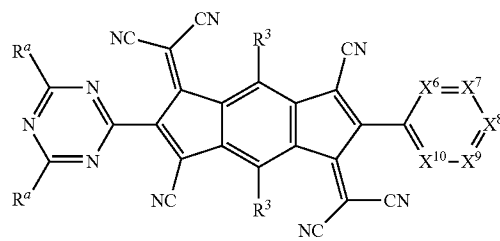

[Chemical formula 12]

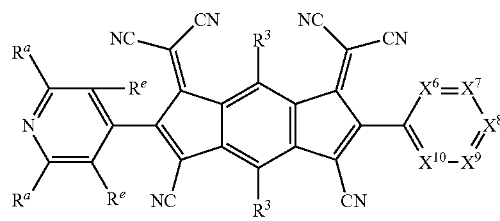

-continued

[Chemical formula 13]

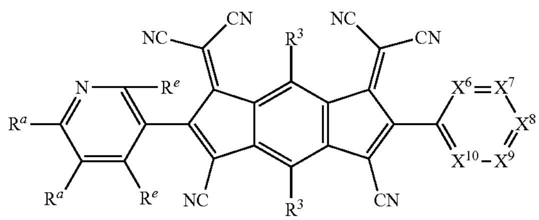

[Chemical formula 14]

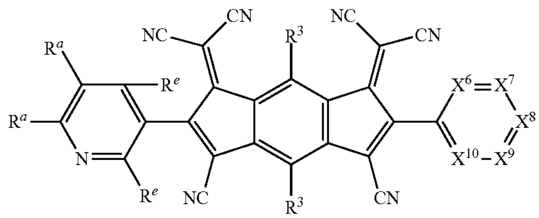

[Chemical formula 15]

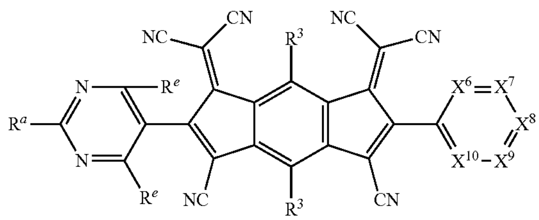

[Chemical formula 16]

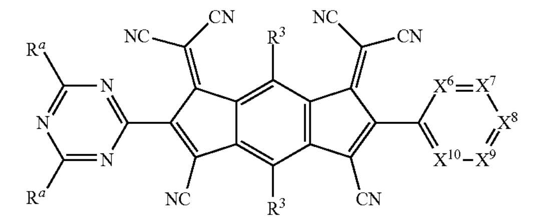

in chemical formula 7 to chemical formula 16, $R^a$, $R^3$ and $X^6$ to $X^{10}$ are the same as $R^a$, $R^3$ and $X^6$ to $X^{10}$ defined for chemical formula 1, and $R^e$ is each independently selected from the group consisting of a hydrogen, a deuterium, a tritium, a halogen, and a cyano group.

6. The organic light emitting element of claim 5, wherein in chemical formula 7 to chemical formula 16, $R^a$, $R^3$ and $X^6$ to $X^{10}$ are the same as $R^a$, $R^3$ and $X^6$ to $X^{10}$ defined for the chemical formula 1, wherein in chemical formula 7, one of two $R^e$s is a hydrogen, a deuterium, or a tritium, and the other $R^e$ is a halogen, or a cyano group, wherein in chemical formula 8, one of two Res is a hydrogen, a deuterium, or a tritium, and the other $R^e$ is a halogen, or a cyano group, wherein in chemical formula 9, one of two $R^e$s is a hydrogen, a deuterium, or a tritium, and the other $R^e$ is a halogen, or a cyano group, wherein in chemical formula 10, one of two $R^e$s is a hydrogen, a deuterium, or a tritium, and the other $R^e$ is a halogen, or a cyano group, wherein in chemical formula 12, one of two Res is a hydrogen, a deuterium, or a tritium, and the other $R^e$ is a halogen, or a cyano group, wherein in chemical formula 13, one of two $R^e$s is a hydrogen, a deuterium, or a tritium, and the other $R^e$ is a halogen, or a cyano group, wherein in chemical formula 14, one of two $R^e$s is a hydrogen, a deuterium, or a tritium, and the other $R^e$ is a halogen, or a cyano group, and wherein in chemical formula 15, one of two $R^e$s is a hydrogen, a deuterium, or a tritium, and the other $R^e$ is a halogen, or a cyano group.

7. The organic light emitting element of claim 1, wherein the first compound represented by chemical formula 1 is one or more of the compounds:

1

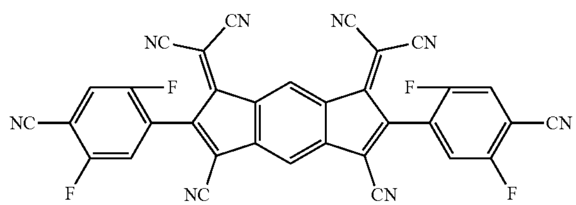

2

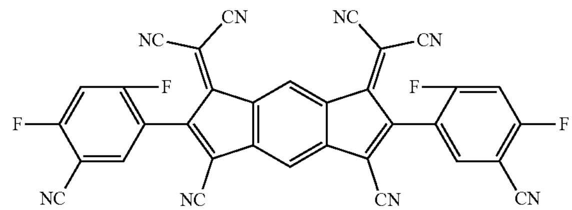

3

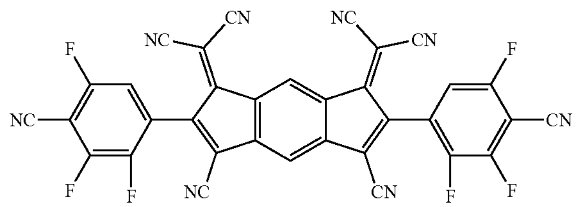

4

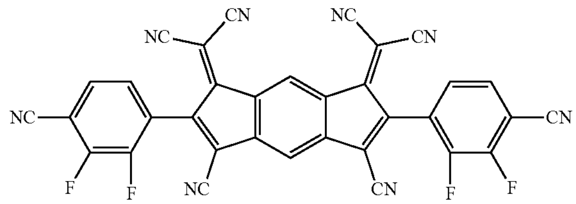

5

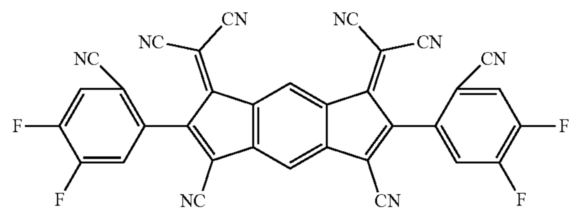

-continued
6
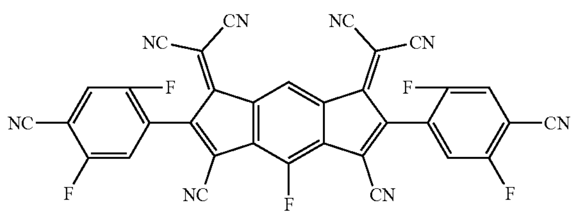
7
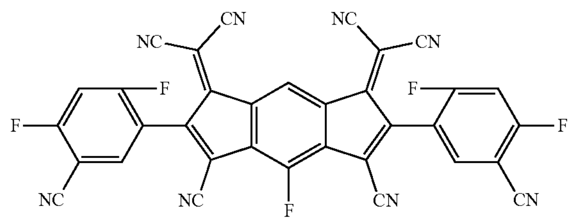
8
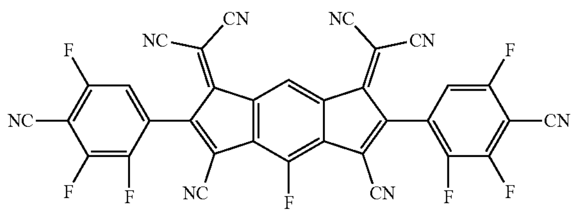
9
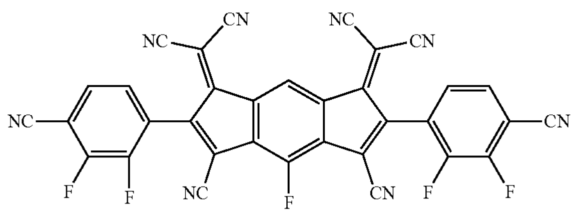
10
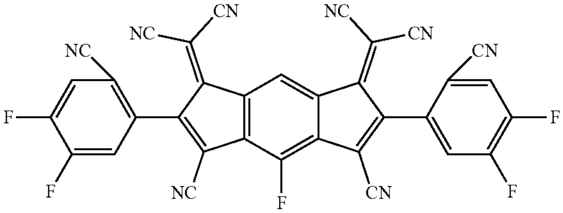
11
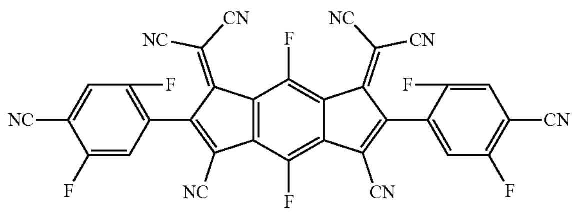
-continued
12
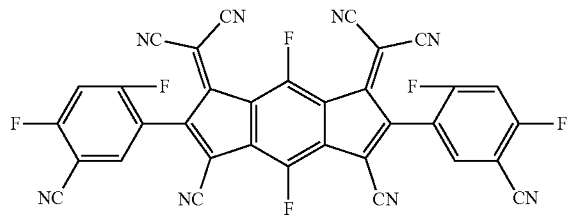
13
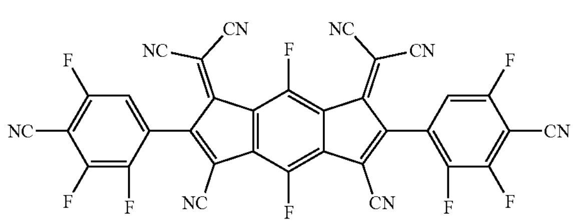
14
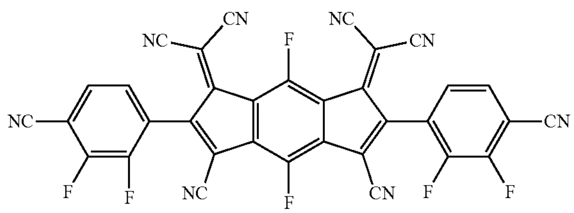
15
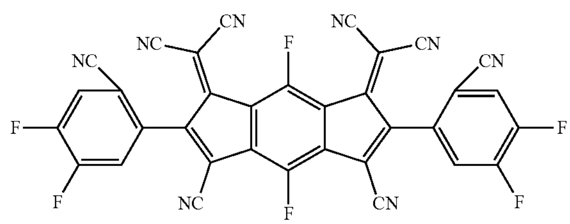
16
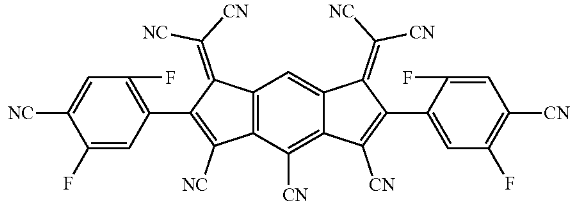
17
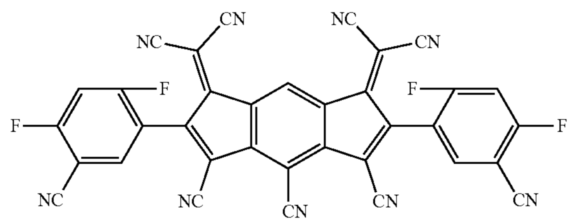

-continued
18
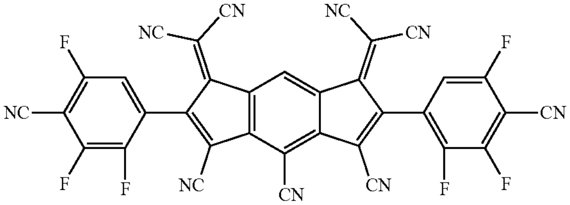
19
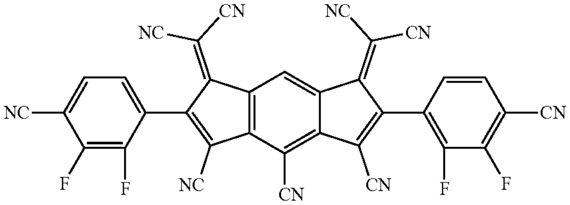
20
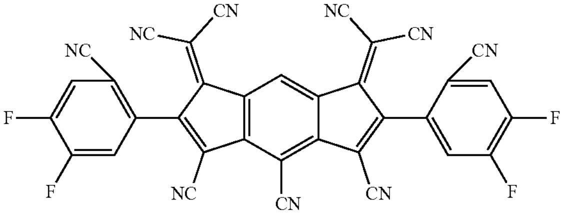
21
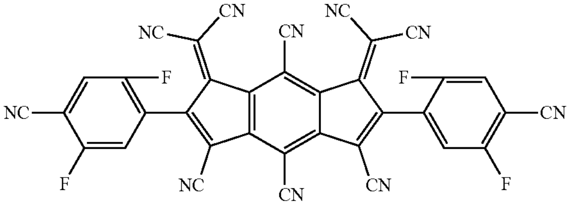
22
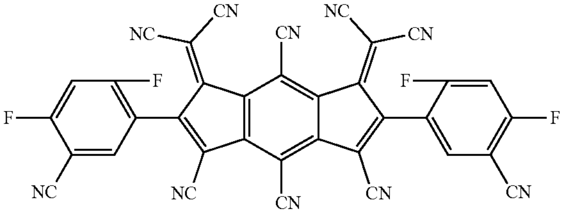
23
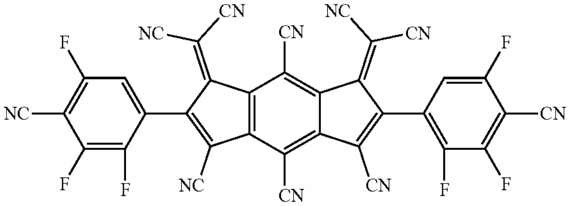
-continued
24
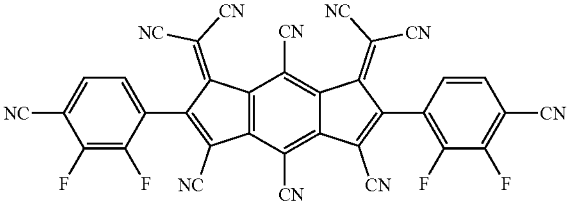
25
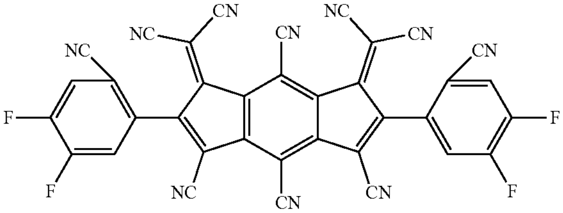
26
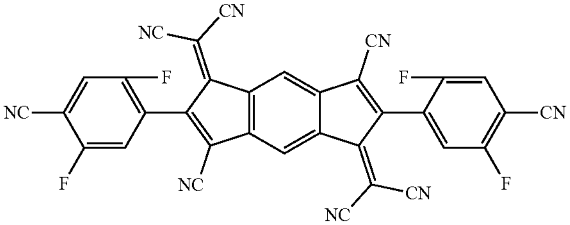
27
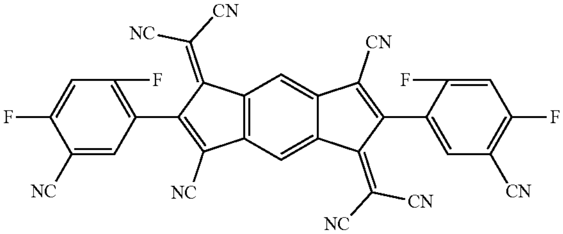
28
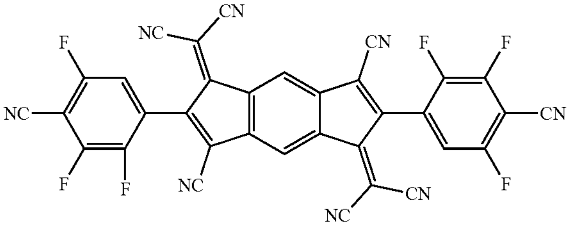
29
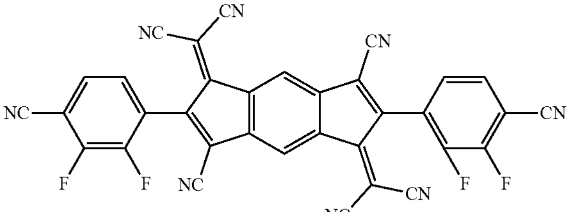

-continued
30
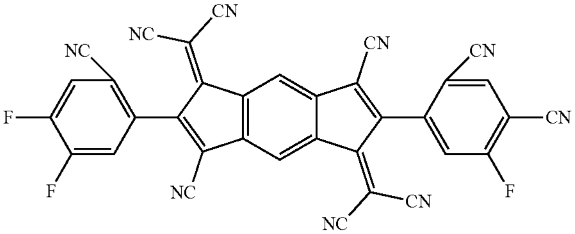
31
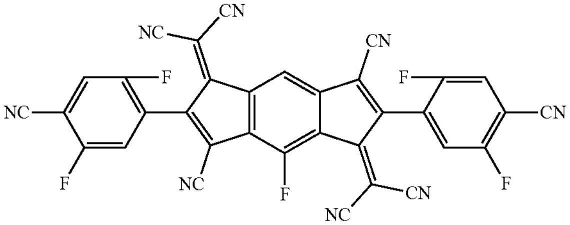
32
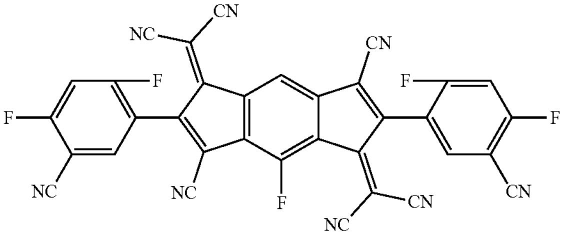
33
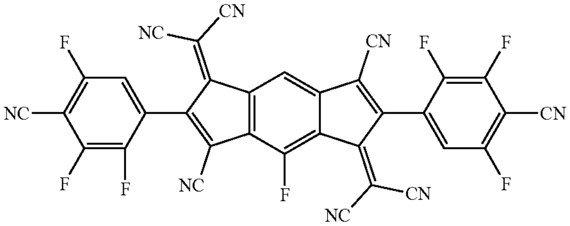
34
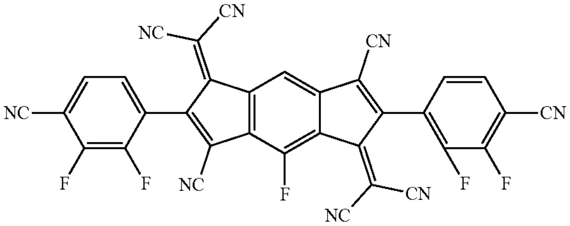
35
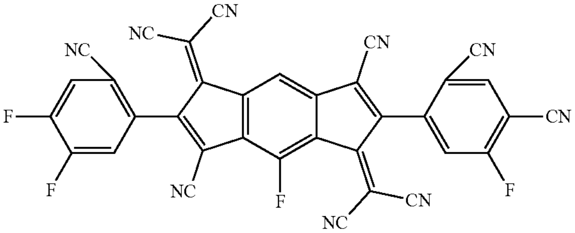
-continued
36
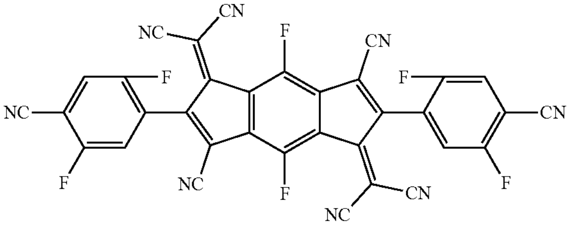
37
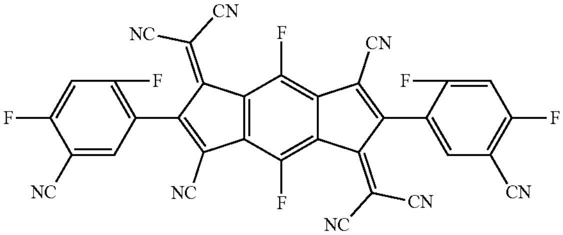
38
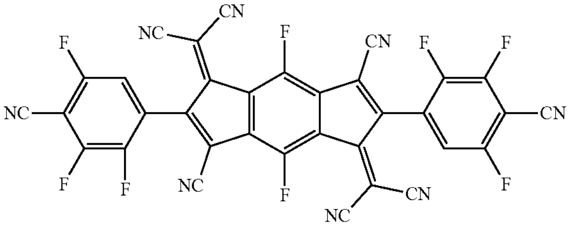
39
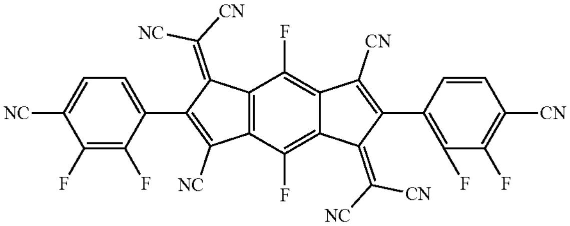
40
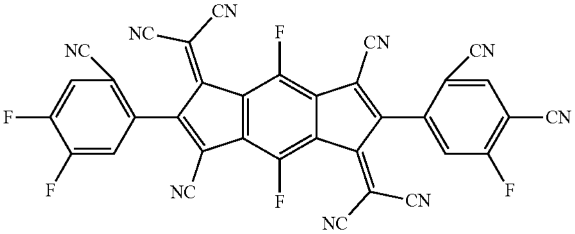
41
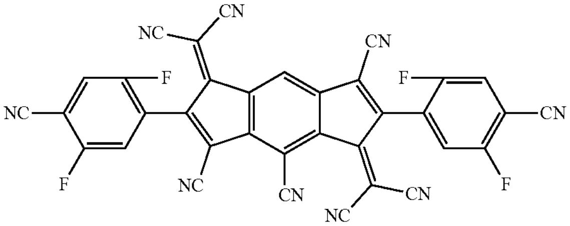

-continued
42
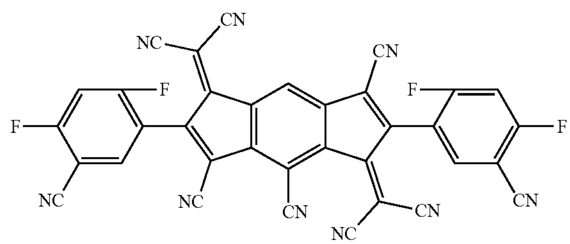
43
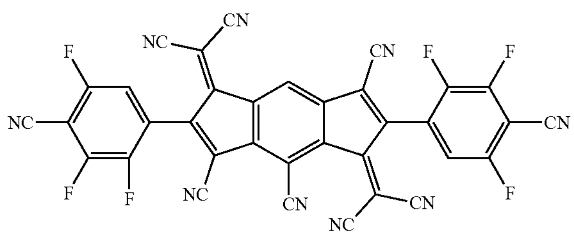
44
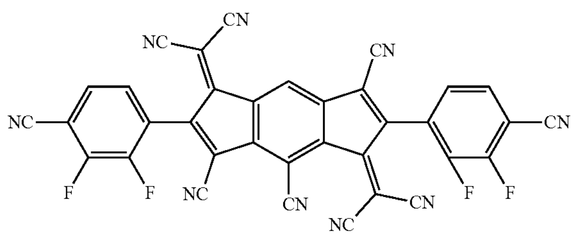
45
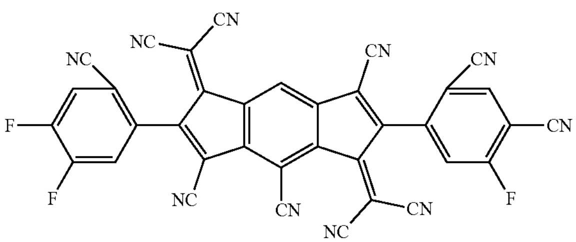
46
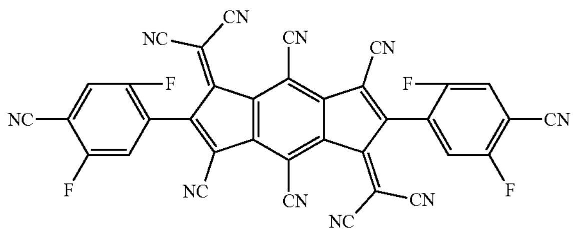
47
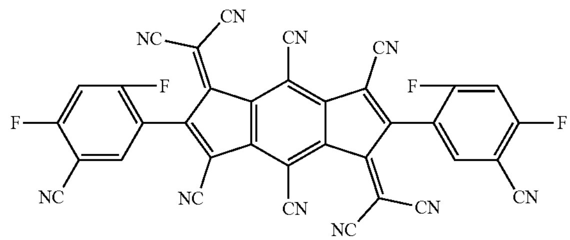
-continued
48
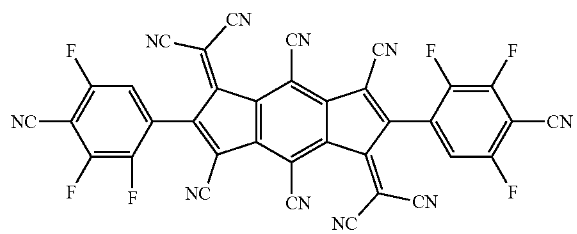
49
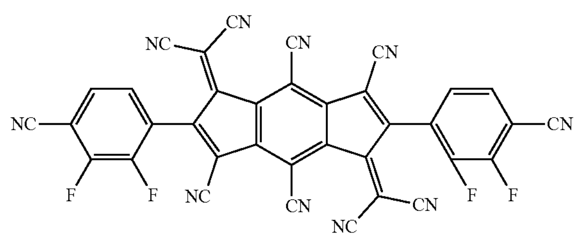
50
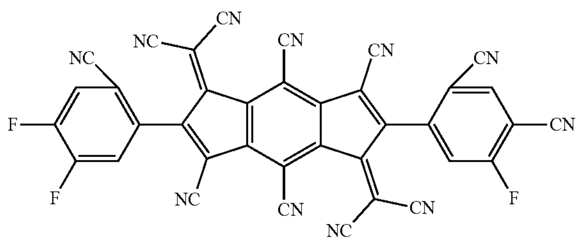
51
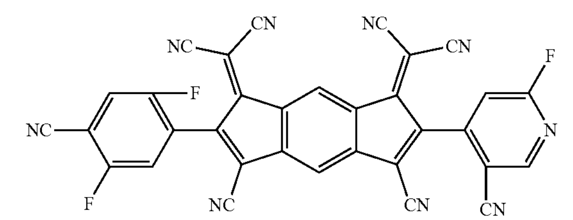
52
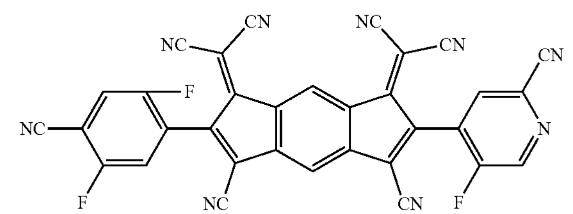
53
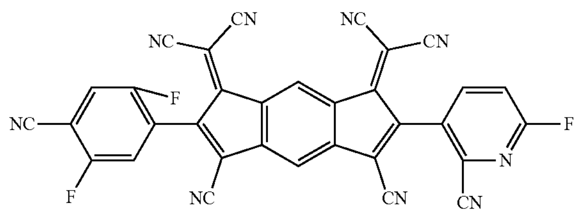

-continued
54
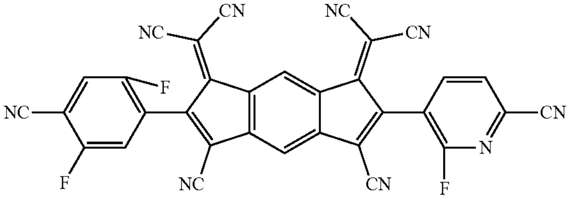
55
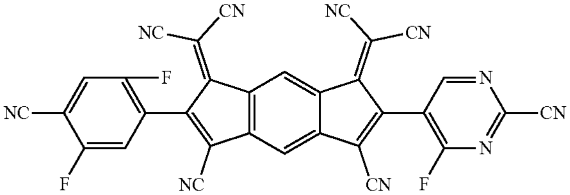
56
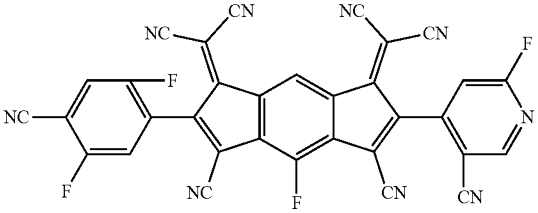
57
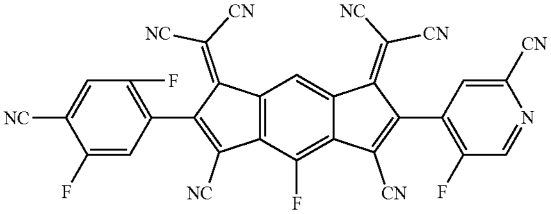
58
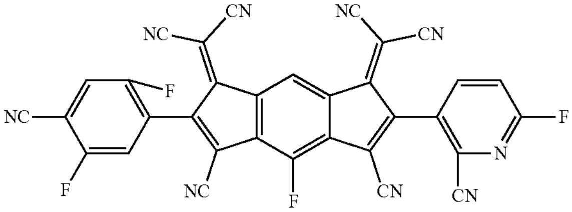
59
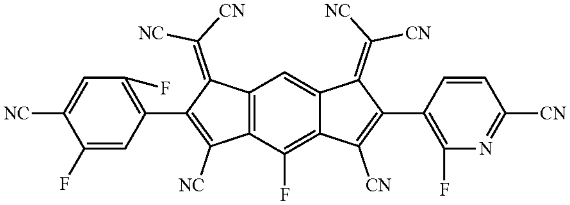
60
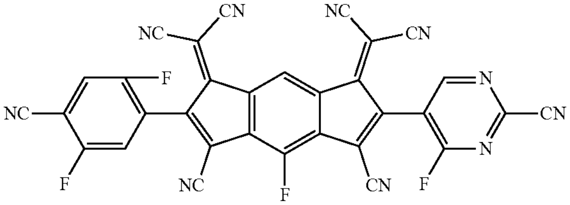
-continued
61
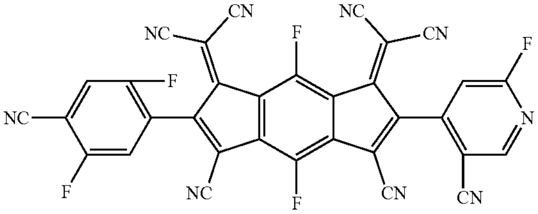
62
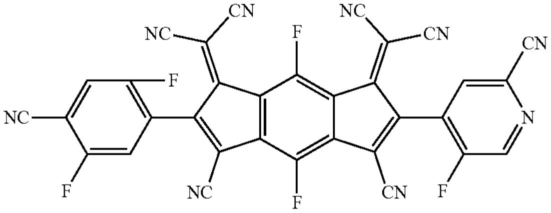
63
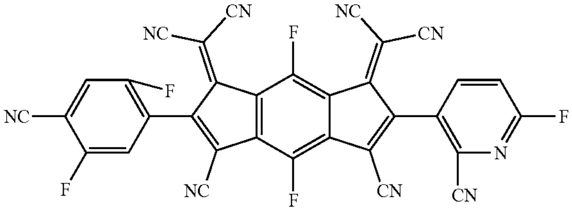
64
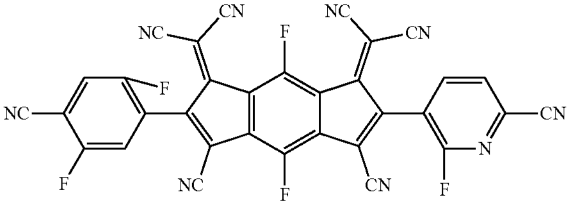
65
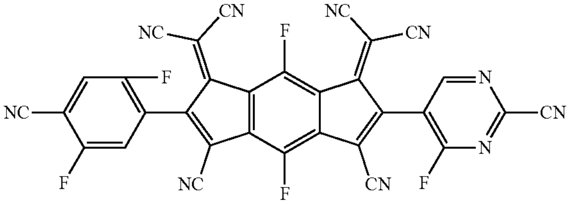
66
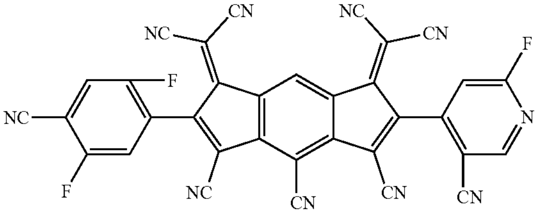

-continued
67
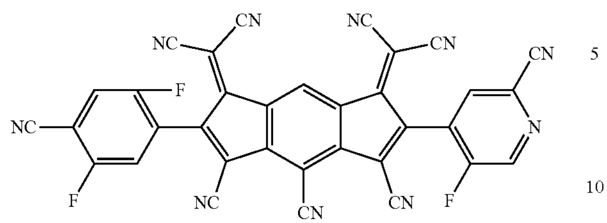
68
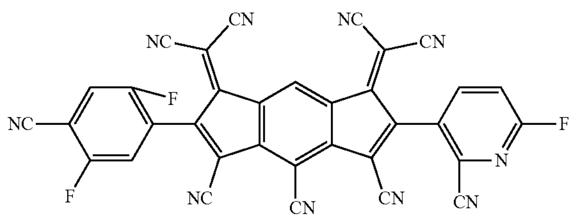
69
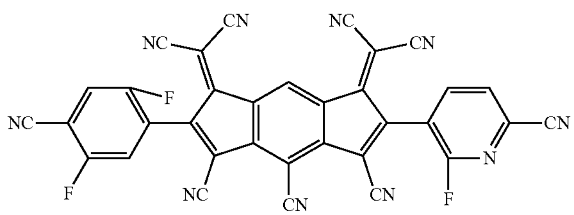
70
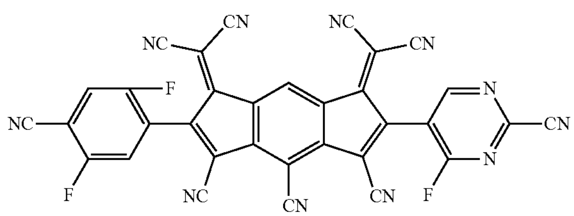
71
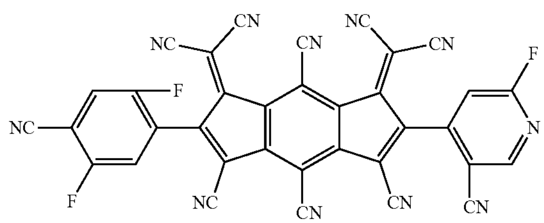
72
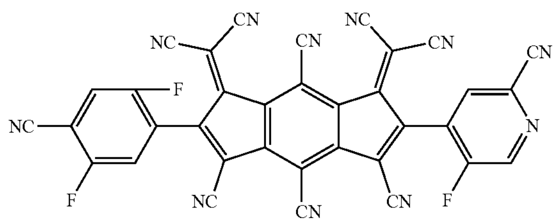
-continued
73
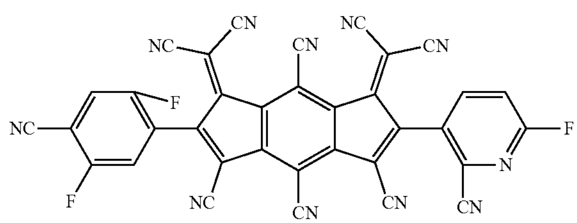
74
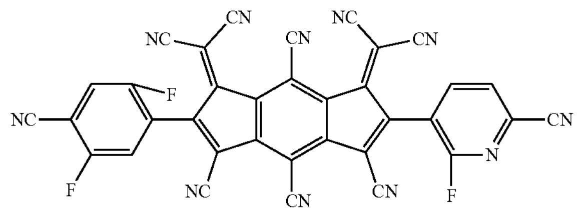
75
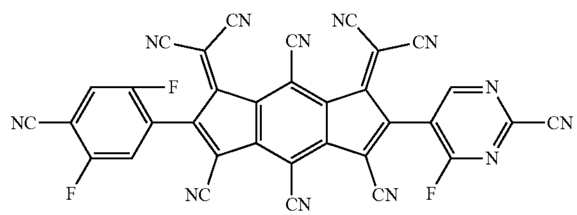
76
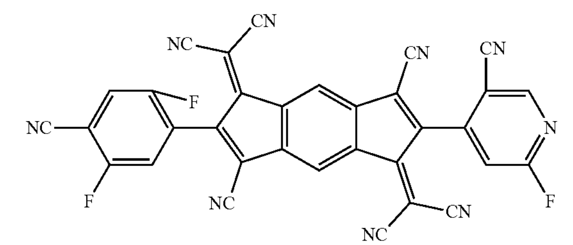
77
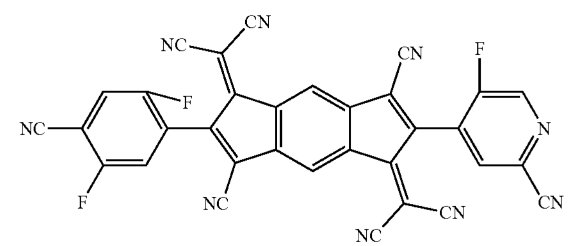
78
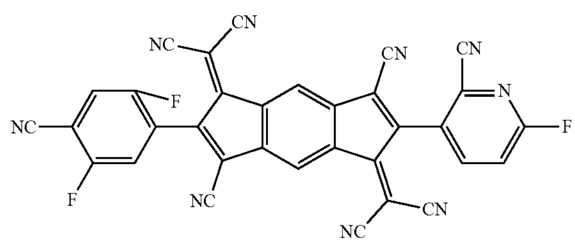

79
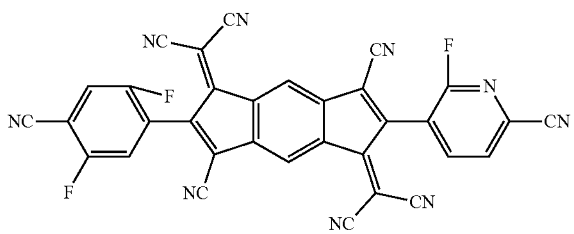
80
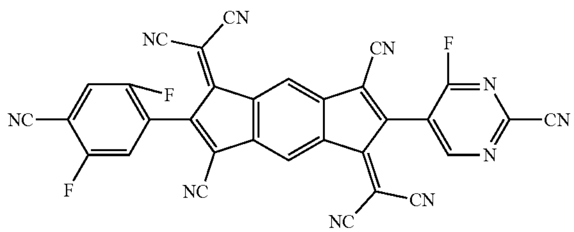
81
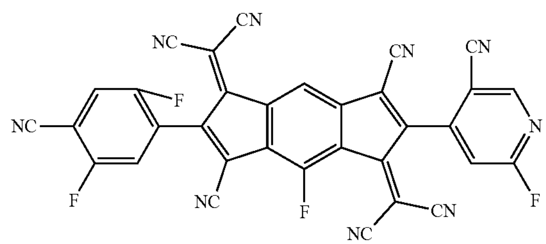
82
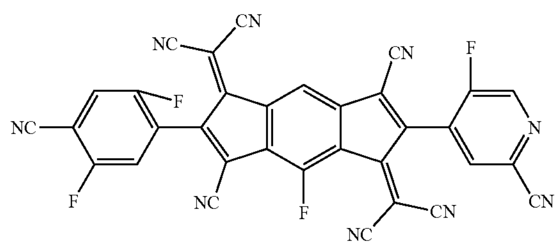
83
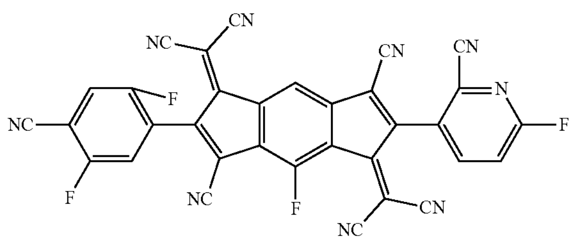
84
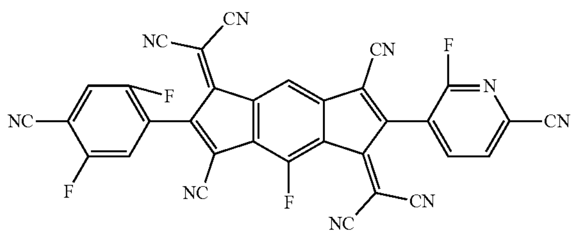
85
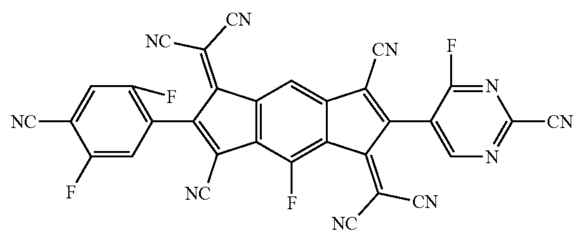
86
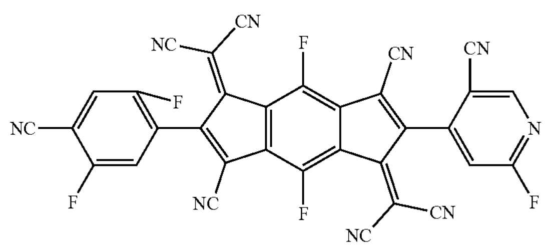
87
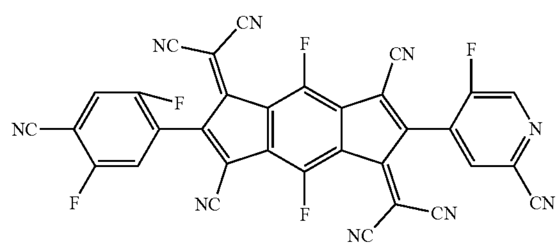
88
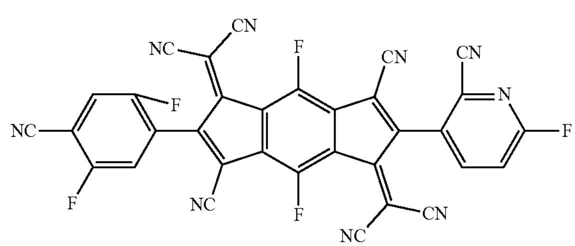
89
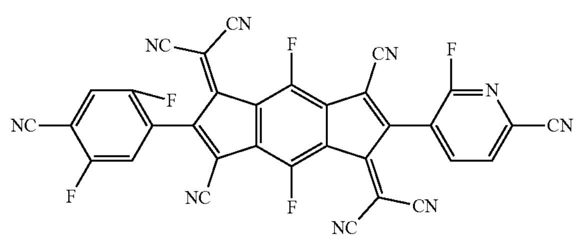
90
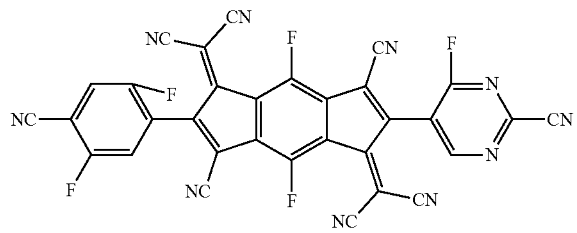

-continued
91
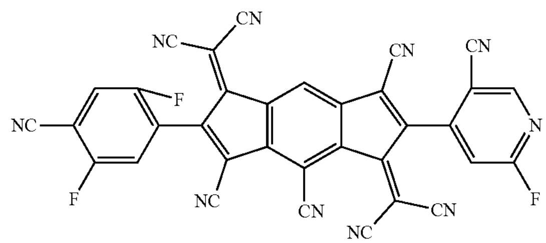
92
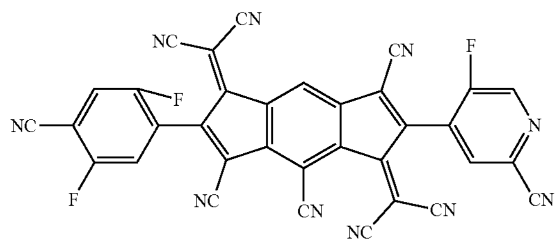
93
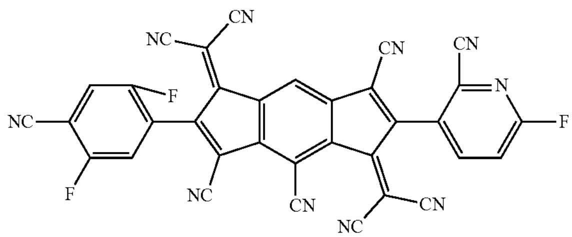
94
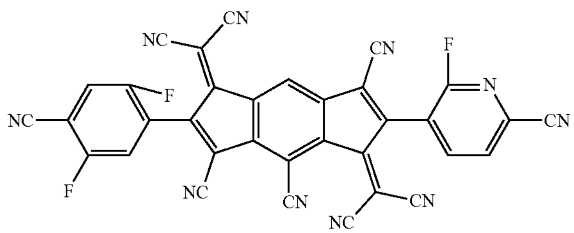
95
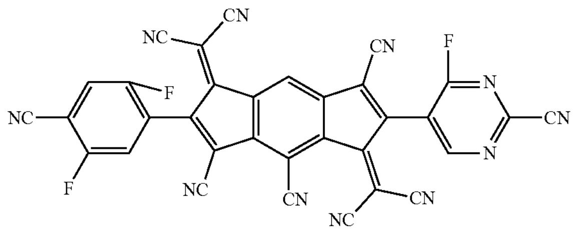
96
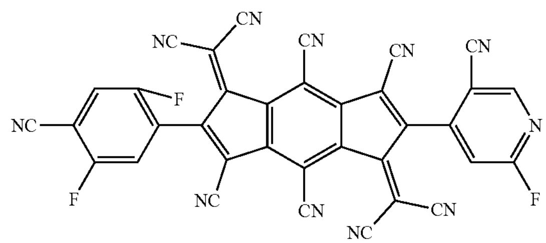
-continued
97
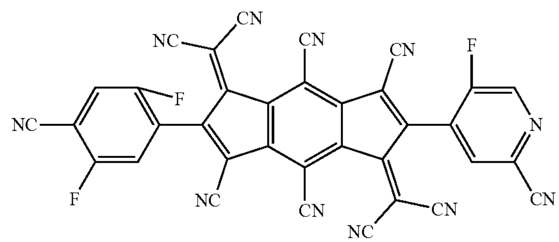
98
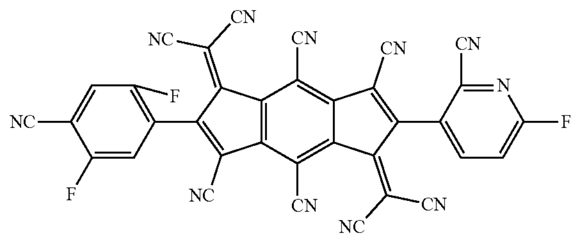
99
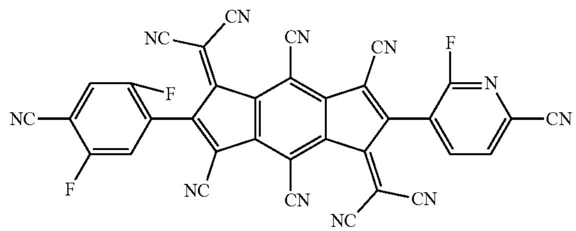
100
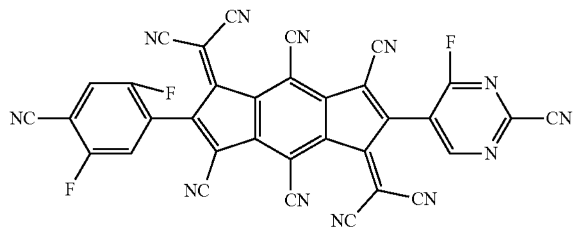
101
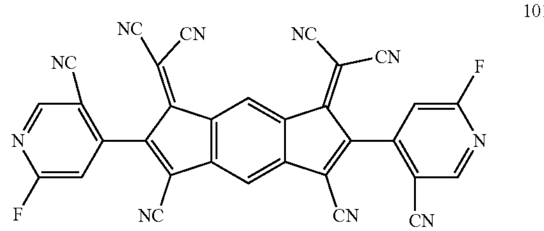
102
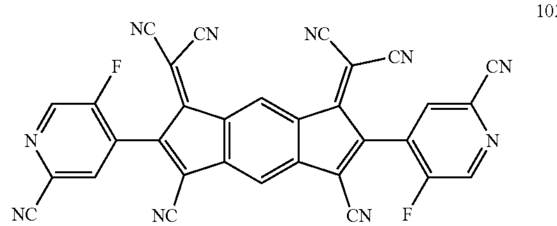

-continued
103
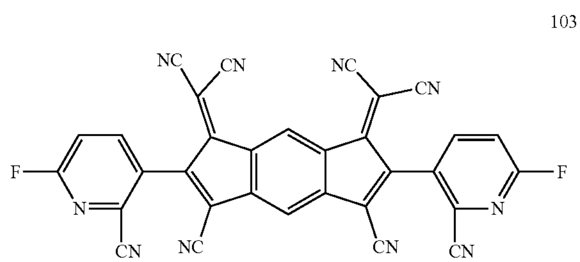
104
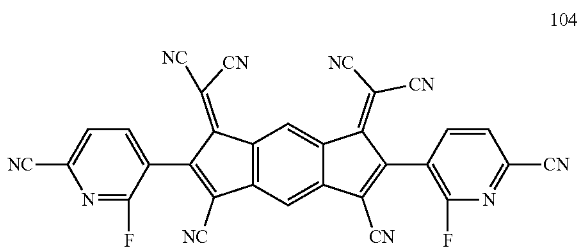
105
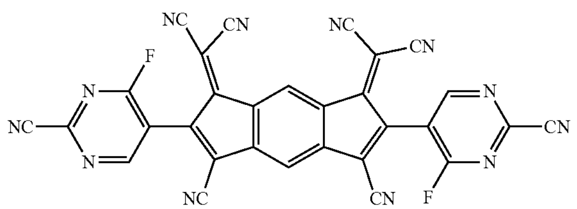
106
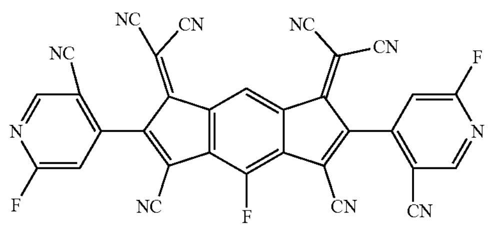
107
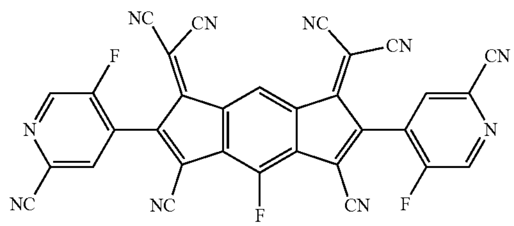
108
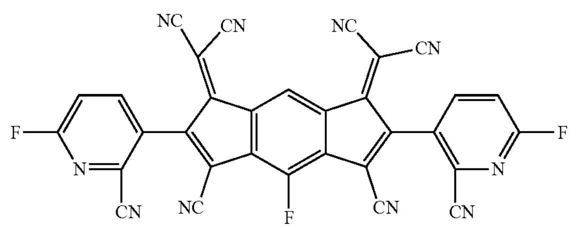
109
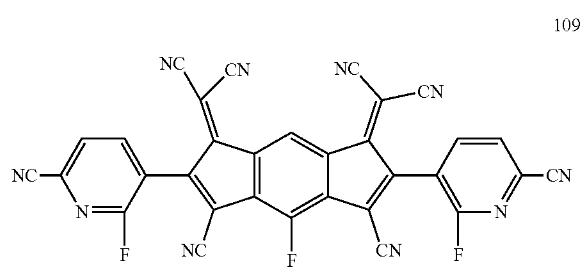
110
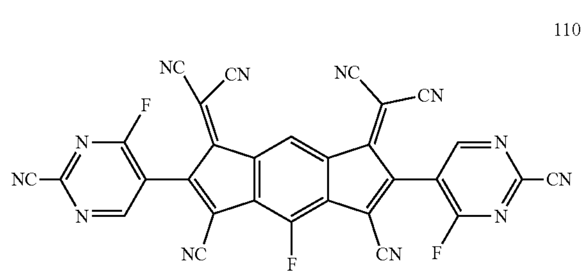
111
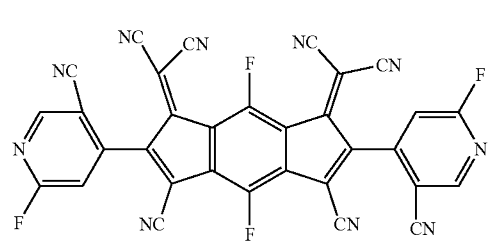
112
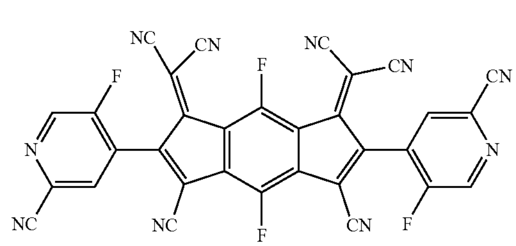
113
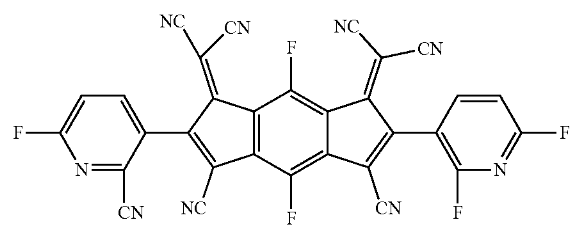
114
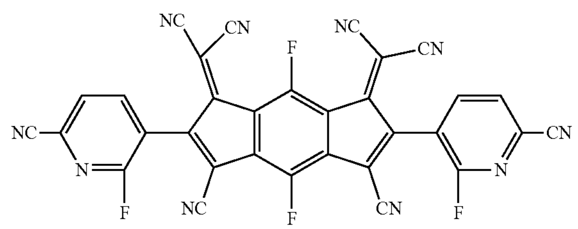

-continued
115
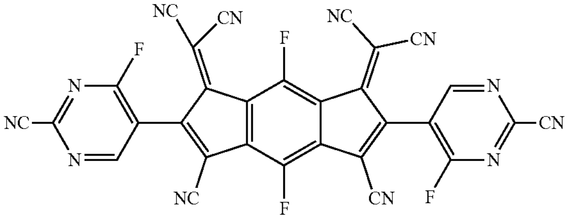
116
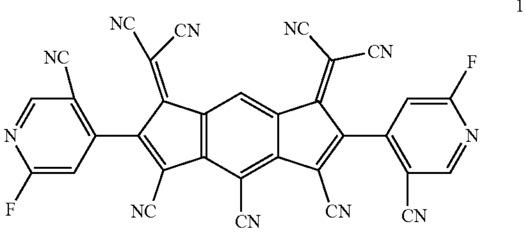
117
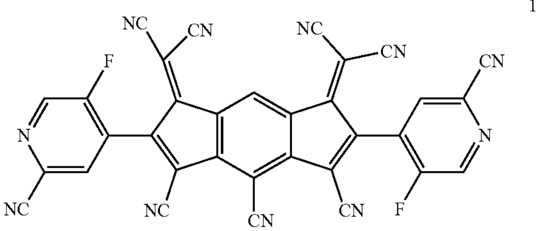
118
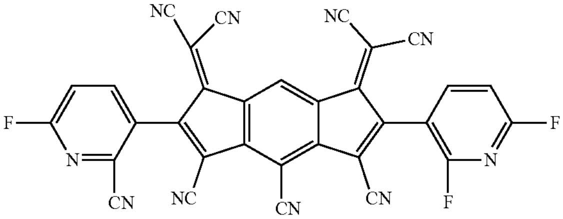
119
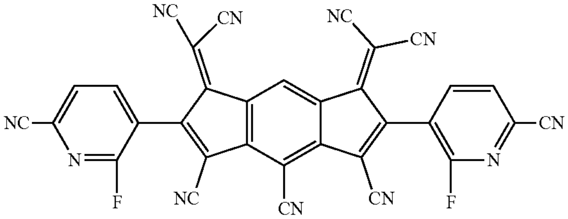
120
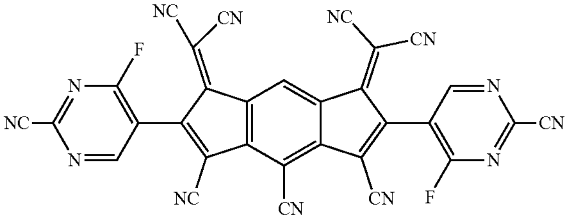
-continued
121
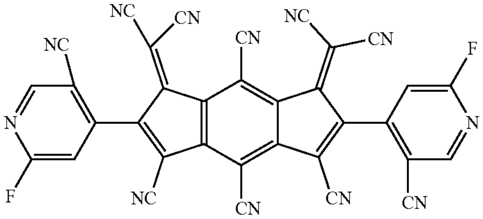
122
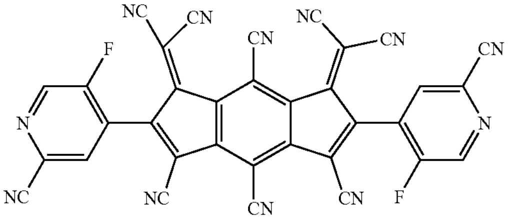
123
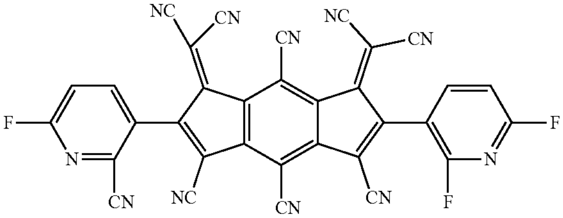
124
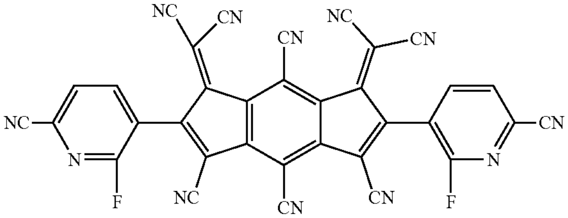
125
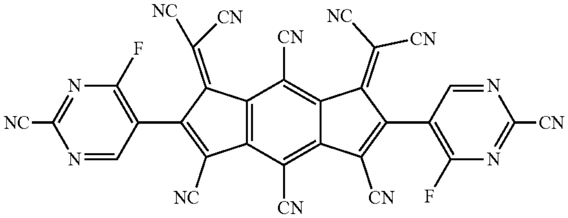
126
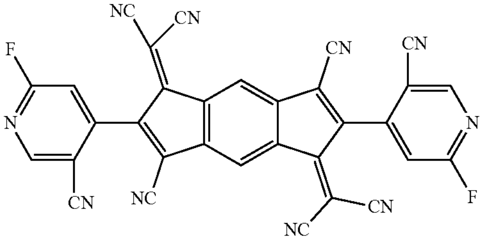

-continued
127
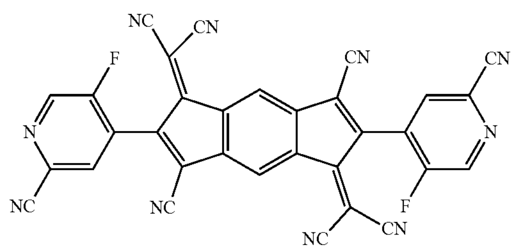
128
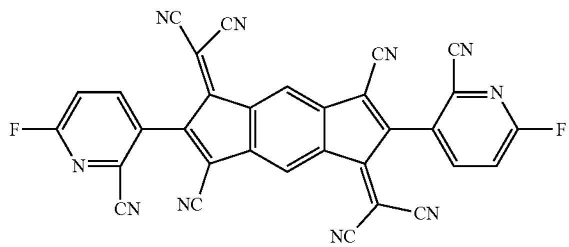
129
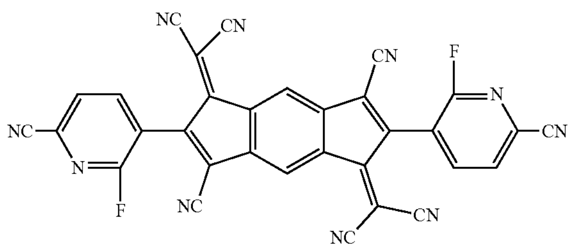
130
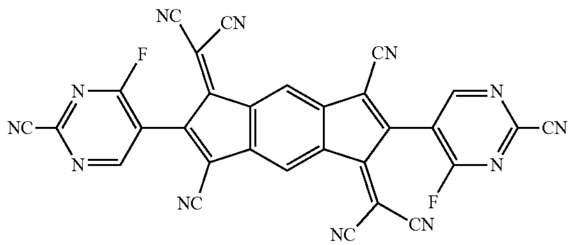
131
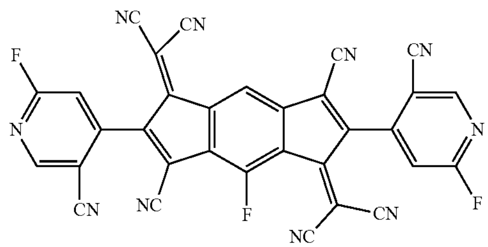
132
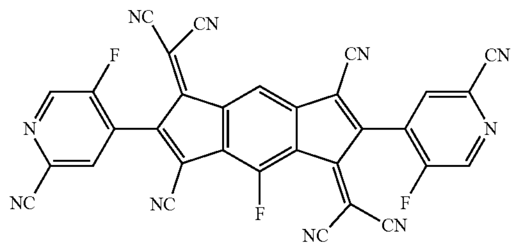
-continued
133
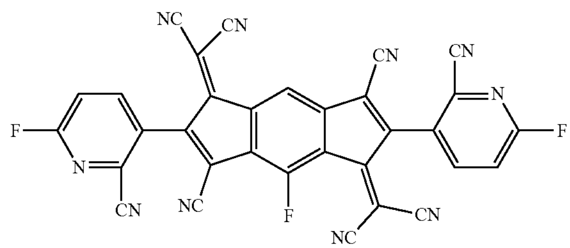
134
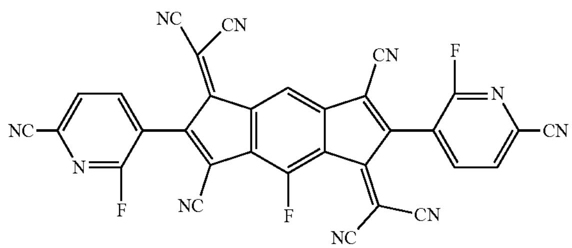
135
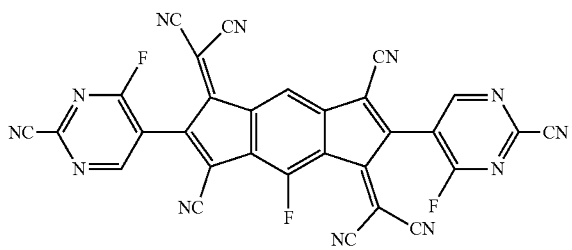
136
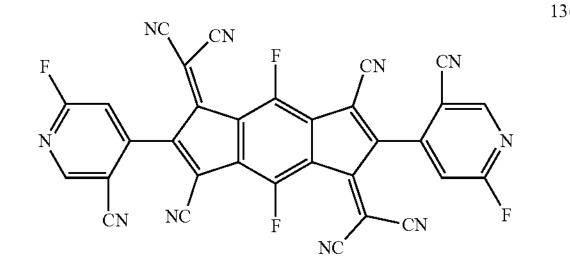
137
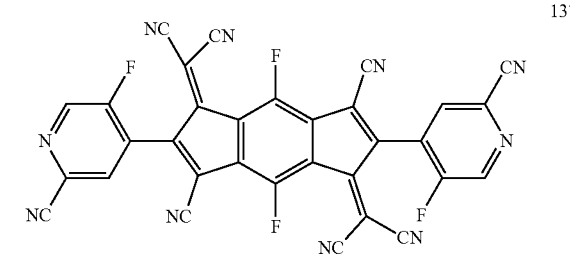
138
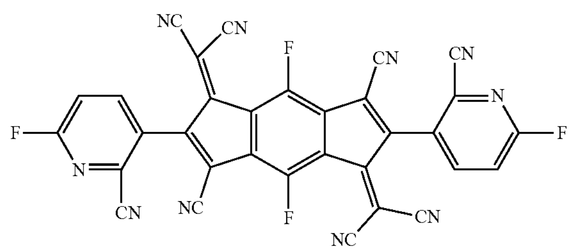

-continued
139
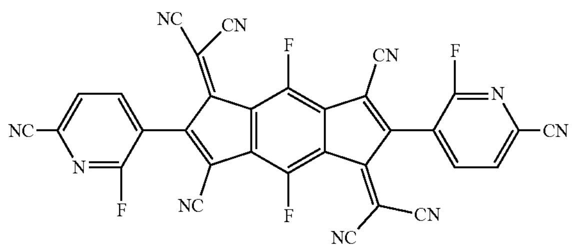
140
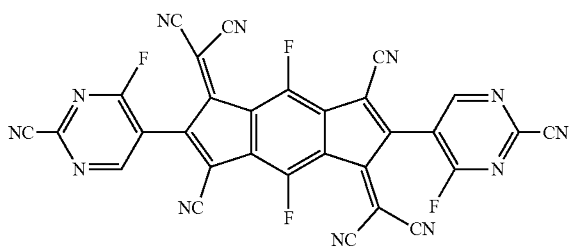
141
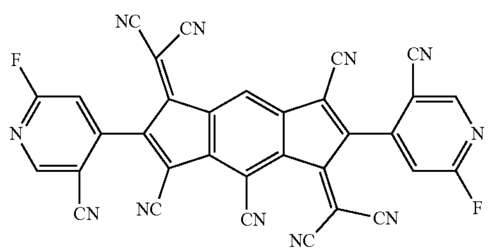
142
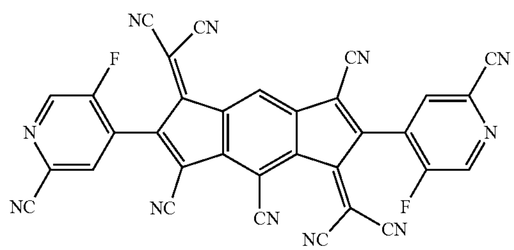
143
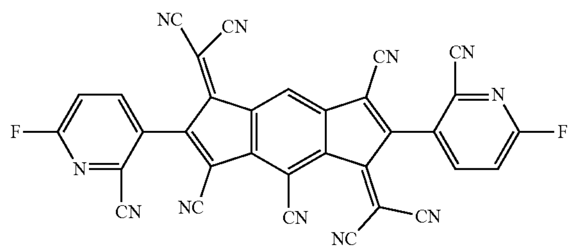
144
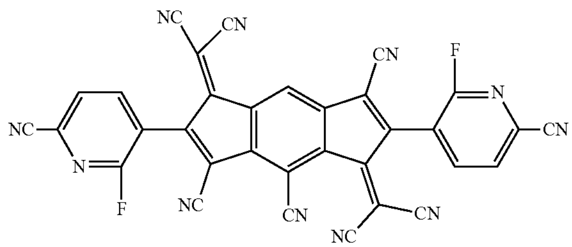
-continued
145
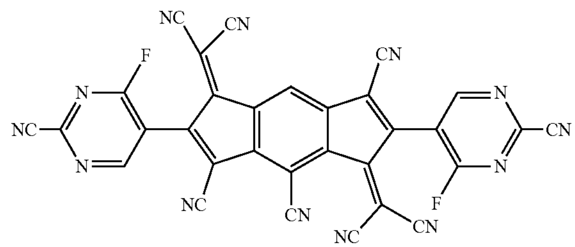
146
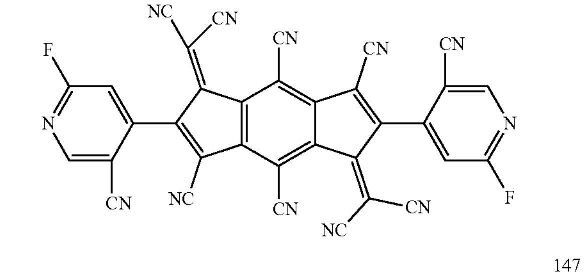
147
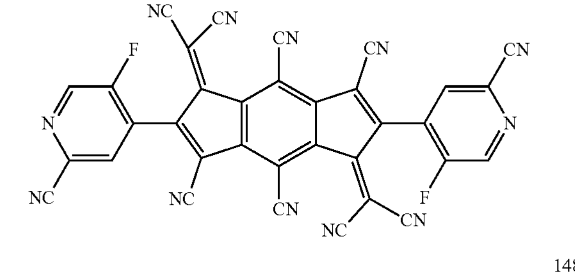
148
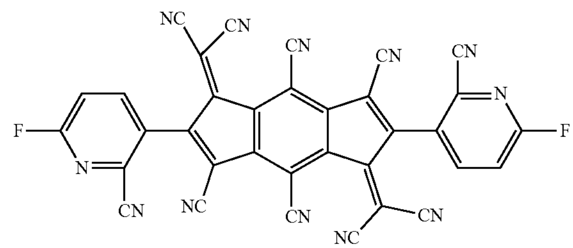
149
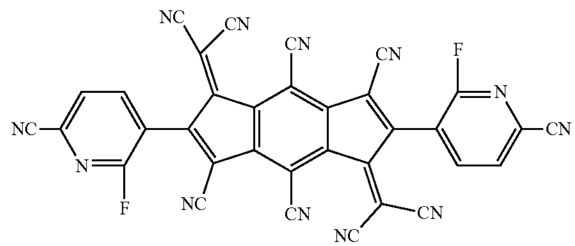
150
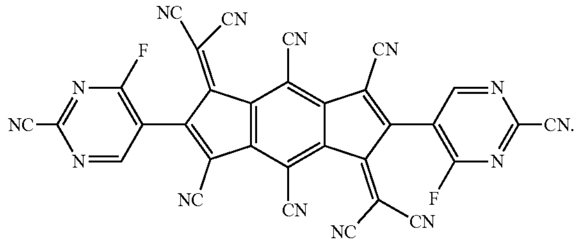

8. The organic light emitting element of claim 1, wherein the second compound represented by chemical formula 2 is one or more of the compounds:
H1
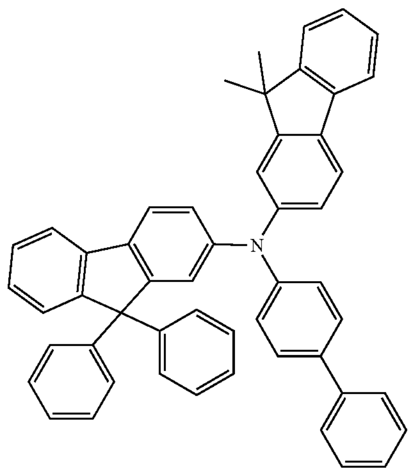
H2
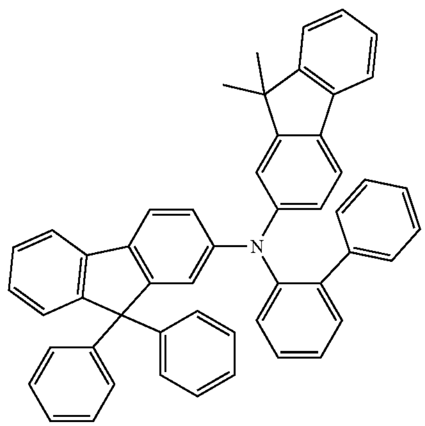
H3
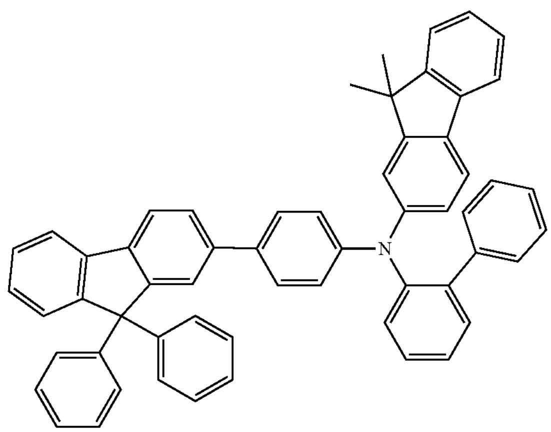
-continued
H4
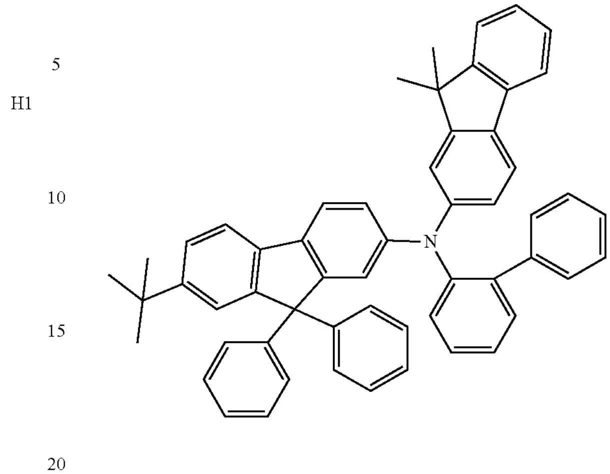
H5
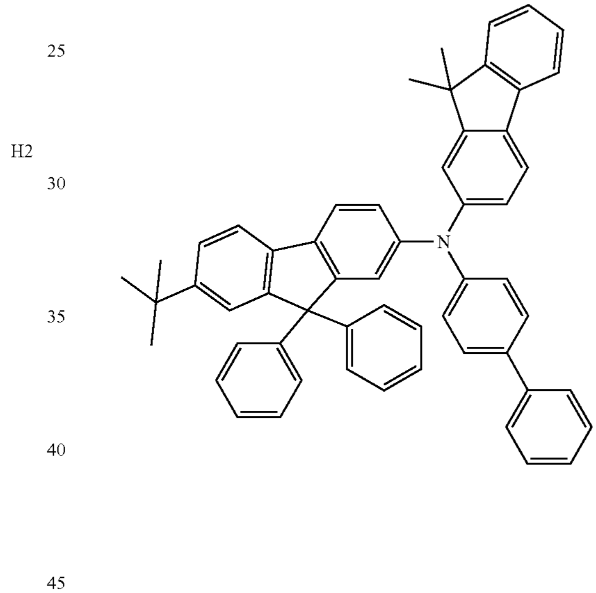
H6
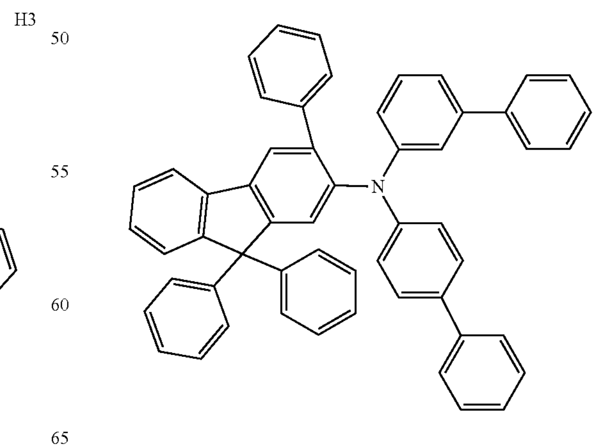

-continued
H7
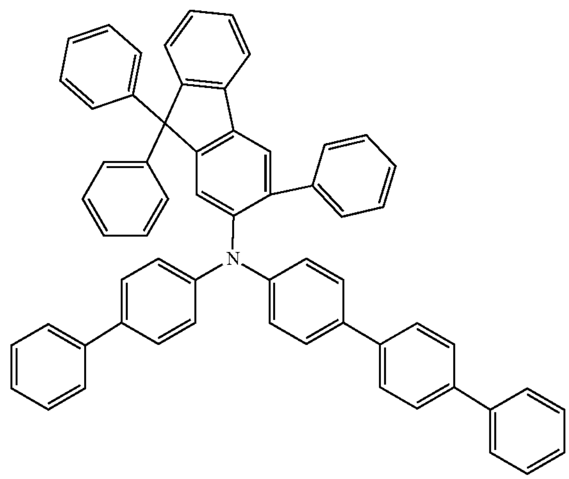
H8
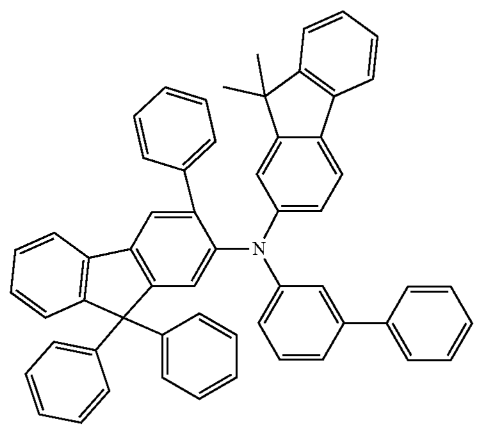
H9
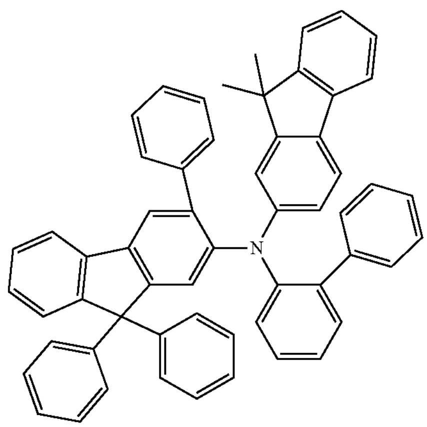
-continued
H10
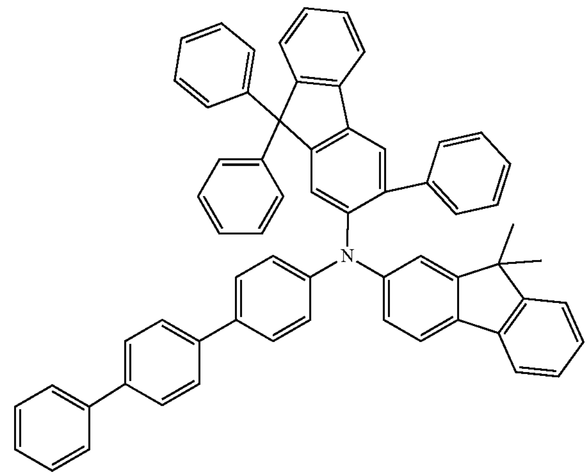
H11
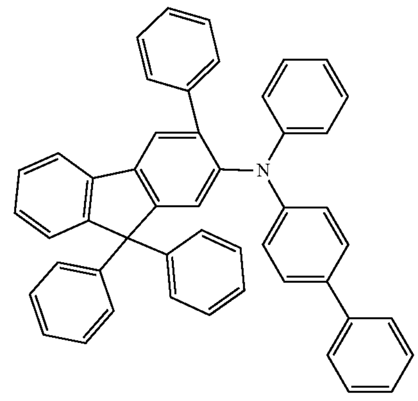
H12
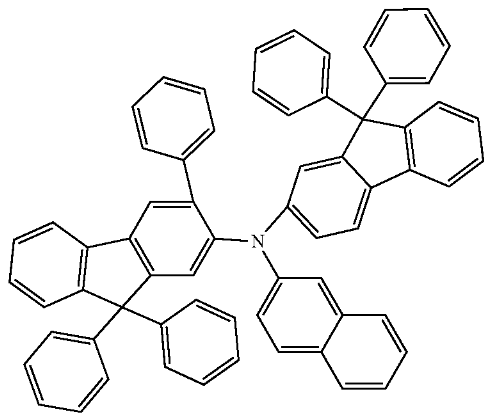

-continued
H13
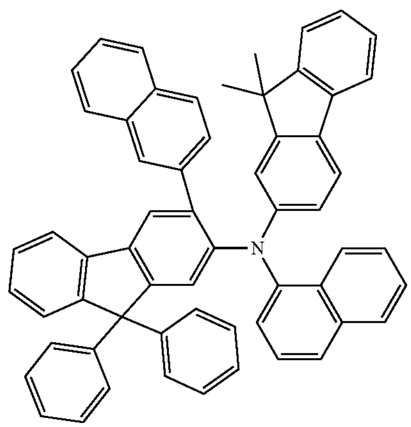
H14
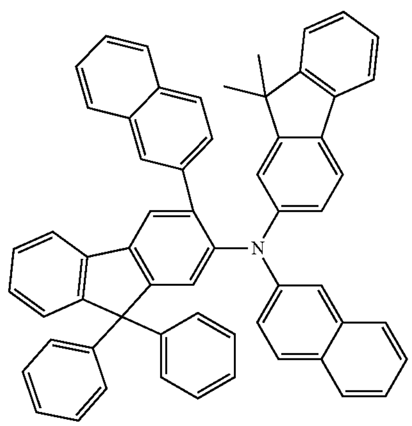
H15
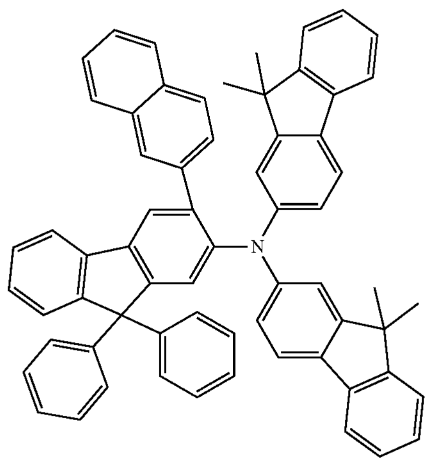
-continued
H16
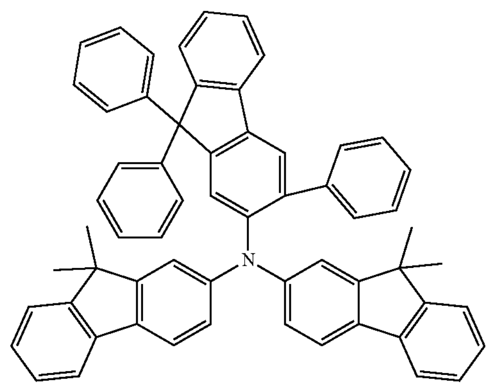
H17
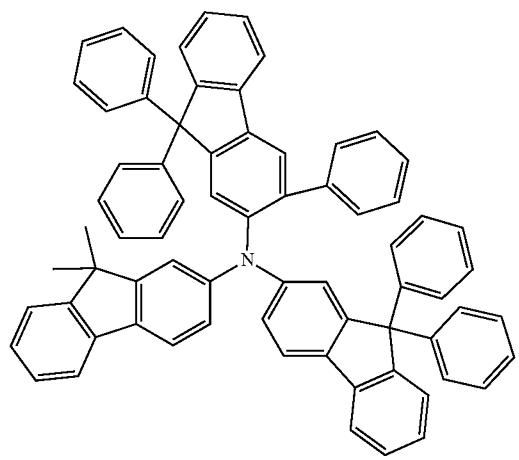
H18
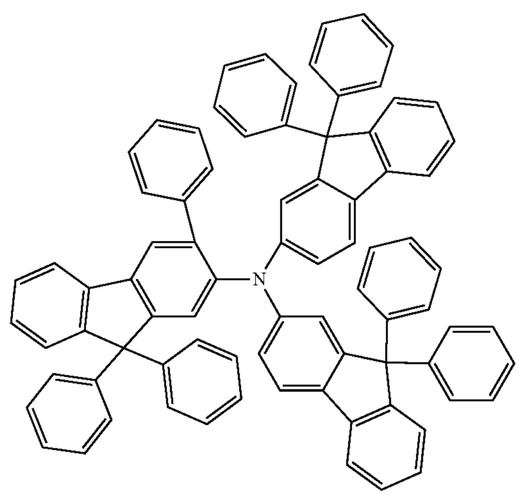

H19
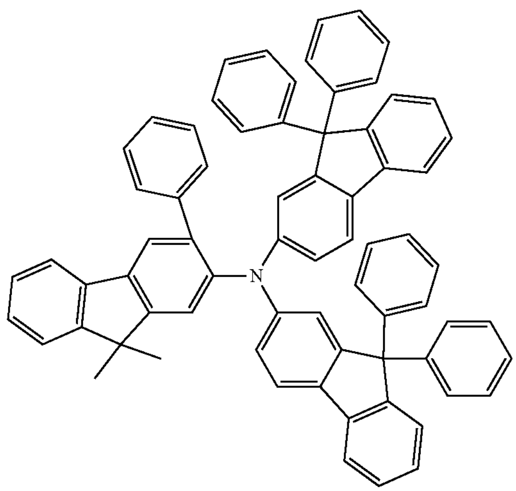
H20
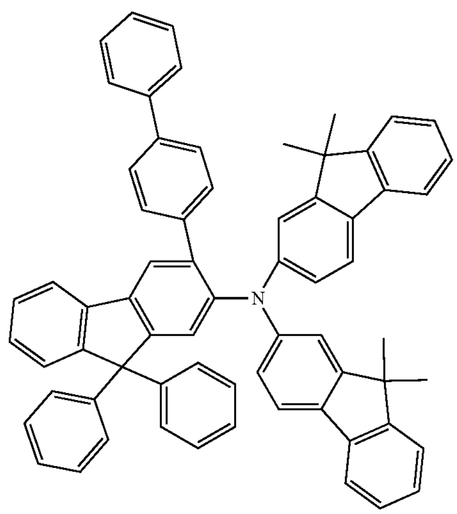
H21
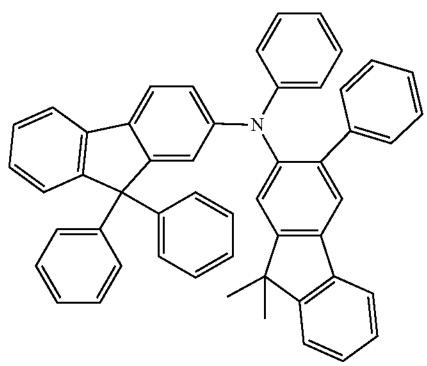
H22
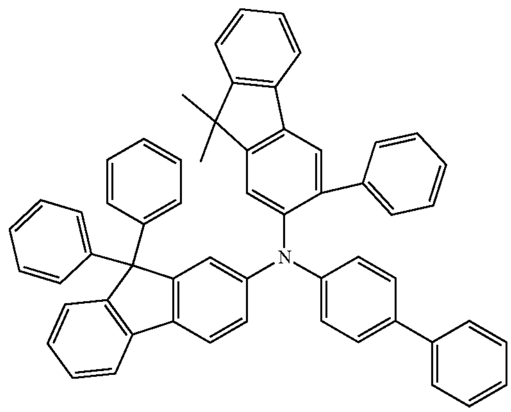
H23
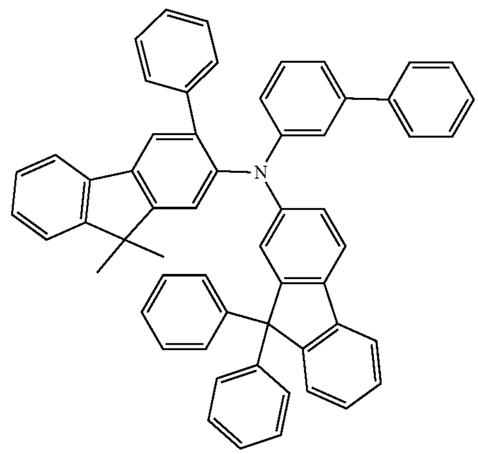
H24
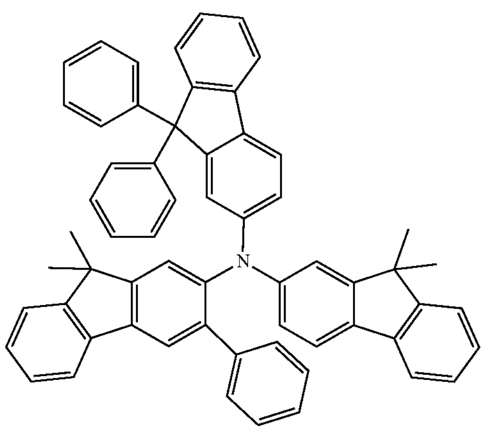

-continued
H25
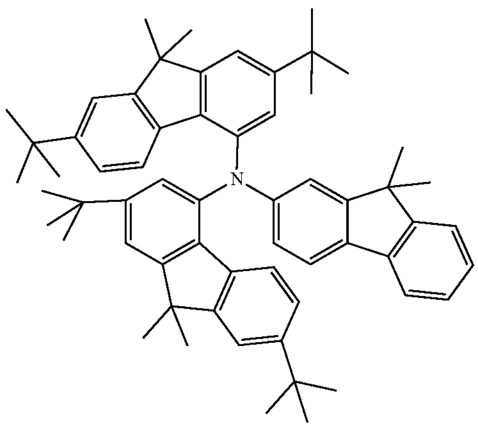
H26
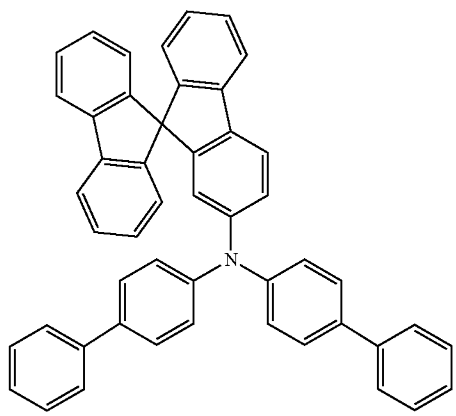
H27
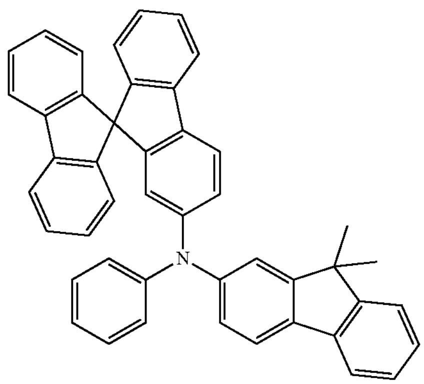
-continued
H28
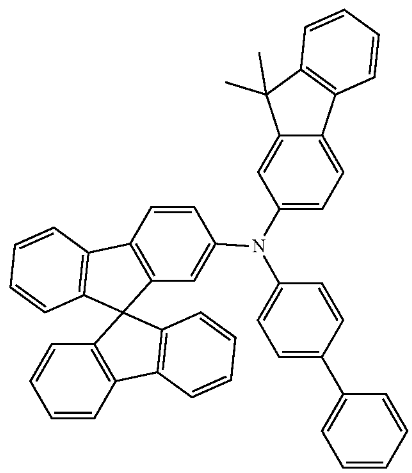
H29
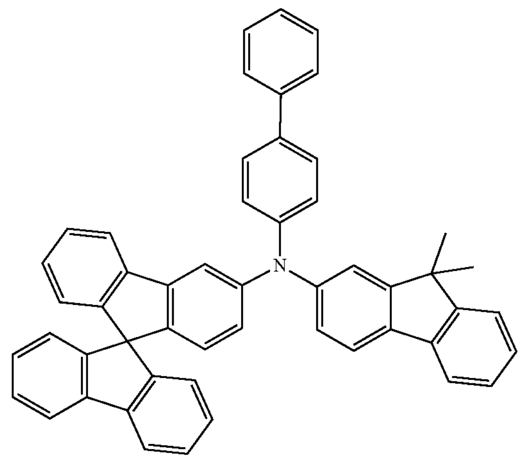
H30
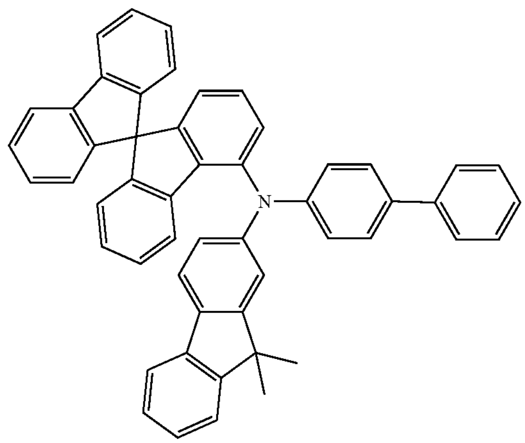

-continued
H31
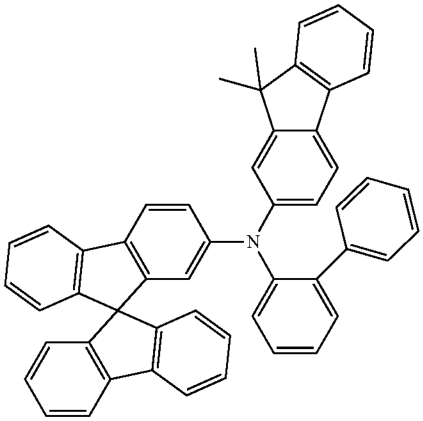
H32
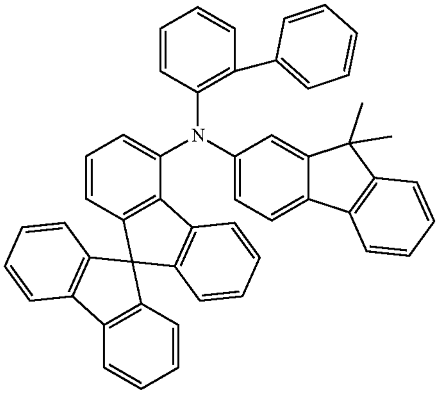
H33
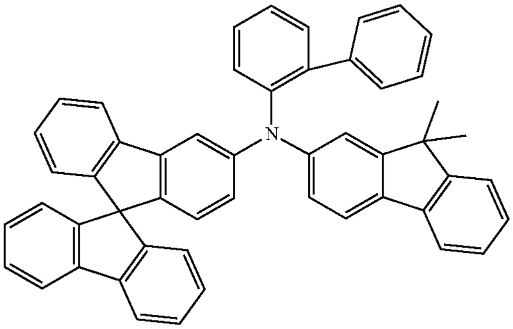
H34
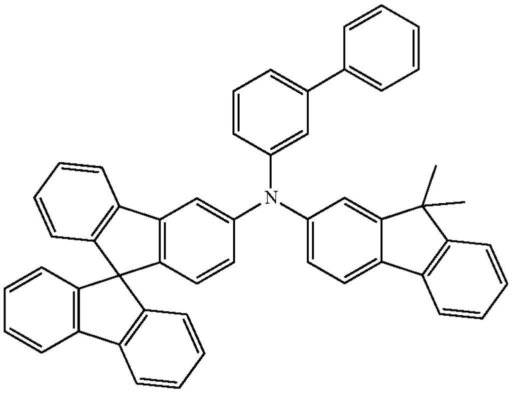
-continued
H35
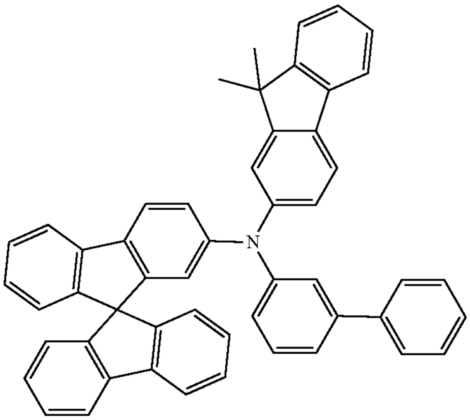
H36
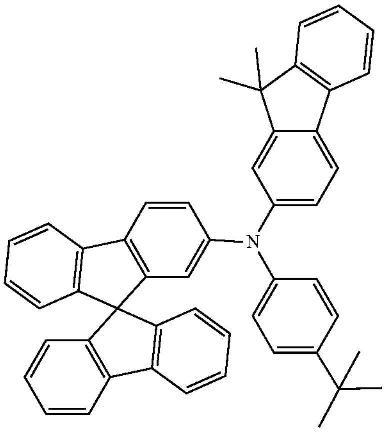
H37
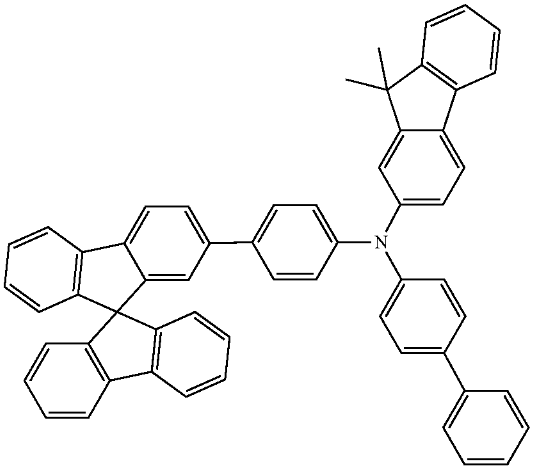

-continued
H38
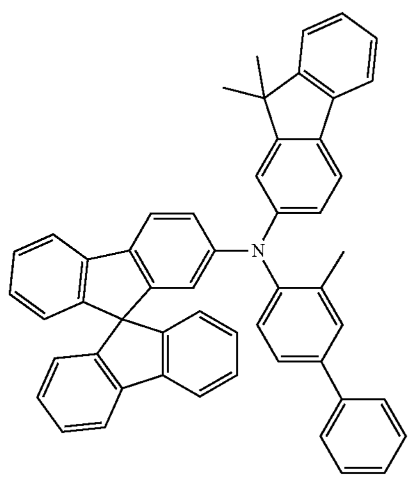
H39
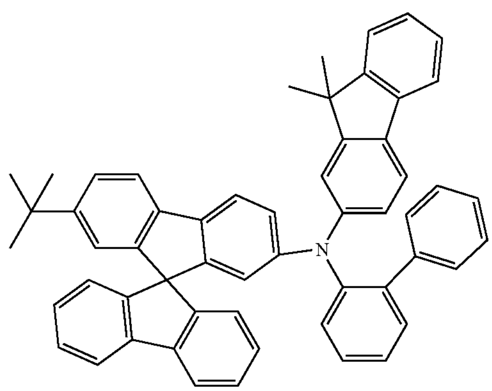
H40
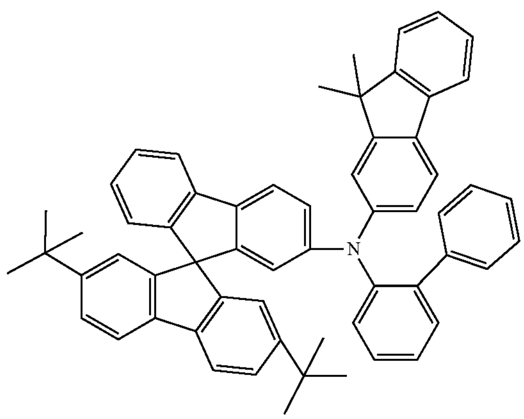
-continued
H41
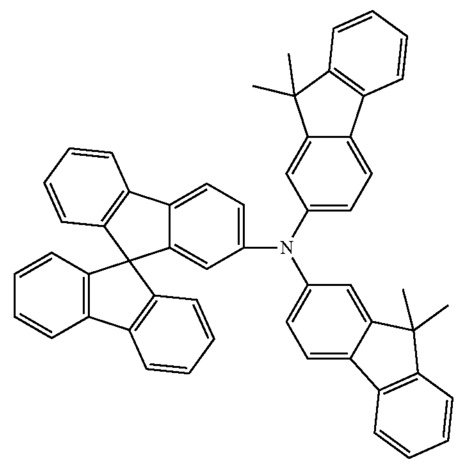
H42
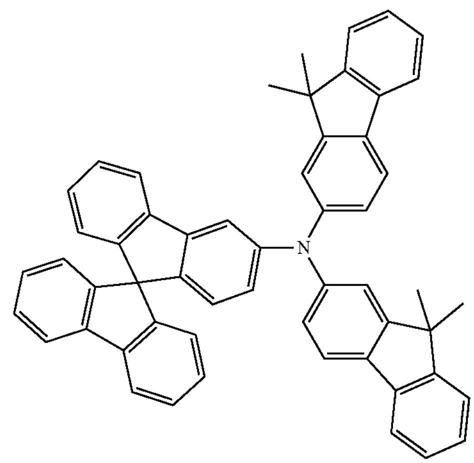
H43
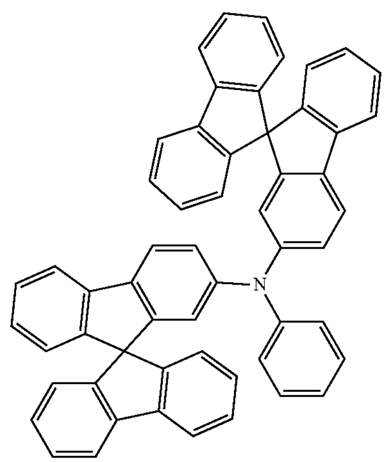

-continued
H44
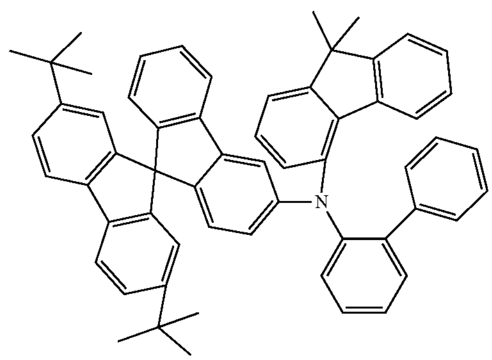
H45
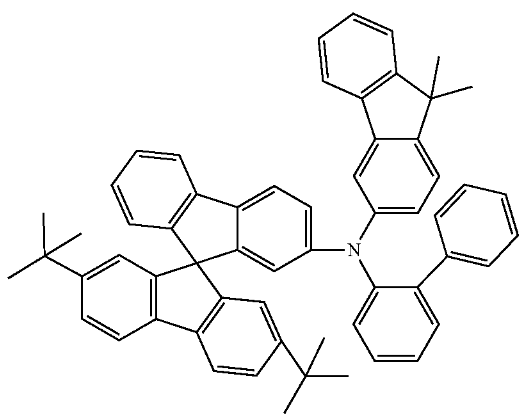
H46
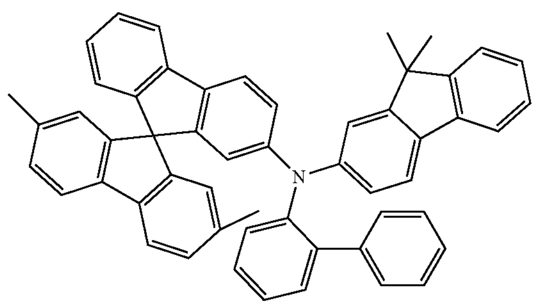
H47
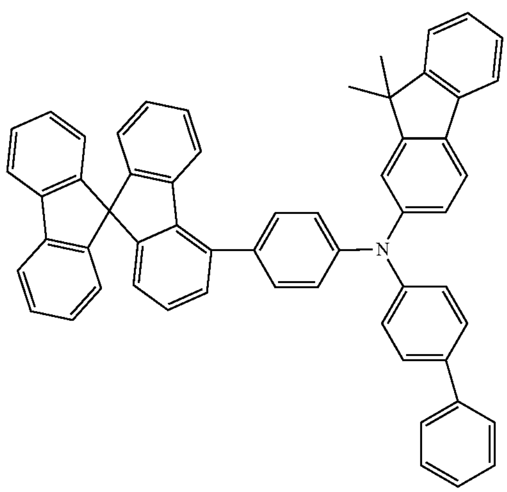
-continued
H48
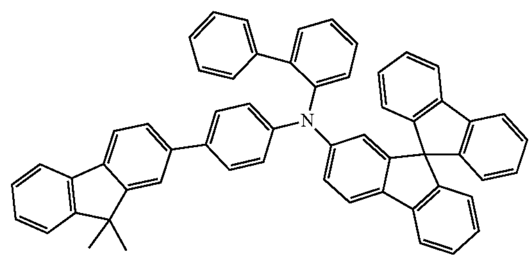
H49
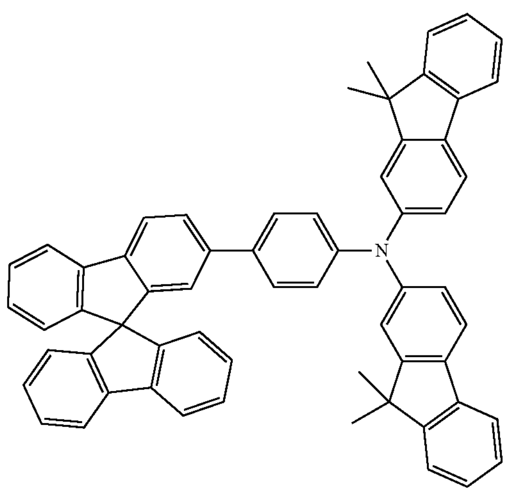
H50
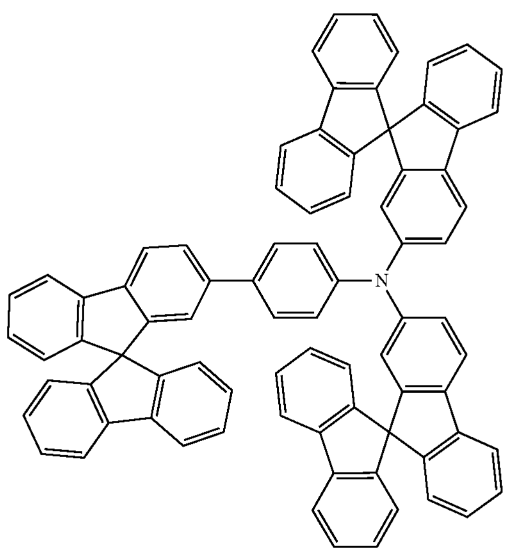

-continued

H51

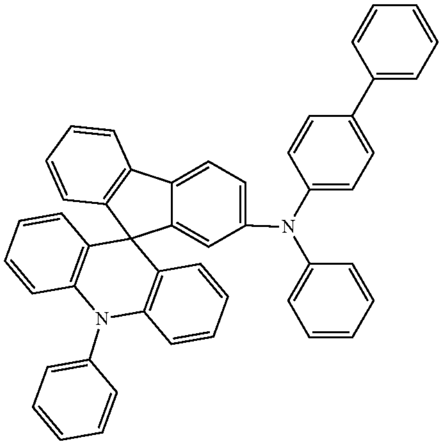

H52

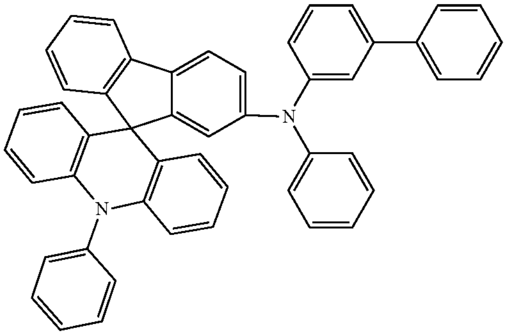

H53

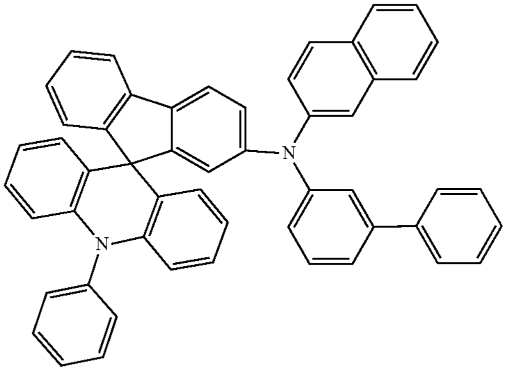

H54

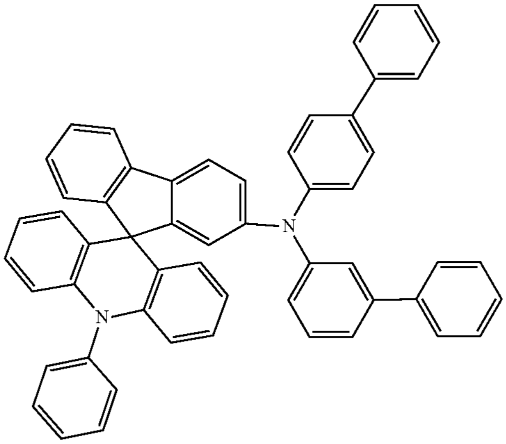

-continued

H55

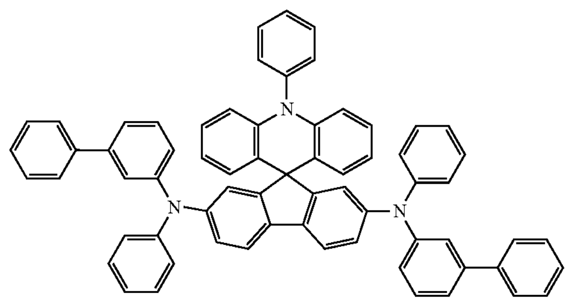

9. The organic light emitting element of claim 1, wherein the organic material layer includes a first light emitting layer and a first layer, and wherein the first layer includes the first compound and the second compound.

10. The organic light emitting element of claim 9, wherein the first electrode is an anode electrode, and the second electrode is a cathode electrode, and wherein the first layer is positioned between the first electrode and the first light emitting layer.

11. The organic light emitting element of claim 9, wherein the first layer includes a hole injection layer and a first hole transport layer, and wherein the hole injection layer includes the first compound and the first hole transport layer includes the second compound.

12. The organic light emitting element of claim 11, wherein the first compound is a p-type dopant of the hole injection layer.

13. The organic light emitting element of claim 1, wherein the organic material layer includes a first light emitting layer, a second light emitting layer and a first layer, and wherein the first layer is positioned between the first light emitting layer and the second light emitting layer, and the first layer includes the first compound and the second compound.

14. The organic light emitting element of claim 13, wherein the first layer includes a charge generation layer and a second hole transport layer, and wherein the charge generation layer includes the first compound and the second hole transport layer includes the second compound.

15. The organic light emitting element of claim 14, wherein the charge generation layer includes a p-type charge generation layer, and Wherein the first compound is a p-type dopant of the p-type charge generation layer.

16. The organic light emitting element of claim 13, wherein the organic material layer further includes a second layer, and wherein the second layer is positioned between the first electrode and the first light emitting layer, and the second layer includes the first compound.

17. The organic light emitting element of claim 16, wherein the second layer includes a hole injection layer, and wherein the first compound is a p-type dopant of the hole injection layer.

18. The organic light emitting element of claim 17, wherein the second layer further includes a first hole transport layer, and wherein the first hole transport layer includes the second compound.

19. The organic light emitting element of claim 13, wherein the organic material layer includes a third light emitting layer and a third layer, and wherein the third layer is positioned between the second light emitting layer and the third light emitting layer, and the third layer includes the first compound and the second compound.

20. The organic light emitting element of claim 19, wherein the third layer includes a p-type charge generation layer and a third hole transport layer, and wherein the p-type charge generation layer includes the first compound which is a p-type dopant of the p-type charge generation layer, and the third hole transport layer includes the second compound.

21. The organic light emitting element of claim 19, wherein the organic material layer further includes a second layer, and wherein the second layer is positioned between the first electrode and the first light emitting layer, and the second layer includes the first compound.

22. The organic light emitting element of claim 21, wherein the second layer includes a hole injection layer and a first hole transport layer, and wherein the first compound is a p-type dopant of the hole injection layer, and the first hole transport layer includes the second compound.

23. A display device comprising the organic light emitting element of claim 1.

* * * * *